US009831266B2

(12) United States Patent
Kai et al.

(10) Patent No.: US 9,831,266 B2
(45) Date of Patent: Nov. 28, 2017

(54) THREE-DIMENSIONAL NAND DEVICE CONTAINING SUPPORT PEDESTAL STRUCTURES FOR A BURIED SOURCE LINE AND METHOD OF MAKING THE SAME

(71) Applicant: SANDISK TECHNOLOGIES LLC, Plano, TX (US)

(72) Inventors: James Kai, Santa Clara, CA (US); Johann Alsmeier, San Jose, CA (US); Jin Liu, Milpitas, CA (US); Yanli Zhang, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/225,492

(22) Filed: Aug. 1, 2016

(65) Prior Publication Data

US 2017/0148810 A1 May 25, 2017

Related U.S. Application Data

(63) Continuation-in-part of application No. 15/017,961, filed on Feb. 8, 2016.
(Continued)

(51) Int. Cl.
*H01L 27/115* (2017.01)
*H01L 23/535* (2006.01)
(Continued)

(52) U.S. Cl.
CPC .. *H01L 27/11582* (2013.01); *H01L 21/28282* (2013.01); *H01L 21/30604* (2013.01);
(Continued)

(58) Field of Classification Search
CPC ......... H01L 27/11582; H01L 21/28282; H01L 21/30604; H01L 21/76895; H01L 23/535; H01L 29/42344
See application file for complete search history.

(56) References Cited

U.S. PATENT DOCUMENTS

| 5,915,167 A | 6/1999 | Leedy |
| 7,005,350 B2 | 2/2006 | Walker et al. |

(Continued)

FOREIGN PATENT DOCUMENTS

| JP | 2015149413 A | 8/2015 |
| WO | WO02/15277 A2 | 2/2002 |

OTHER PUBLICATIONS

International Search Report and Written Opinion of the International Searching Authority for International Patent application No. PCT/US2016/062528, dated Mar. 28, 2017, 18 pages.
(Continued)

*Primary Examiner* — Benjamin Sandvik
*Assistant Examiner* — Gustavo Ramallo
(74) *Attorney, Agent, or Firm* — The Marbury Law Group PLLC

(57) ABSTRACT

A three-dimensional memory device includes an alternating stack of electrically conductive layers and insulating layers located over a substrate, an array of memory stack structures. An alternating sequence of support pedestal structures and conductive rail structures extending along a same horizontal direction are provided between the substrate and the alternating stack. Each memory stack structure straddles a vertical interface between a conductive rail structure and a support pedestal structure. A semiconductor channel in each memory stack structure contacts a respective conductive rail structure, and is electrically isolated from an adjacent support pedestal structure by a portion of a memory film. The
(Continued)

conductive rail structures can function as source regions of memory device.

24 Claims, 43 Drawing Sheets

Related U.S. Application Data

(60) Provisional application No. 62/258,250, filed on Nov. 20, 2015.

(51) Int. Cl.
*H01L 27/11582* (2017.01)
*H01L 27/1157* (2017.01)
*H01L 21/306* (2006.01)
*H01L 21/768* (2006.01)
*H01L 29/423* (2006.01)
*H01L 21/28* (2006.01)
*H01L 27/11565* (2017.01)

(52) U.S. Cl.
CPC ...... *H01L 21/76895* (2013.01); *H01L 23/535* (2013.01); *H01L 27/1157* (2013.01); *H01L 27/11565* (2013.01); *H01L 29/42344* (2013.01)

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi et al. | |
| 8,053,829 B2 | 11/2011 | Kang et al. | |
| 8,187,936 B2 | 5/2012 | Alsmeier et al. | |
| 8,394,716 B2 | 3/2013 | Hwang et al. | |
| 2007/0210338 A1 | 9/2007 | Orlowski | |
| 2007/0252201 A1 | 11/2007 | Kito et al. | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0098049 A1* | 4/2012 | Moon | H01L 27/11556 257/324 |
| 2012/0119287 A1 | 5/2012 | Park et al. | |
| 2012/0199897 A1 | 8/2012 | Chang et al. | |
| 2013/0168757 A1* | 7/2013 | Hong | H01L 27/11582 257/324 |
| 2013/0248974 A1 | 9/2013 | Alsmeier et al. | |
| 2013/0264631 A1 | 10/2013 | Alsmeier et al. | |
| 2015/0149413 A1 | 5/2015 | Lee et al. | |
| 2015/0162342 A1* | 6/2015 | Lee | H01L 27/11582 257/324 |
| 2015/0179660 A1 | 6/2015 | Yada et al. | |
| 2015/0348984 A1 | 12/2015 | Yada et al. | |
| 2015/0380418 A1 | 12/2015 | Zhang et al. | |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

Invitation to Pay Additional Fees (PCT Article 17(3)(a) and Rule 40.1 and 40.2(e)) and Communication Relating to the Results of the Partial International Search from the International Searching Authority for International Patent Application No. PCT/US2016/062528, dated Feb. 3, 2017, 8 pages.

International Search Report and Written Opinion of the International Searching Authority for International Patent Application No. PCT/US2016/049986, dated Feb. 17, 2017, 16 pages.

Invitation to Pay Additional Fees (PCT Article 17(3)(a) and Rule 40.1 and 40.2(e)) and Communication Relating to the Results of the Partial International Search from the International Searching Authority for International Patent Application No. PCT/US2016/049986, dated Dec. 22, 2016, 8 pages.

USPTO Office Action for U.S. Appl. No. 15/017,961, dated May 8, 2017, 28 pages.

\* cited by examiner

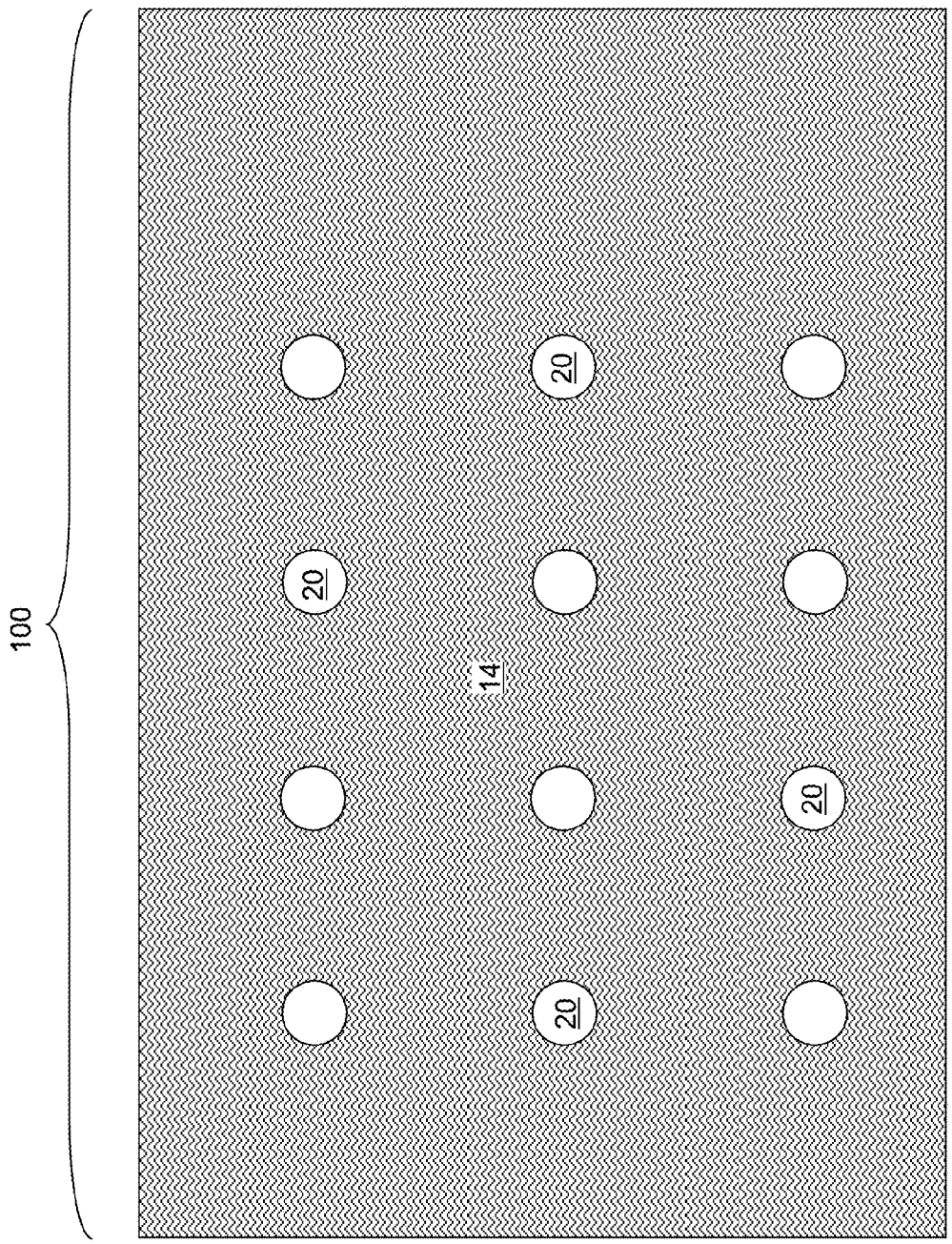

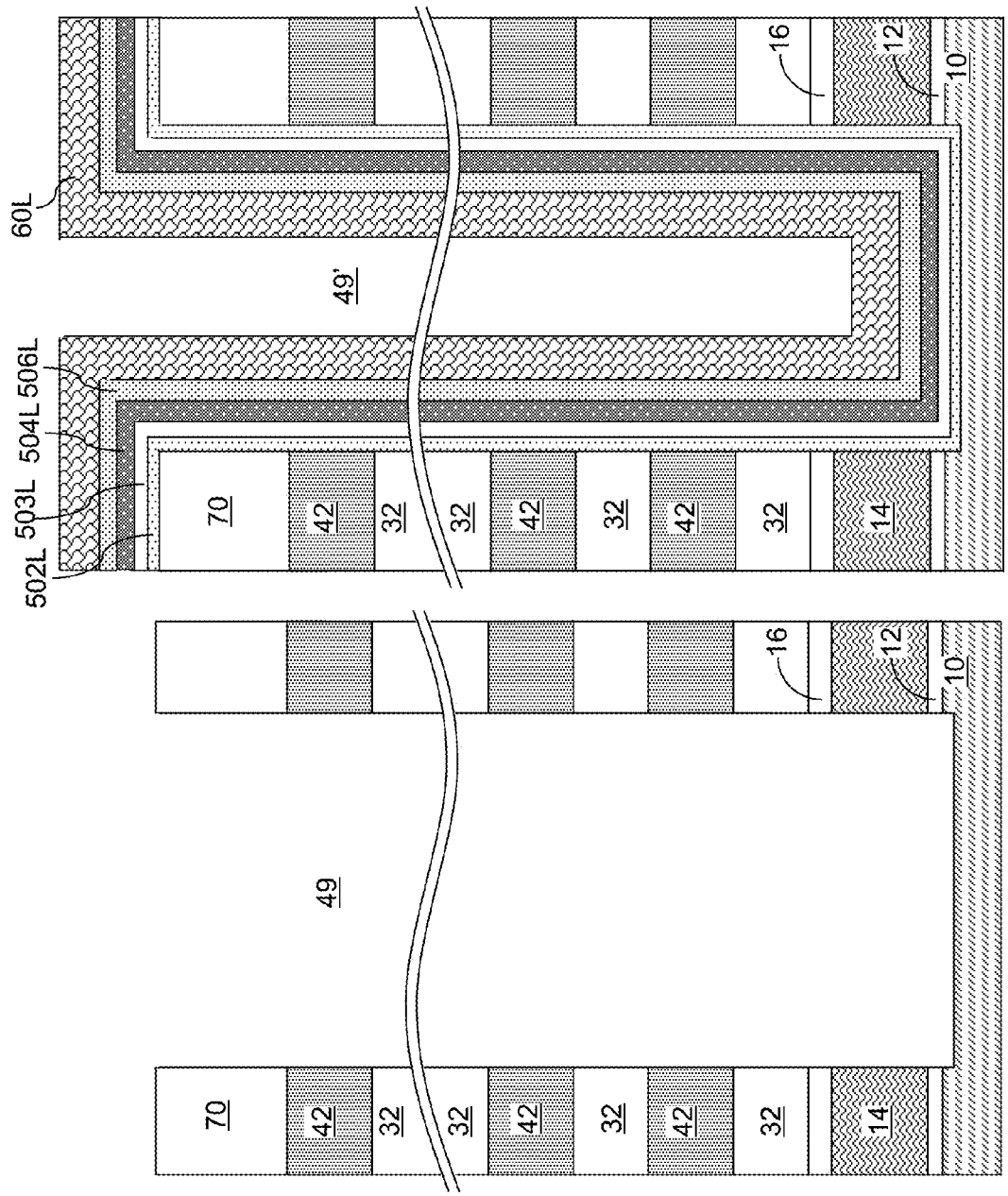

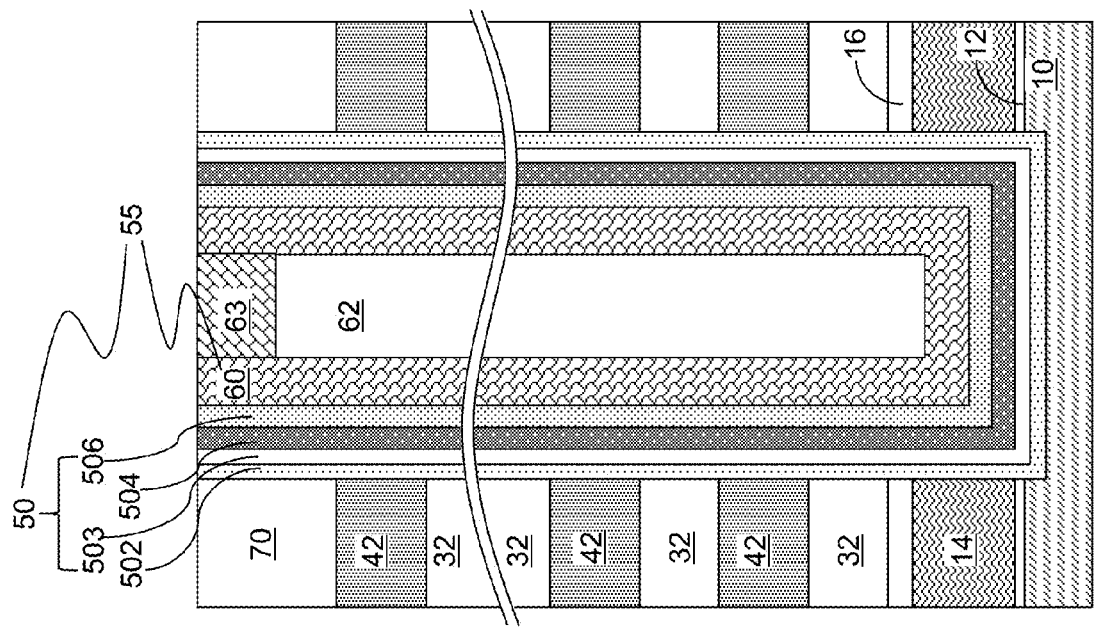
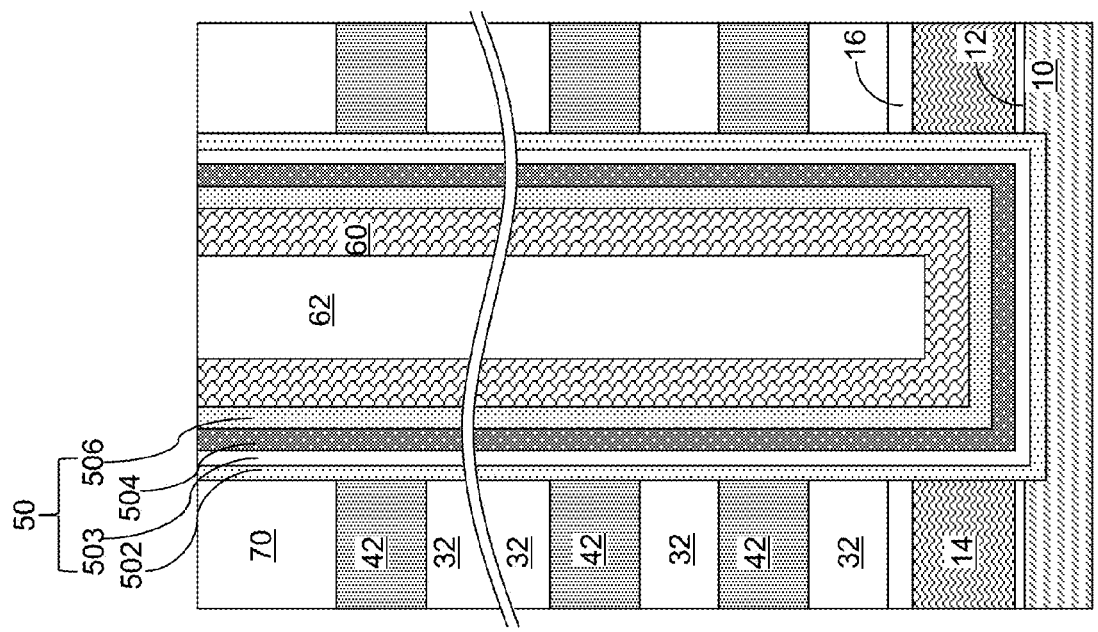
FIG. 8D
FIG. 8C

THREE-DIMENSIONAL NAND DEVICE CONTAINING SUPPORT PEDESTAL STRUCTURES FOR A BURIED SOURCE LINE AND METHOD OF MAKING THE SAME

RELATED APPLICATIONS

This application is a continuation-in-part of U.S. patent application Ser. No. 15/017,961 filed on Feb. 8, 2016, which claims benefit of priority of U.S. Provisional Patent Application Ser. No. 62/258,250 filed on Nov. 20, 2015, the entire contents of which are incorporated herein by reference in their entirety.

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device comprises an alternating stack of electrically conductive layers and insulating layers located over a substrate, an array of memory stack structures, each memory stack structure extending through the alternating stack and including a memory film and a semiconductor channel laterally surrounded by the memory film, and support structures located between the alternating stack and the substrate. The device may also include a source conductive layer underlying the alternating stack and overlying the substrate, and in contact with the support structures.

According to another aspect of the present disclosure, a method of forming a three-dimensional memory device is provided. A layer containing support pedestal structures and sacrificial material portions is formed over a substrate. An alternating stack of insulator layers and spacer material layers is formed over the support pedestal structures and the sacrificial material portions. Memory stack structures are formed through the alternating stack. Each of the memory stack structures comprises a respective portion of a memory film and a respective semiconductor channel, and protrudes into a respective sacrificial material portion. The sacrificial material portions are removed without removing the support pedestal structures to form at least one laterally-extending cavity. Portions of the memory film physically exposed to the at least one laterally extending cavity are removed, while not removing portions of the memory film contacting the support pedestal structures. Conductive rail structures are formed in the at least one laterally-extending cavity and on sidewalls of the semiconductor channels.

According to an aspect of the present disclosure, a three-dimensional memory device is provided, which comprises an alternating stack of electrically conductive layers and insulating layers located over a substrate; an array of memory stack structures, each memory stack structure extending through the alternating stack and including a memory film and a semiconductor channel laterally surrounded by the memory film; and an array of dielectric pillars located between the alternating stack and the substrate.

According to another aspect of the present disclosure, a method of manufacturing a three-dimensional memory device is provided. A sacrificial matrix layer is formed over a substrate. The sacrificial matrix layer is patterned to form an array of cavities. An array of dielectric pillars is formed by filling the array of cavities with a dielectric fill material. An alternating stack of insulator layers and spacer material layers is formed over the array of dielectric pillars and the sacrificial matrix layer. An array of memory stack structures is formed through the alternating stack and the sacrificial matrix layer. The sacrificial matrix layer is replaced with a source conductive layer.

BRIEF DESCRIPTION OF THE DRAWINGS

FIG. 4A-4C are horizontal cross-sectional views of the first exemplary structure of FIG. 3 through the sacrificial material layer and the array of dielectric pillars for first, second, and third exemplary configurations, respectively, according to the first embodiment of the present disclosure. The zigzag vertical planes X-X' correspond to the plane of the vertical cross-sectional view of FIG. 3.

FIGS. 8A-8D are sequential vertical cross-sectional views of a memory opening within the first exemplary structure during various processing steps employed to form a memory stack structure according to the first embodiment of the present disclosure.

DETAILED DESCRIPTION

Figure 1:
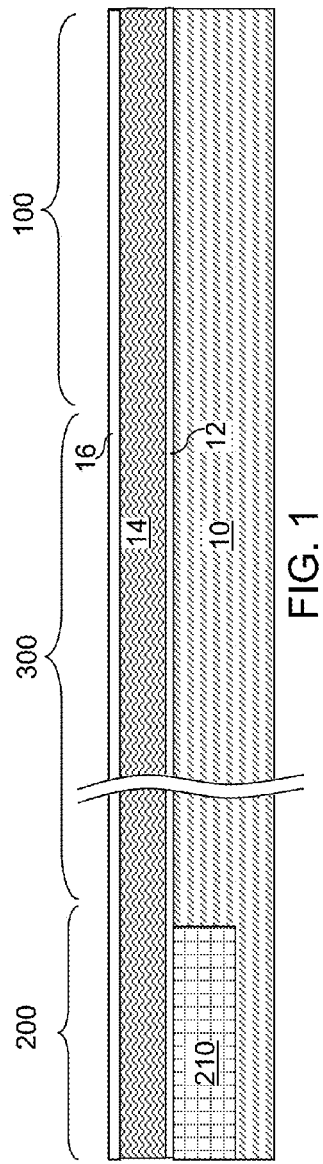
FIG. 1 is a vertical cross-sectional view of a first exemplary structure after formation of a lower source insulator layer, a sacrificial matrix layer, and an upper source insulator layer according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to a first embodiment of the present disclosure is illustrated, which can be employed, for example, to fabricate a device structure containing vertical NAND memory devices. The first exemplary structure includes a substrate, which can be a semiconductor substrate (e.g., a semiconductor substrate, such as a single crystalline silicon wafer). The substrate can include a substrate semiconductor layer 10. The substrate semiconductor layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. All measurements for electrical conductivities are made at the standard condition. The substrate semiconductor layer 10 can include at least one doped well (not expressly shown) having a substantially uniform dopant concentration therein.

The first exemplary structure can have multiple regions for building different types of devices. Such areas can include, for example, a memory array region 100, a contact region 300, and a peripheral device region 200. In one embodiment, the substrate semiconductor layer 10 can include at least one a doped well in the memory array region 100. As used herein, a "doped well" refers to a portion of a semiconductor material having a doping of a same conductivity type (which can be p-type or n-type) and a substantially same level of dopant concentration throughout. The doped well can be the same as the substrate semiconductor layer 10 or can be a portion of the substrate semiconductor layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/cm^3$ to $1.0 \times 10^{18}/cm^3$, although lesser and greater dopant concentration levels can also be employed. As used herein, a dopant concentration level refers to average dopant concentration for a given region.

Peripheral devices 210 can be formed in, or on, a portion of the substrate semiconductor layer 10 located within the peripheral device region 200. The peripheral devices can include various devices employed to operate the memory devices to be formed in the memory array region 100, and can include, for example, driver circuits for the various components of the memory devices. The peripheral devices 210 can include, for example, field effect transistors and/or passive components such as resistors, capacitors, inductors, diodes, etc.

A lower source insulating layer 12 can be formed above the substrate semiconductor layer 10. The lower source insulating layer 12 provides electrical isolation of a continuous source structure to be subsequently formed from the substrate semiconductor layer 10. The lower source insulating layer 12 can include, for example, silicon oxide and/or a dielectric metal oxide (such as $HfO_2$, $ZrO_2$, $LaO_2$, etc.). The thickness of the lower source insulating layer 12 can be in a range from 3 nm to 30 nm, although lesser and greater thicknesses can also be employed.

A sacrificial matrix layer 14 can be formed over the lower source insulating layer 14. The sacrificial matrix layer 14 includes a material that can be removed selective to the material of the lower source insulating layer 12, and selective to the materials of an upper source insulating layer and an insulating spacer to be subsequently formed. For example, the sacrificial matrix layer 14 can include a semiconductor material such as polysilicon or a silicon-germanium alloy, or can include amorphous carbon, an organic polymer, or an inorganic polymer. The sacrificial matrix layer 14 can be deposited by chemical vapor deposition, physical vapor deposition, or spin coating. The thickness of the sacrificial matrix layer 14 can be in a range from 10 nm to 60 nm, although lesser and greater thicknesses can also be employed.

An optional upper source insulating layer 16 can be formed above the sacrificial matrix layer 14. The upper source insulating layer 16 provides electrical isolation of the continuous source structure to be subsequently formed from electrically conductive layers to be subsequently formed. The upper source insulating layer 16 can include, for example, silicon oxide and/or a dielectric metal oxide (such as $HfO_2$, $ZrO_2$, $LaO_2$, etc.). The thickness of the upper source insulating layer 16 can be in a range from 3 nm to 30 nm, although lesser and greater thicknesses can also be employed. If a subsequent alternating stack to be formed over the upper source insulating layer 16 starts with a sacrificial material layer, the upper source insulating layer 16 is preferably included. If a subsequent alternating stack to be formed over the upper source insulating layer 16 starts with an insulating layer, the upper source insulating layer 16 is optional, and the first insulating material of the alternating stack can function as, i.e., can be identified as, an upper source insulating layer 16. While the present disclosure is described employing an embodiment in which the upper source insulating layer 16 is a distinct from a bottommost insulating layer of an alternating stack to be subsequently formed, embodiments are expressly contemplated in which the upper source insulating layer 16 is the same as the bottommost insulating layer.

Figure 2:
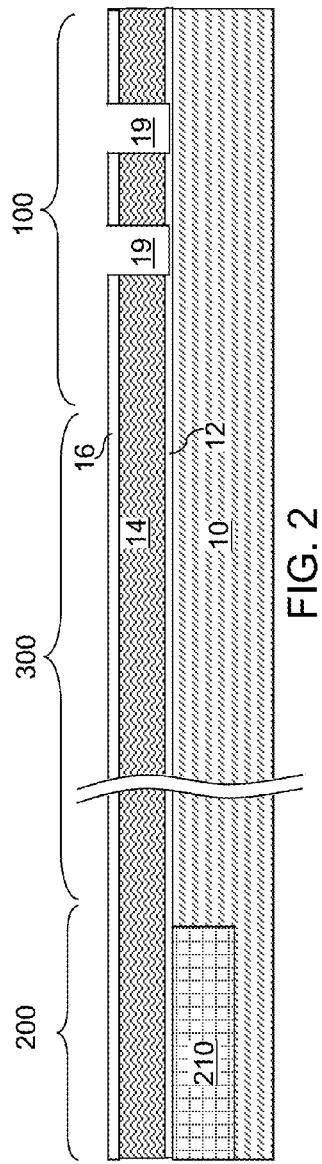
FIG. 2 is a vertical cross-sectional view of the first exemplary structure after formation of an array of via cavities through the sacrificial matrix layer according to the first embodiment of the present disclosure.

Referring to FIG. 2, a photoresist layer (not shown) can be applied over the upper source insulating layer 16 and can be lithographically patterned to form an array of opening therein. The pattern of the array of openings in the photoresist layer can be transferred through the upper source insulating layer 16 and the sacrificial matrix layer 14 by an anisotropic etch such as a reactive ion etch. The lower source insulating layer 12 can be employed as an etch stop layer. If desired, the etch may be continued through the lower source insulating layer 12 to or into the top surface of the substrate semiconductor layer 10. An array of via cavities 19 can be formed in the sacrificial matrix layer 14. The cavities 19 may extend to the lower source insulating layer 12, through the lower source insulating layer 12 to the top surface of the substrate semiconductor layer 10 or into the substrate semiconductor layer 10. The array of via cavities 19 may have a periodic pattern. In one embodiment, each via cavity 19 can have substantially vertical sidewalls and/or can have a substantially circular horizontal cross-sectional shape. In one embodiment, each via cavity 19 can have a substantially cylindrical shape. In one embodiment, the array of via cavities 19 can be a two-dimensional periodic array of instances of a unit cell structure. The photoresist layer can be subsequently removed, for example, by ashing.

Figure 3:
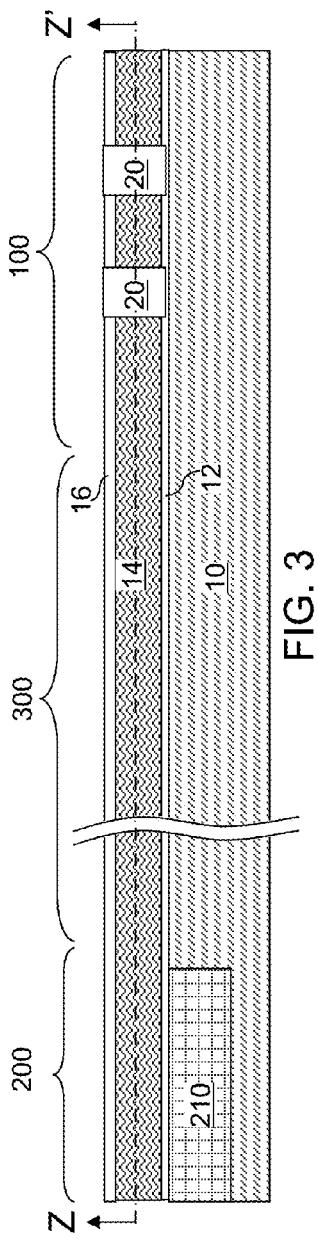
FIG. 3 is a vertical cross-sectional view of the first exemplary structure after formation of an array of dielectric pillars according to the first embodiment of the present disclosure.

Referring to FIG. 3, a dielectric fill material is deposited in the array of via cavities 19, for example, by chemical vapor deposition or spin coating. The dielectric fill material can include, for example, silicon oxide (such as doped silicate glass or undoped silicate glass), a dielectric metal oxide, silicon nitride, organosilicate glass, or a combination thereof. For example, the dielectric fill material can include silicon oxide. Excess portions of the deposited dielectric fill material can be removed from above the horizontal plane including the top surface of the upper source insulating layer 16 by a planarization process, which can employ a recess etch and/or chemical mechanical planarization.

The remaining portions of the dielectric fill material that fill the via cavities 19 constitute an array of dielectric pillars 20. The array of dielectric pillars 20 may have a periodic pattern. In one embodiment, each dielectric pillar 20 can have substantially vertical sidewalls and/or can have a substantially circular horizontal cross-sectional shape. In one embodiment, each dielectric pillar 20 can have a substantially cylindrical shape. In one embodiment, the array of dielectric pillars 20 can be a two-dimensional periodic array of instances of a unit cell structure. The top surfaces of the dielectric pillars 20 and the top surface of the upper source insulating layer 16 can be coplanar, i.e., can be located within a same Euclidean plane.

Figure 4A:
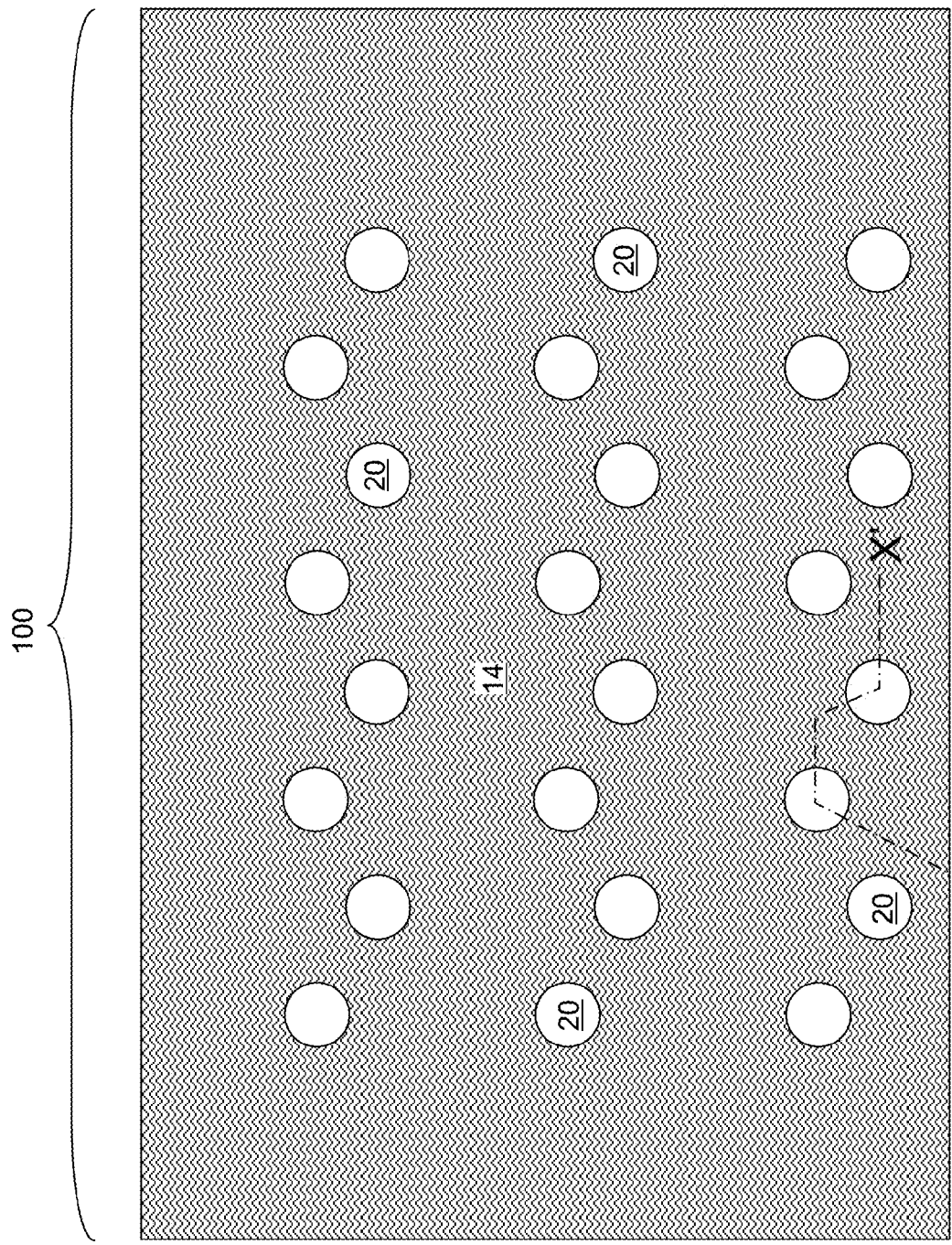
Figure 4C:
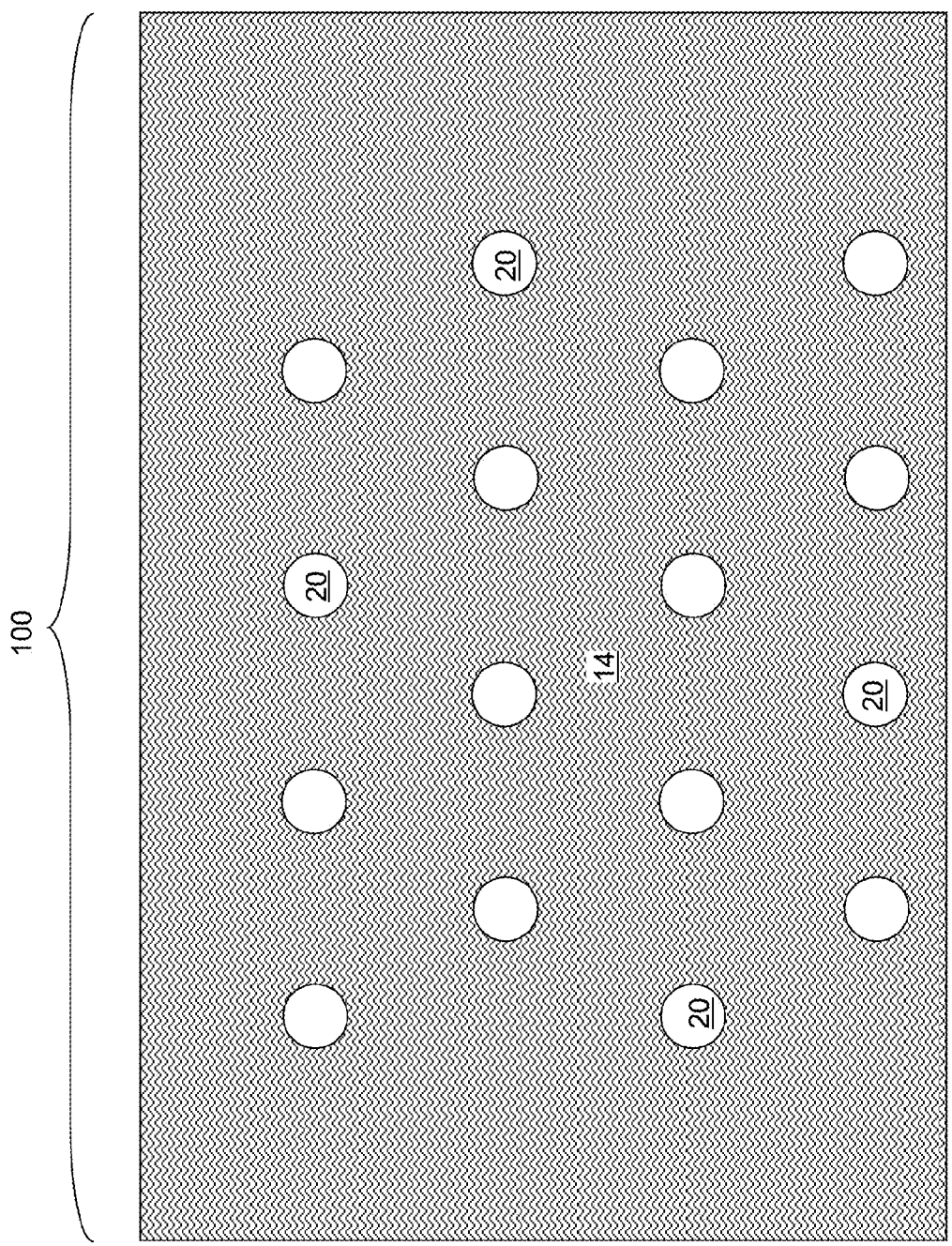

FIGS. 4A-4C illustrate various exemplary patterns that can be employed for the array of dielectric pillars 20. Specifically, FIGS. 4A-4C illustrate the array of dielectric pillars 20 for first, second, and third exemplary configurations, respectively. The pattern illustrated in FIG. 4A is herein referred to as a zigzag pattern, the pattern illustrated in FIG. 4B is herein referred to as a lattice pattern, and the pattern illustrated in FIG. 4C is herein referred to as a diagonal pattern. The zigzag pattern may comprise zigzag rows (i.e., saw tooth shaped rows) of dielectric pillars 20. The rows may extend parallel to the word line direction or parallel to the bit line direction. The lattice pattern may comprise a plurality of linear rows and columns of pillars 20 which form rectangular or square unit cells of pillars 20. The diagonal pattern may comprise a plurality of parallel diagonal rows of pillars 20 which extend at an angle of 30 to 60 degrees, such as about 45 degrees, with respect to the bit line and word line directions. The rows form parallelogram shaped unit cells which lack a right angle. The periodicity of each pattern may be selected to be commensurate with the pattern of memory openings to be subsequently formed. In one embodiment, the periodicity of each pattern of the dielectric pillars 20 can be the same as, or can be an integer multiple of, the periodicity of the memory openings to be subsequently formed along the same direction.

Figure 5:
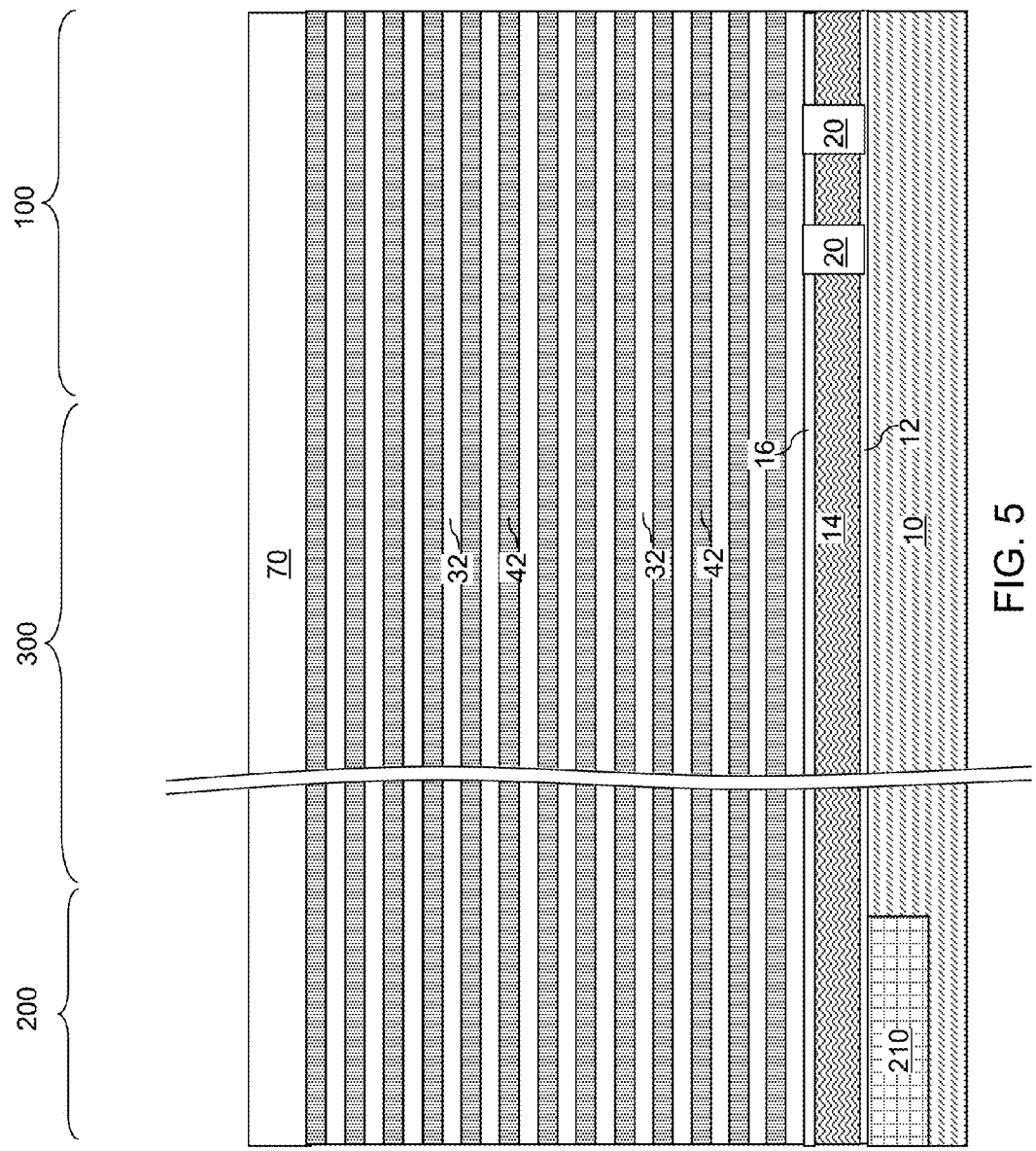
FIG. 5 is a vertical cross-sectional view of the first exemplary structure after formation of an alternating stack of insulating layers and sacrificial material layers according to the first embodiment of the present disclosure.

Referring to FIG. 5, an alternating stack of first material layers (which can be insulating layers 32) and second material layers (which are referred to spacer material layers) is formed over the upper source insulating layer 16. As used herein, a "material layer" refers to a layer including a material throughout the entirety thereof. In one embodiment, the alternating stack may include the insulating layers 32 and spacer material layers that are located between each vertically neighboring pair of insulating layers 32. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer (i.e., the spacer material layers) can be a sacrificial material layer 42. In this case, the stack can include an alternating plurality of insulating layers 32 and sacrificial material layers 42, and constitutes an in-process alternating stack comprising insulating layers 32 and sacrificial material layers 42. As used herein, an "alternating stack" of first elements and second elements is a structure in which instances of a first element and instances of a second element alternate along a same direction, such as a vertical direction. As used herein, a "prototype" structure or an "in-process" structure refers to a transient structure that is subsequently modified in the shape or composition of at least one component therein. Thus, the in-process alternating stack (32, 42) can be formed over the layer stack of the lower source insulator layer 12, the sacrificial matrix layer 14, and the upper source insulator layer 16.

In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In an illustrative example, the insulating layers 32 can include silicon oxide, and sacrificial material layers can include silicon nitride. As used herein, silicon nitride, or a silicon nitride material, refers to a dielectric compound of at least one Group IV element and at least one non-metallic element such that silicon accounts more than 50 atomic percent of the at least one Group IV element and nitrogen accounts for more than 50 atomic percent of the non-metallic element. As such, silicon nitrides include $Si_3N_4$ and a silicon oxynitride in which the atomic concentration of nitrogen is greater than the atomic concentration of oxygen. As used herein, silicon oxide, or a silicon oxide material, refers to a dielectric compound of at least one Group IV element and at least one non-metallic element such that silicon accounts more than 50 atomic percent of the at least one Group IV element and oxygen accounts for more than 50 atomic percent of the non-metallic element. Silicon oxides include silicon dioxide, an oxide of a silicon-germanium alloy in which the atomic concentration of silicon is greater than the atomic concentration of germanium, a silicon oxynitride in which the atomic concentration of oxygen is greater than the atomic concentration of nitrogen, and doped derivatives thereof (such as phosphosilicate glass, fluorosilicate glass, borophosphosilicate glass, organosilicate glass, etc.). The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 6:
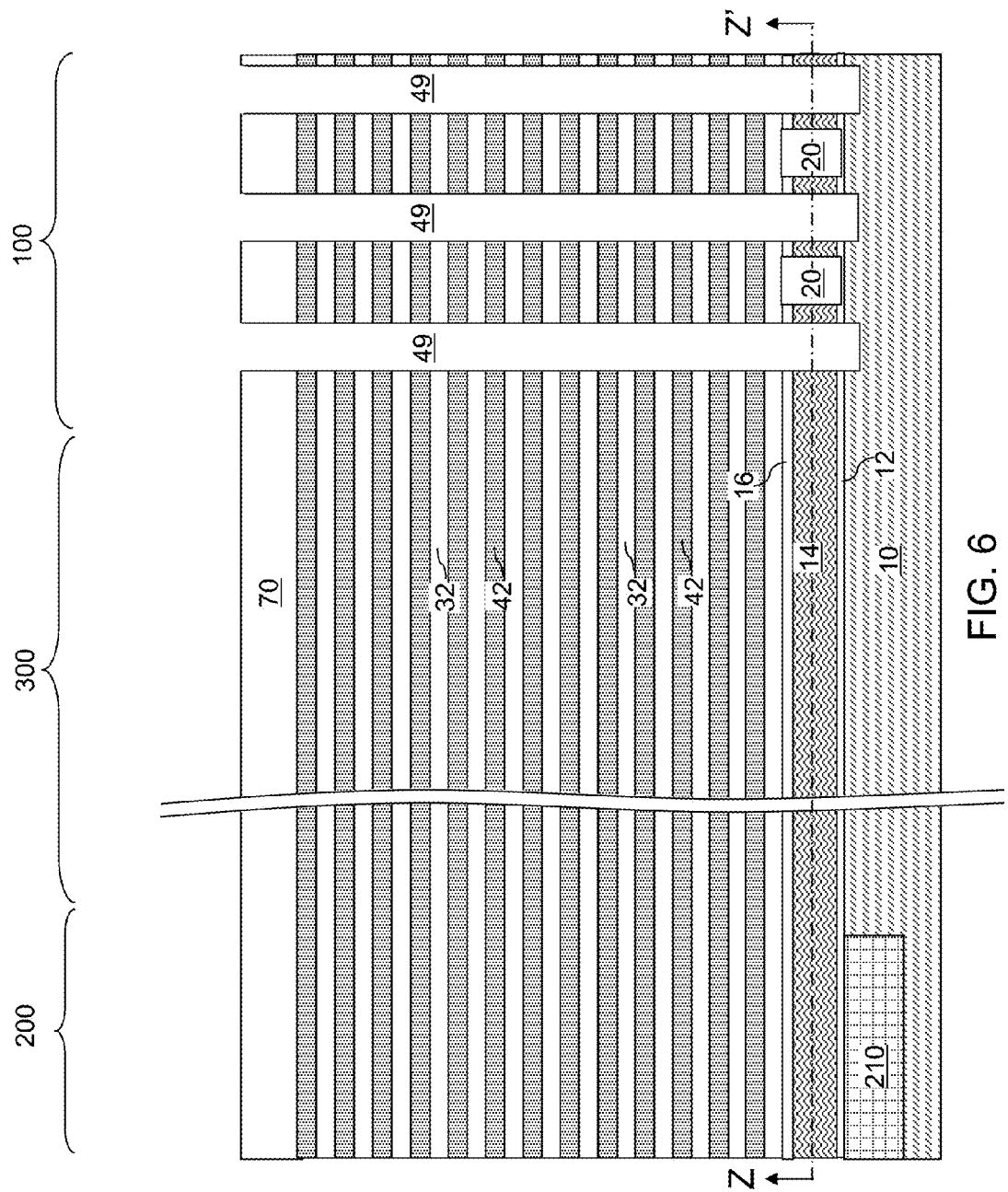
FIG. 6 is a vertical cross-sectional view of the first exemplary structure after formation of memory openings extending through the alternating stack according to the first embodiment of the present disclosure.

Referring to FIG. 6, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the optional insulating cap layer 70, through entirety of the alternating stack (32, 42), and through the upper source insulating layer 16, the sacrificial matrix layer 14, and the lower source insulating layer 12 by at least one anisotropic etch that employs the patterned lithographic material stack as an etch mask. Portions of the insulating cap layer 70, the alternating stack (32, 42), the upper source insulating layer 16, the sacrificial matrix layer 14, and the lower source insulating layer 12 underlying the openings in the patterned lithographic material stack are etched to form memory openings 49. In other words, the transfer of the pattern in the patterned lithographic material stack through the optional insulating cap layer 70, through entirety of the alternating stack (32, 42), and through the upper source insulating layer 16, the sacrificial matrix layer 14, and the lower source insulating layer 12 and optionally partially through the substrate semiconductor layer 10 forms the memory openings 49. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the lower source insulating layer 12 may be used as an etch stop layer. The sidewalls of the memory openings 49 can be substantially vertical, or can be tapered. The patterned lithographic material stack can be subsequently removed, for example, by ashing.

Figure 7A:
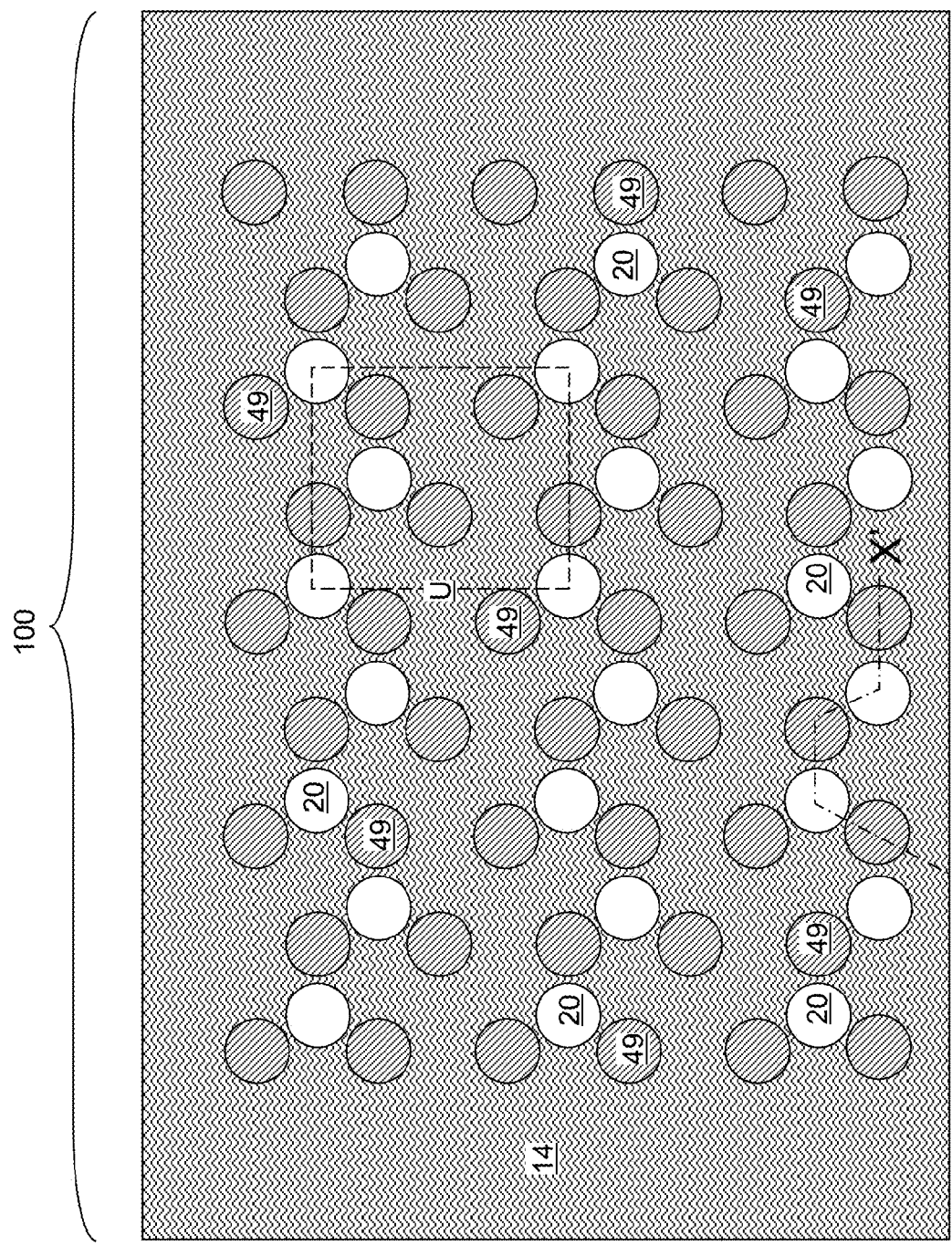
FIG. 7A-7C are horizontal cross-sectional views of the first exemplary structure of FIG. 6 through the sacrificial material layer, the array of dielectric pillars, and the array of memory openings for the first, second, and third exemplary configurations, respectively, according to the first embodiment of the present disclosure. The zigzag vertical planes X-X' correspond to the plane of the vertical cross-sectional view of FIG. 6.
Figure 7B:
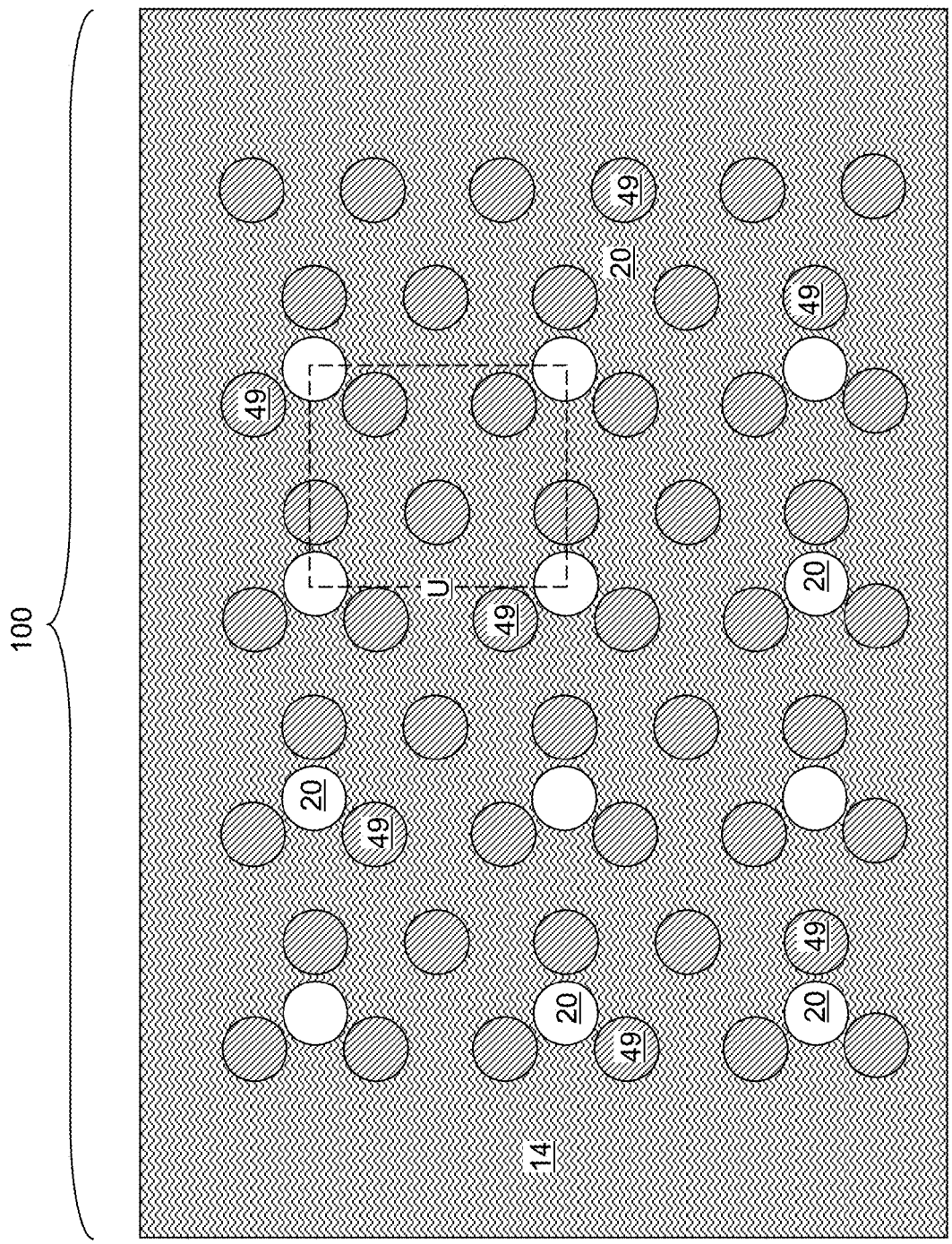
Figure 7C:
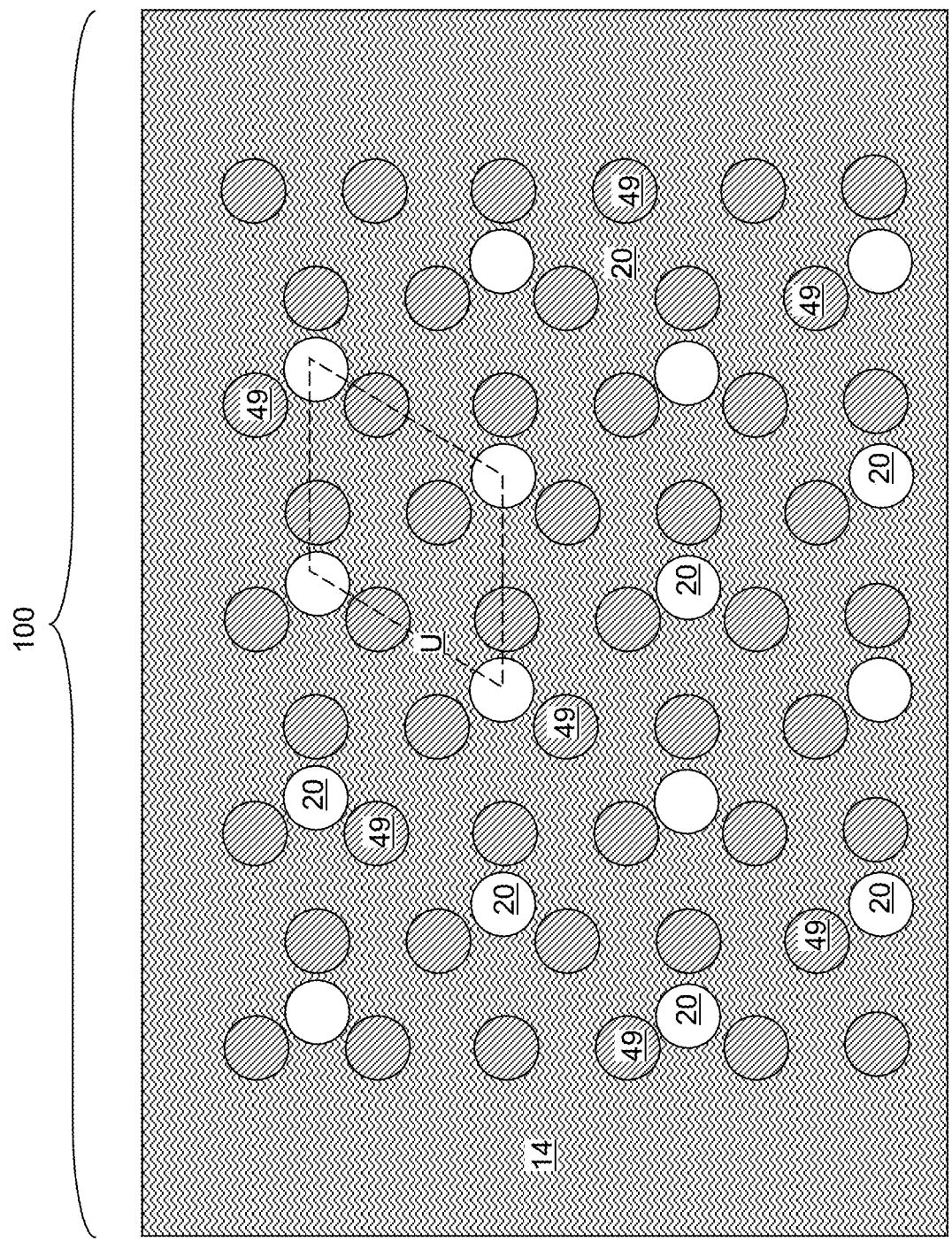

FIG. 7A-7C illustrate the first, second, and third exemplary configurations, respectively, for the sacrificial material layer 14, the array of dielectric pillars 20, and the array of memory openings 49 in horizontal cross-sectional views along a horizontal plane that passes through the sacrificial material layer 14. In one embodiment, the array of dielectric pillars 20 and the array of memory openings 49 collectively constitute a two-dimensional periodic array of multiple instances of a unit cell structure "U". The unit cell structure U can include multiple memory openings 49 (such as four memory opening as illustrated in FIGS. 7A-7C) and at least one dielectric pillar 20 (which may be two dielectric pillars 20 composed of one whole pillar inside the unit cell and quarters of the four pillars at the vertices of the unit cell as illustrated in FIG. 7A, or a single dielectric pillar 20 composed of quarters of the four pillars at the vertices of the unit cell as illustrated in FIGS. 7B and 7C). In one embodiment, the array of memory openings 49 can comprise a hexagonal array of memory openings 49. In one embodiment, the ratio of the total number of the multiple memory openings 49 in the unit cell structure U to the total number of the at least one dielectric pillar 20 in the unit cell structure U can be in a range from 2 to 4. For example, the ratio can be 2 as illustrated in FIG. 7A, or 4 as illustrated in FIG. 7B, or 3 as illustrated in FIG. 7C.

A memory stack structure can be formed in each memory opening 49 in subsequent processing steps. FIGS. 8A-8D illustrate the process of forming a memory stack structure in a memory opening 49. While a particular embodiment is illustrated herein for formation of memory stack structures, embodiments are expressly contemplated herein in which different types of memory stack structures are formed.

Referring to FIG. 8A, a memory opening 49 is illustrated. The memory opening 49 extends through the insulating cap layer 70, the alternating stack (32, 42) and the layer stack of the upper source insulating layer 16, the sacrificial matrix layer 14, and the lower source insulating layer 12, and optionally into an upper portion of the substrate semiconductor layer 10. The recess depth of the bottom surface of each memory opening 49 with respect to the top surface of the substrate semiconductor layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 8B, a set of layers for formation of a memory film is deposited within each memory opening. The set of layers may include, for example, an optional outer blocking dielectric layer 502L, an optional inner blocking dielectric layer 503L, a charge storage element layer 504L, and a tunneling dielectric layer 506L.

Specifically, each of the outer and inner blocking dielectric layers (502L, 503L) can includes at least one dielectric material, which can be silicon oxide, a dielectric metal oxide, or a combination thereof. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, at least one of the outer and inner blocking dielectric layers (502L, 503L) can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide can be deposited, for example, by chemical vapor deposition (CVD), atomic layer deposition (ALD), pulsed laser deposition (PLD), liquid source misted chemical deposition, or a combination thereof. Additionally or alternately, at least one of the outer and inner blocking dielectric layers (502L, 503L) can include silicon oxide, silicon oxynitride, silicon nitride, or a combination thereof. In one embodiment, the blocking dielectric layers (502L, 503L) can include a stack of aluminum oxide and silicon oxide. Each of the outer and inner blocking dielectric layers (502L, 503L) can be formed by a conformal deposition method such as low pressure chemical vapor deposition, atomic layer deposition, or a combination thereof. The thickness of the blocking dielectric layers (502L, 503L) can be in a range from 1 nm to 30 nm, although lesser and greater thicknesses can also be employed.

The charge storage element layer 504L can include a single layer of a charge trapping material including a dielectric charge trapping material, which can be, for example, silicon nitride. Alternatively, the charge storage element layer 504L can include a conductive material such as doped polysilicon or a metallic material that is patterned into multiple electrically isolated portions (e.g., floating gates), for example, by being formed within lateral recesses into sacrificial material layers 42. In one embodiment, the charge storage element layer 504L includes a silicon nitride layer.

The charge storage element layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage element layer 504L may comprise an insulating charge trapping material, such as one or more silicon nitride segments. Alternatively, the charge storage element layer 504L may comprise conductive nanoparticles such as metal nanoparticles, which can be, for example, ruthenium nanoparticles. The charge storage element layer 504L can be formed, for example, by chemical vapor deposition (CVD), atomic layer deposition (ALD), physical vapor deposition (PVD), or any suitable deposition technique for storing electrical charges therein. The thickness of the charge storage element layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

In an illustrative example, the optional outer blocking dielectric layer 502L can include a dielectric metal oxide such as aluminum oxide, and the inner blocking dielectric layer 503L can include a dielectric oxide of a semiconductor material such as silicon oxide. The charge storage element layer 504L can include any type of charge storage material, and may be formed as a continuous material layer including a charge trapping material, or may be formed as a plurality of vertically isolated charge trapping material portions that are located at each level of the sacrificial material layers 42, for example, by being deposited in recessed regions by a combination of a conformal deposition process and an anisotropic etch. The tunneling dielectric layer 506L includes a material that can be employed as a tunneling dielectric material, which can be, for example, silicon oxide or an ONO stack.

A semiconductor channel layer 60L can be deposited over the tunneling dielectric layer 506L. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. A cavity 49' is formed in the volume of each memory opening 49 that is not filled with the deposited material layers (502L, 503L, 504L, 506L, 60L).

Referring to FIG. 8C, a dielectric material can be deposited to fill the cavity 49' within each memory opening 49. The dielectric material can be deposited by a conformal deposition method such as low pressure chemical vapor deposition (LPCVD), or by a self-planarizing deposition process such as spin coating. Exemplary dielectric materials that can be employed to fill the cavities 49' include silicon oxide (undoped silicate glass or doped silicate glass) and organosilicate glass.

A planarization process can be performed to remove excess portions of the dielectric material, the semiconductor channel layer 60L, the tunneling dielectric layer 506L, the charge storage element layer 504L, and the blocking dielectric layers (502L, 503L) from above the horizontal plane including the top surface of the insulating cap layer 70. A recess etch and/or chemical mechanical planarization process can be employed. Each remaining portion of the outer blocking dielectric layer 502L in a memory opening constitutes an outer blocking dielectric 502. Each remaining portion of the inner blocking dielectric layer 503L in a memory opening constitutes an inner blocking dielectric 503. Each remaining portion of the charge storage element layer 504L in a memory opening includes charge storage elements 504 (which may be embodied as a single continuous memory material layer (charge storage layer) or as discrete charge storage material portions located at each level of the sacrificial material layers 42). In one embodiment, portions of a single continuous memory material layer including a charge trapping dielectric material (such as silicon nitride) that are located at levels of the sacrificial material layers 42 constitute the charge storage elements, while portions of the same single continuous memory material layer located at each level of the insulating layers 32 provide electrical isolation among vertically neighboring charge storage elements. Each remaining portion of the tunneling dielectric layer 506L in a memory opening constitutes a tunneling dielectric 506. Each remaining portion of the semiconductor channel layer 60L in a memory opening constitutes a semiconductor channel 60, which includes a vertical semiconductor channel that extend along the vertical direction. Each remaining portion of the dielectric material constitutes a dielectric core 62. Each adjoining set of an optional outer blocking dielectric 502, an inner blocking dielectric 503, a set of charge storage elements 504, and a tunneling dielectric 506 collectively constitute a memory film 50.

Referring to FIG. 8D, each dielectric core 62 can be vertically recessed, for example, by a recess etch with respect to the memory film 50. The recess etch of the dielectric core 62 may, or may not, be selective to the semiconductor channel 60. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. Each set of a memory film 50 and a semiconductor channel 60 located within a same memory opening constitutes a memory stack structure 55.

Figure 9:
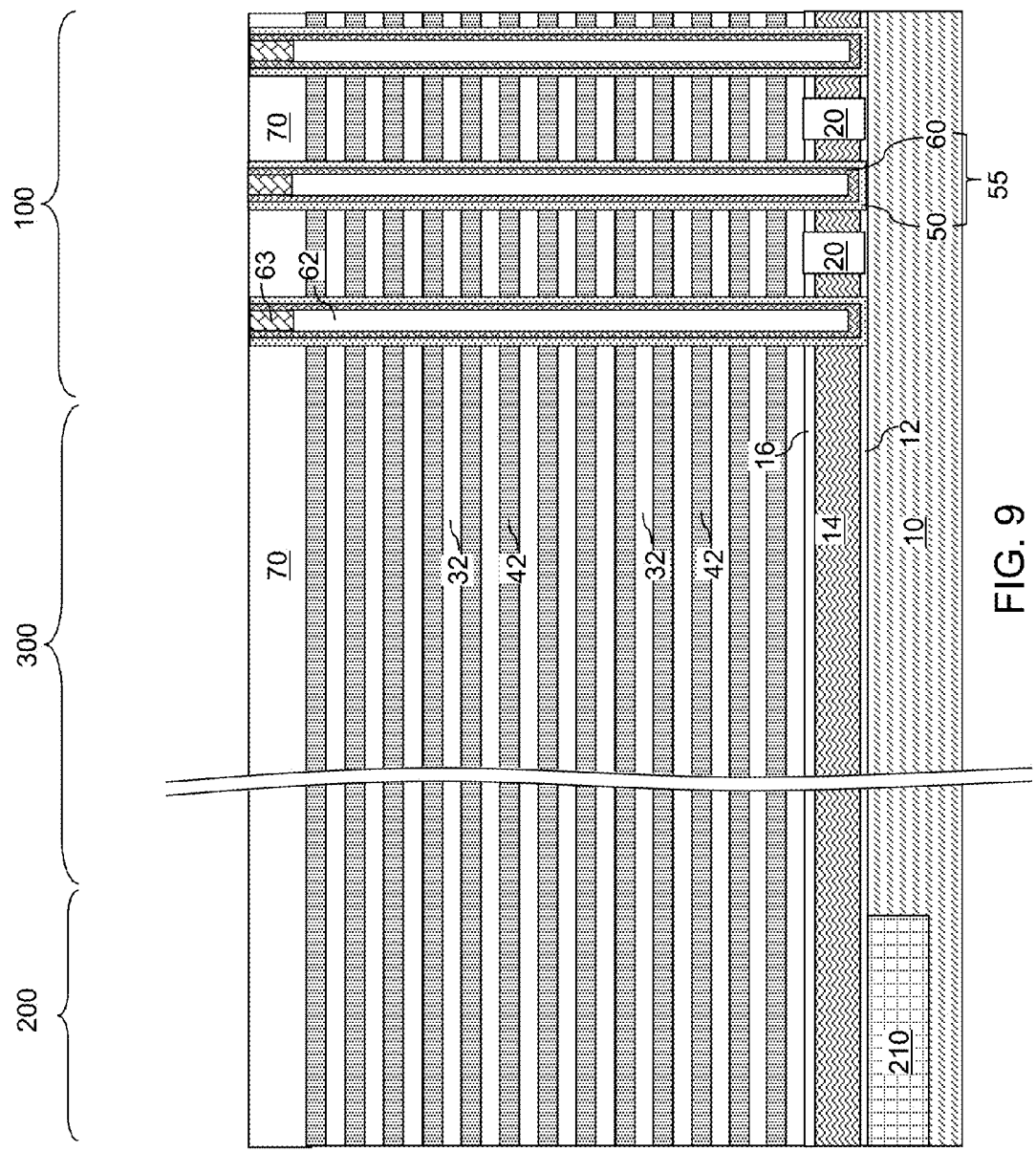
FIG. 9 is a vertical cross-sectional view of the first exemplary structure after formation of memory stack structures according to the first embodiment of the present disclosure.

FIG. 9 illustrates the first exemplary structure that incorporates multiple instances of the exemplary memory stack structure 55 of FIG. 8D. Each memory stack structure 55 includes from outside to inside, at least one optional blocking dielectric (502, 503) (which may include an outer blocking dielectric 502 and an inner blocking dielectric 503), charge storage elements 504 that may be memory elements (as embodied vertically spaced portions of a memory material layer located at levels of each sacrificial material layers 42), a tunneling dielectric 506, and a semiconductor channel 60. While the present disclosure is described employing the illustrated configuration for the memory stack structure, the methods of the present disclosure can be applied to alternative memory stack structures including a polycrystalline semiconductor channel.

Figure 10:
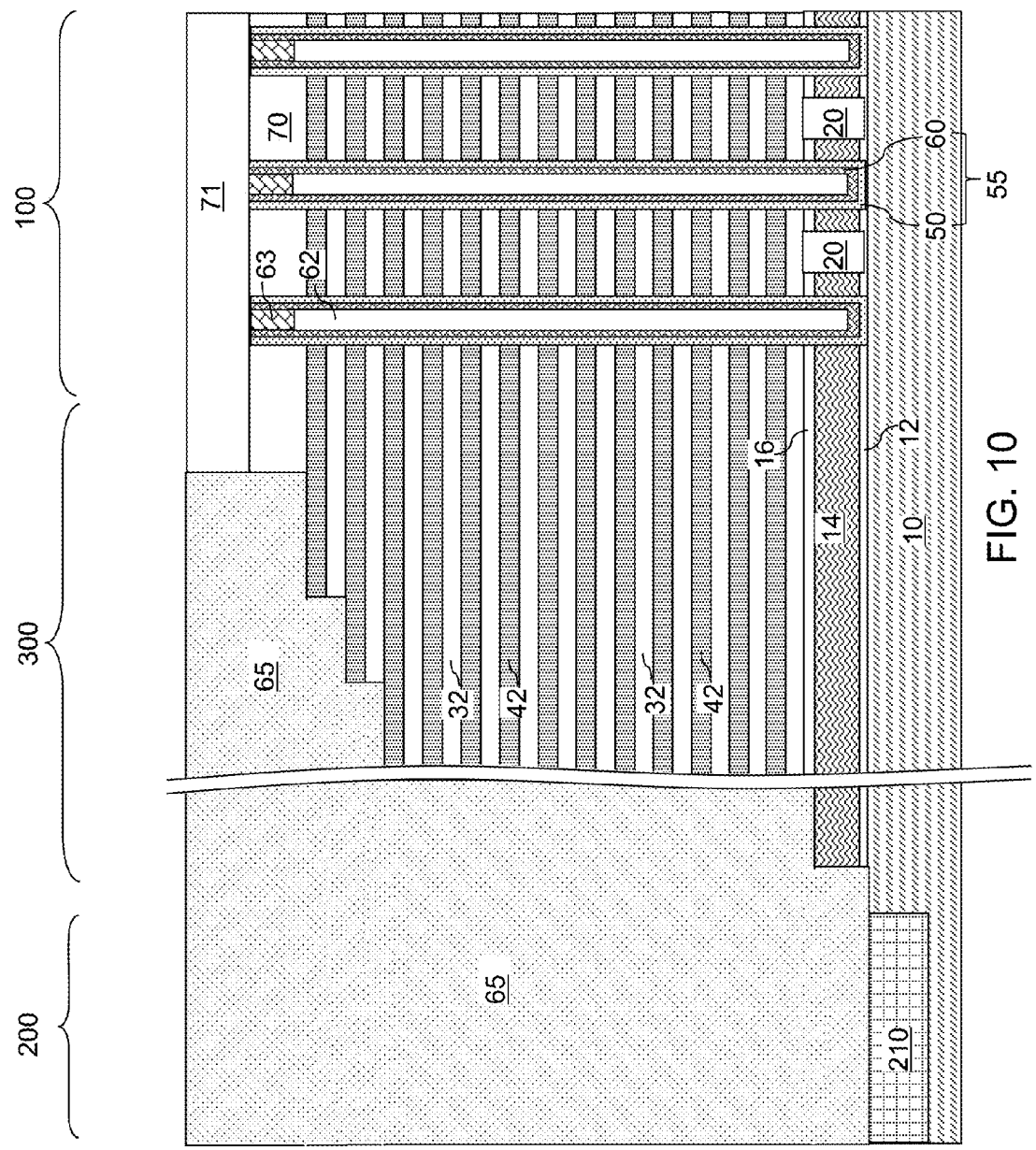
FIG. 10 is a vertical cross-sectional view of the first exemplary structure after formation of a set of stepped surfaces and a retro-stepped dielectric material portion according to the first embodiment of the present disclosure.

Referring to FIG. 10, an optional first contact level dielectric layer 71 can be formed over the substrate semiconductor layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, the alternating stack (32, 42), and the layer stack of the upper source insulating layer 16, the sacrificial matrix layer 14, and the lower source insulating layer 12 can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the substrate semiconductor layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the substrate semiconductor layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 11:
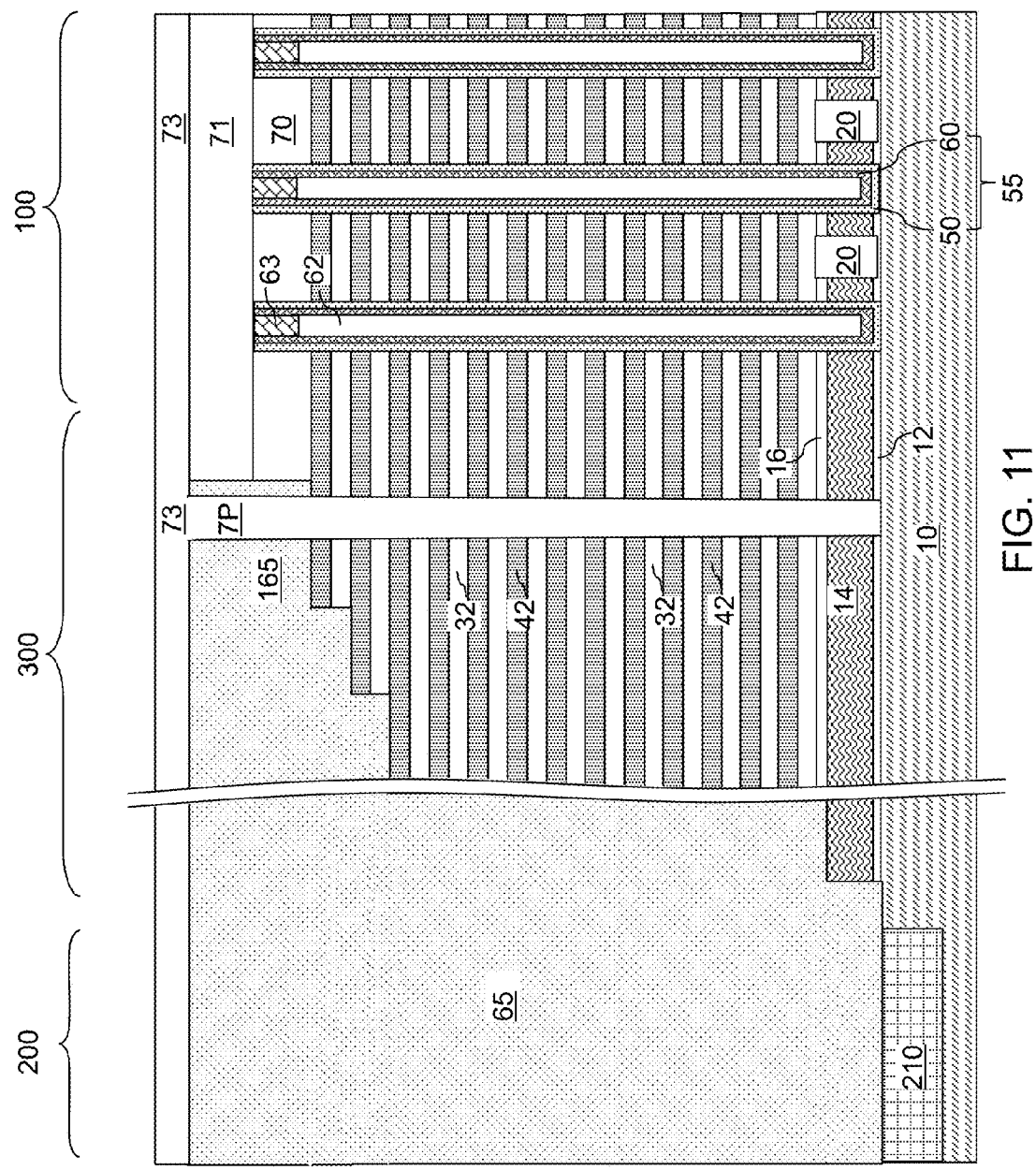
FIG. 11 is a vertical cross-sectional view of the first exemplary structure after formation of through-stack dielectric support pillars according to the first embodiment of the present disclosure.

Referring to FIG. 11, through-stack dielectric support pillars 7P may be optionally formed through the retro-stepped dielectric material portion 65 and/or through the first contact level dielectric layer 71 and/or through the alternating stack (32, 42). In one embodiment, the through-stack dielectric support pillars 7P can be formed in the contact region 300, which is located adjacent to the memory array region 100. The through-stack dielectric support pillars 7P can be formed, for example, by forming an opening extending through the retro-stepped dielectric material portion 65 and/or through the alternating stack (32, 42) and at least to the top surface of the substrate semiconductor layer 10, and by filling the opening with a dielectric material that is resistant to the etch chemistry to be employed to remove the sacrificial material layers 42.

In one embodiment, the through-stack dielectric support pillars 7P can include silicon oxide and/or a dielectric metal oxide such as aluminum oxide. In one embodiment, the portion of the dielectric material that is deposited over the first contact level dielectric layer 71 concurrently with deposition of the through-stack dielectric support pillars 7P can be present over the first contact level dielectric layer 71 as a second insulating cap layer 73. Each of the through-stack dielectric support pillars 7P and the second insulating cap layer 73 is an optional structure. As such, the second insulating cap layer 73 may, or may not, be present over the insulating cap layer 70 and the retro-stepped dielectric material portion 65. The first contact level dielectric layer 71 and the second insulating cap layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second insulating cap layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second insulating cap layer 73 and the through-stack dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the through-stack dielectric support pillars 7P can be removed, for example, by chemical mechanical planarization or a recess etch. In this case, the second insulating cap layer 73 is not present, and the top surface of the first contact level dielectric layer 71 can be physically exposed.

Figure 12A:
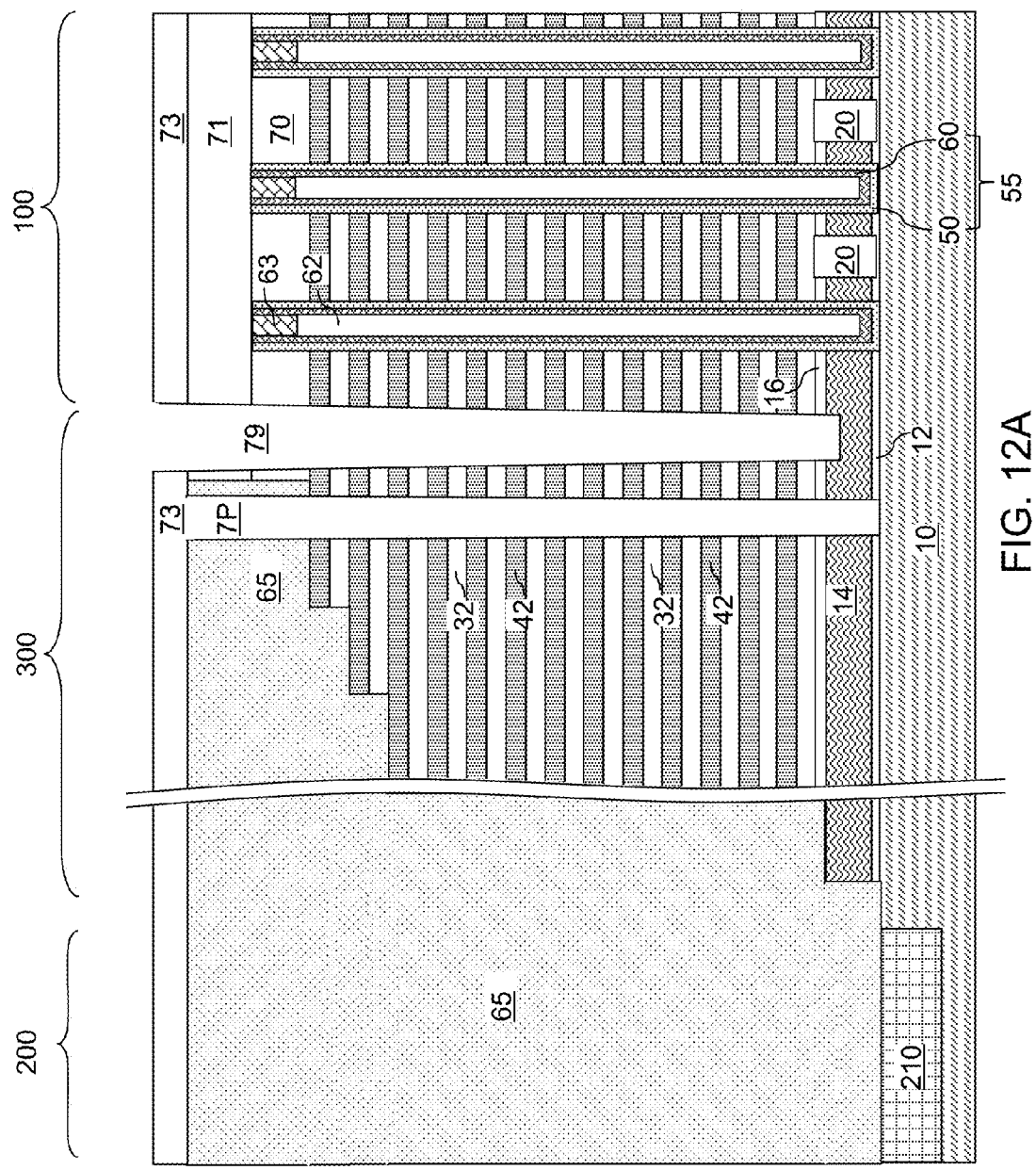
FIG. 12A is a vertical cross-sectional view of the first exemplary structure after formation of backside trenches according to the first embodiment of the present disclosure.
Figure 12B:
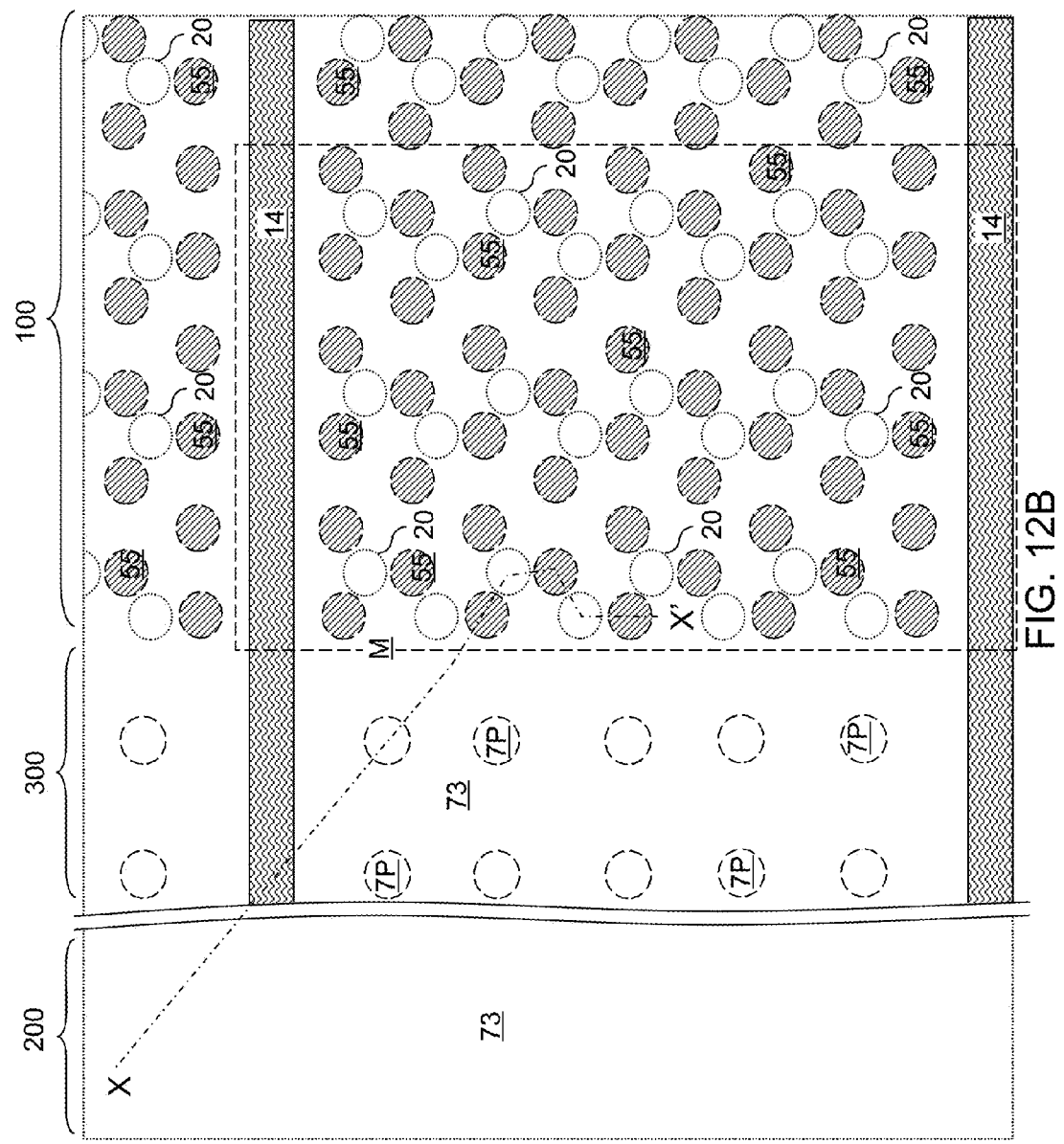
FIG. 12B is a see-through top-down view of the first exemplary structure of FIG. 12A. The zigzag vertical plane A-A' is the plane of the vertical cross-sectional view of FIG. 12A for the case of the first exemplary configuration.

Referring to FIGS. 12A and 12B, a photoresist layer (not shown) can be applied over the at least one contact level dielectric layer (71, 73), and can be lithographically patterned to form openings within areas between the memory blocks. In one embodiment, each opening in the photoresist layer can have a rectangular shape such that a pair of sidewalls of an opening laterally extends along a first horizontal direction.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, the alternating stack (32, 42), and the optional upper source insulator layer 16 (if present). The sacrificial matrix layer 14 can be physically exposed at the bottom of each backside trench 79. Clusters of the memory stack structures 55 can be laterally spaced by the backside trenches 79. Each cluster of memory stack structures 55 in conjunction with the portions of the alternating stack (32, 42) that surround the cluster constitutes a memory block. A memory block can be laterally bounded by a pair of backside trenches 79. FIG. 12A is a vertical cross-sectional view along the zigzag vertical plane X-X' in FIG. 12B. FIG. 12B is a see-through top-down view in which underlying elements are shown in dotted lines.

Figure 13A:
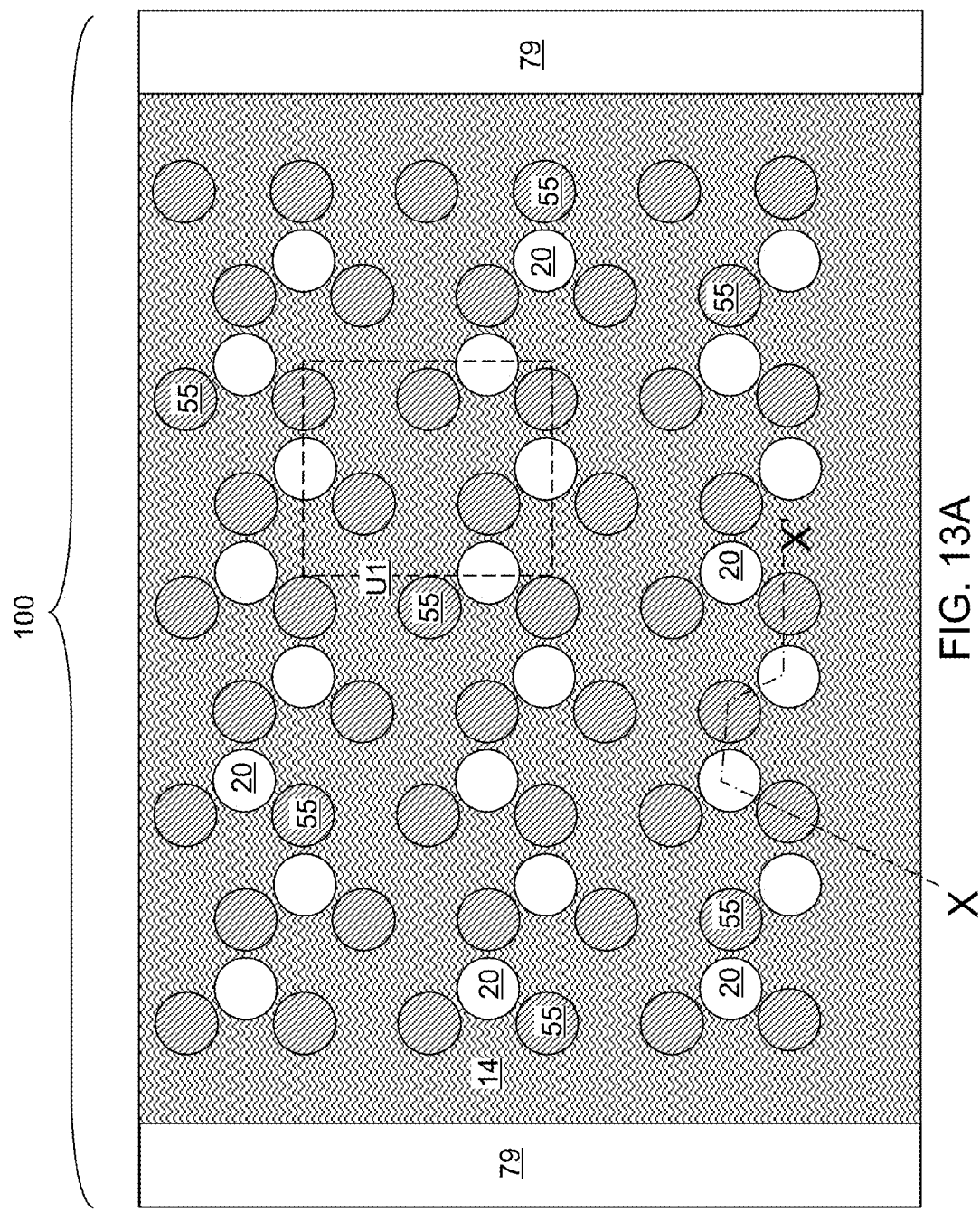
FIGS. 13A-13C are horizontal cross-sectional views of the first exemplary structure of FIG. 12A through the sacrificial material layer, the array of dielectric pillars, and the array of memory openings for the first, second, and third exemplary configurations, respectively, according to the first embodiment of the present disclosure. The zigzag vertical planes X-X' correspond to the plane of the vertical cross-sectional view of FIG. 12A.
Figure 13B:
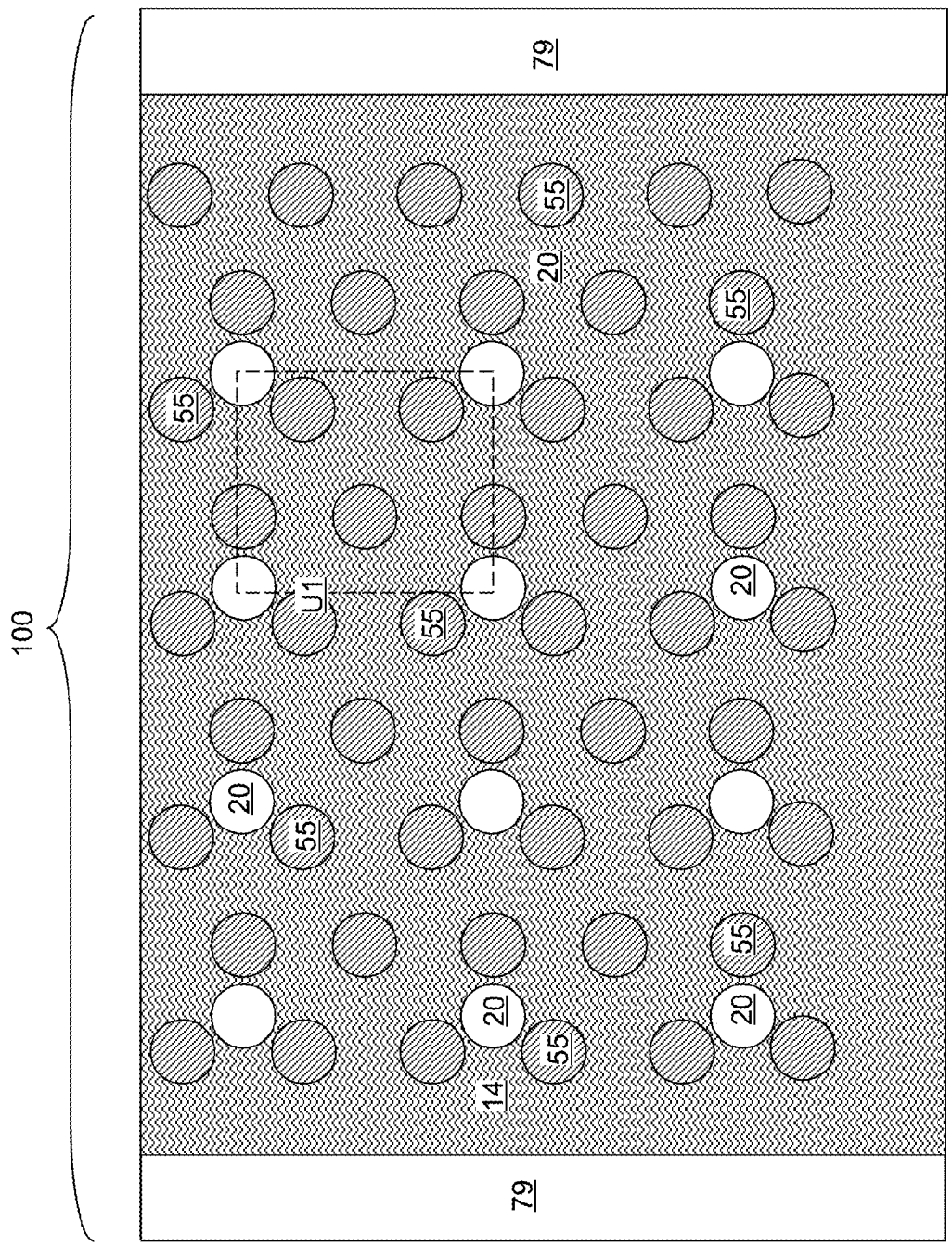
Figure 13C:
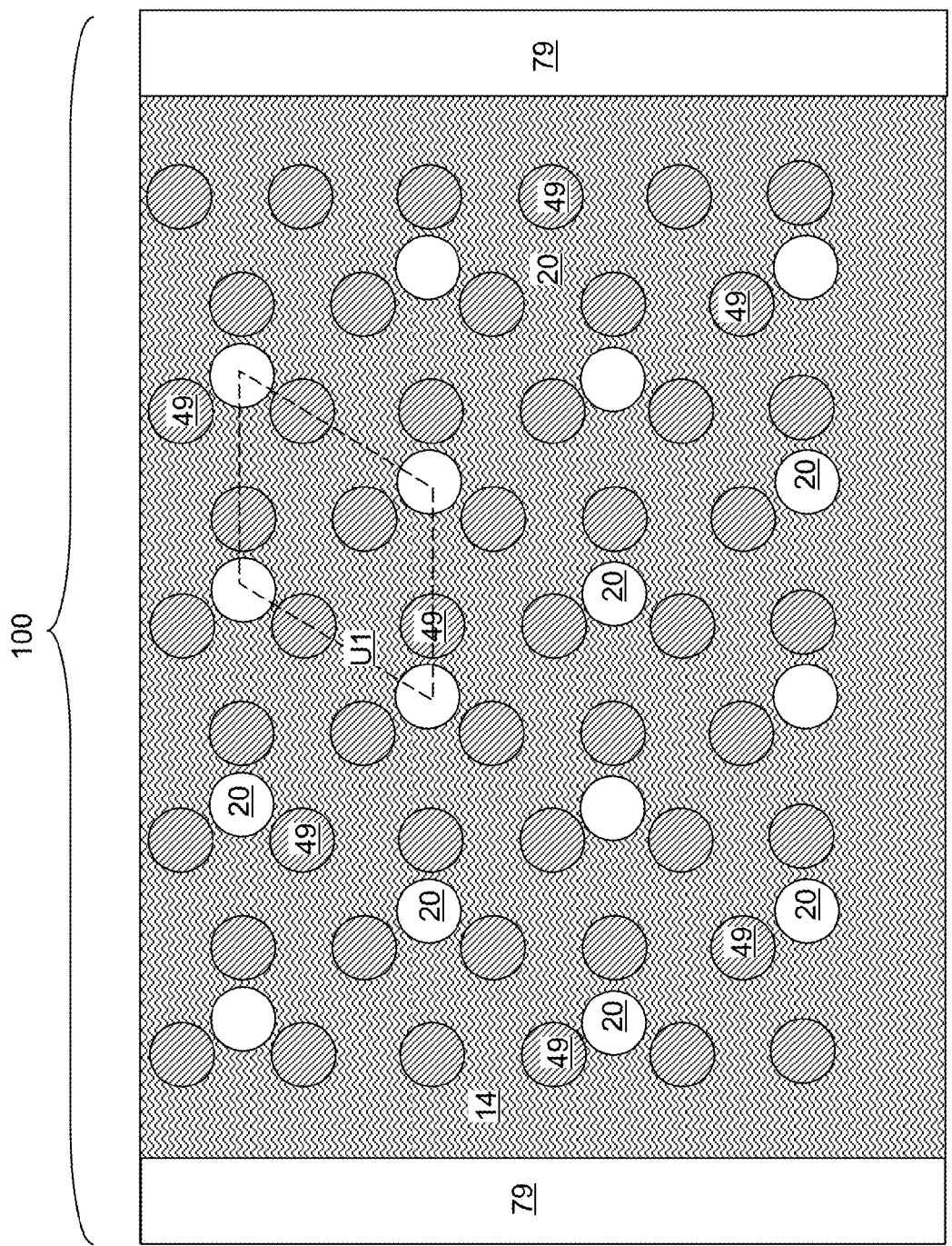

FIG. 13A illustrates a horizontal cross-sectional view of a dotted rectangular region "M" of the first exemplary structure of FIG. 12B along a horizontal plane including the sacrificial matrix layer 14 shown in FIG. 12A. The view in FIG. 13A correspond to the first (i.e., zigzag) configuration for the array of dielectric pillars 20 and the array of memory stack structures 55. FIGS. 13B and 13C show the corresponding horizontal cross-sectional views for the second and third configurations. The direction of the zigzag rows of pillars 20 in FIGS. 12B and 13A extend in the bit line direction perpendicular to the trench 79 elongation direction and the word line direction. However, in another embodiment, the direction of the zigzag rows of pillars 20 in FIGS. 12B and 13A may be rotated by 90 degreed to extend perpendicular to the bit line direction, and parallel to the trench 79 elongation direction and the word line direction.

The array of dielectric pillars 20 and the array of memory stack structures 55 collectively constitute a two-dimensional periodic array of multiple instances of a unit cell structure U1 that includes multiple memory stack structures 55 and at least one dielectric pillar 20. The array of memory stack structures 55 can comprise an hexagonal array of memory stack structures 55. The ratio of the total number of the multiple memory stack structures 55 in the unit cell structure U1 to the total number of the at least one dielectric pillar 20 in the unit cell structure U1 can be in a range from 2 to 4.

Figure 14:
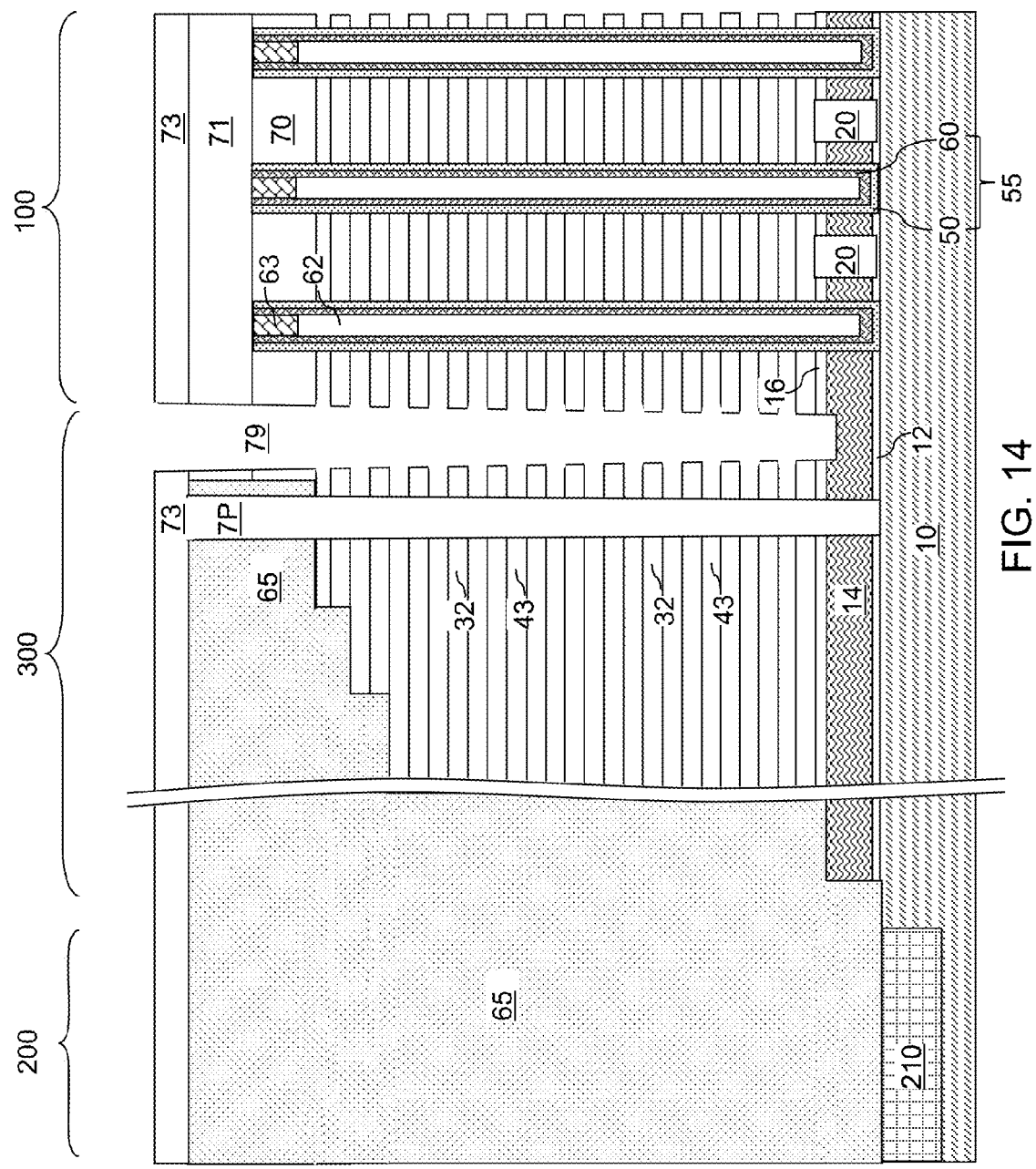
FIG. 14 is a vertical cross-sectional view of the first exemplary structure after formation of backside recesses according to the first embodiment of the present disclosure.

Referring to FIG. 14, backside recesses 43 can be formed by removing the sacrificial material layers 42 selective to the insulating layers 32 and the sacrificial matrix layer 14. Specifically, an etchant that selectively etches the second material of the sacrificial material layers 42 with respect to the first material of the insulating layers 32 and the sacrificial matrix layer 14 can be introduced into the backside trenches 79, for example, employing an etch process. The backside recesses 43 are formed in volumes from which the sacrificial material layers 42 are removed. The removal of the second material of the sacrificial material layers 42 can be selective to the first material of the insulating layers 32, the material of the through-stack dielectric support pillars 7P, the material of the retro-stepped dielectric material portion 65, the semiconductor material of the substrate semiconductor layer 10, the material of the sacrificial matrix layer 14, and the material of the outermost layer (such as the outer blocking dielectrics 502) of the memory stack structures 55. In one embodiment, the sacrificial material layers 42 can include silicon nitride, the sacrificial matrix layer 14 can include polysilicon or amorphous silicon, and the materials of the insulating layers 32, the through-stack dielectric support pillars 7P, and the retro-stepped dielectric material portion 65 can be selected from silicon oxide and dielectric metal oxides.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42, the material of the silicon oxide layer 501, and the material of the silicon nitride layer 502 are removed. The memory openings in which the memory stack structures (50, 60) are formed are herein referred to as front side recesses or front side cavities in contrast with the backside recesses 43. In one embodiment, the memory array region 100 comprises an array of monolithic three-dimensional NAND strings having a plurality of device levels disposed above the substrate (e.g., above the substrate semiconductor layer 10). In this case, each backside recess 43 can define a space for receiving a respective word line of the array of monolithic three-dimensional NAND strings.

Each of the plurality of backside recesses 43 can extend substantially parallel to the top surface of the substrate semiconductor layer 10. A backside recess 43 can be vertically bounded by a top surface of an underlying insulating layer 32 and a bottom surface of an overlying insulating layer 32. In one embodiment, each backside recess 43 can have a uniform height throughout. In one embodiment, an optional backside blocking dielectric, such as an aluminum oxide dielectric, may be deposited into the backside recesses 43 in contact with the exposed portions of the memory film 50 in the backside recesses 43. In this embodiment, one or both of the front side blocking dielectric layers 502 and/or 503 may be omitted.

Figure 15:
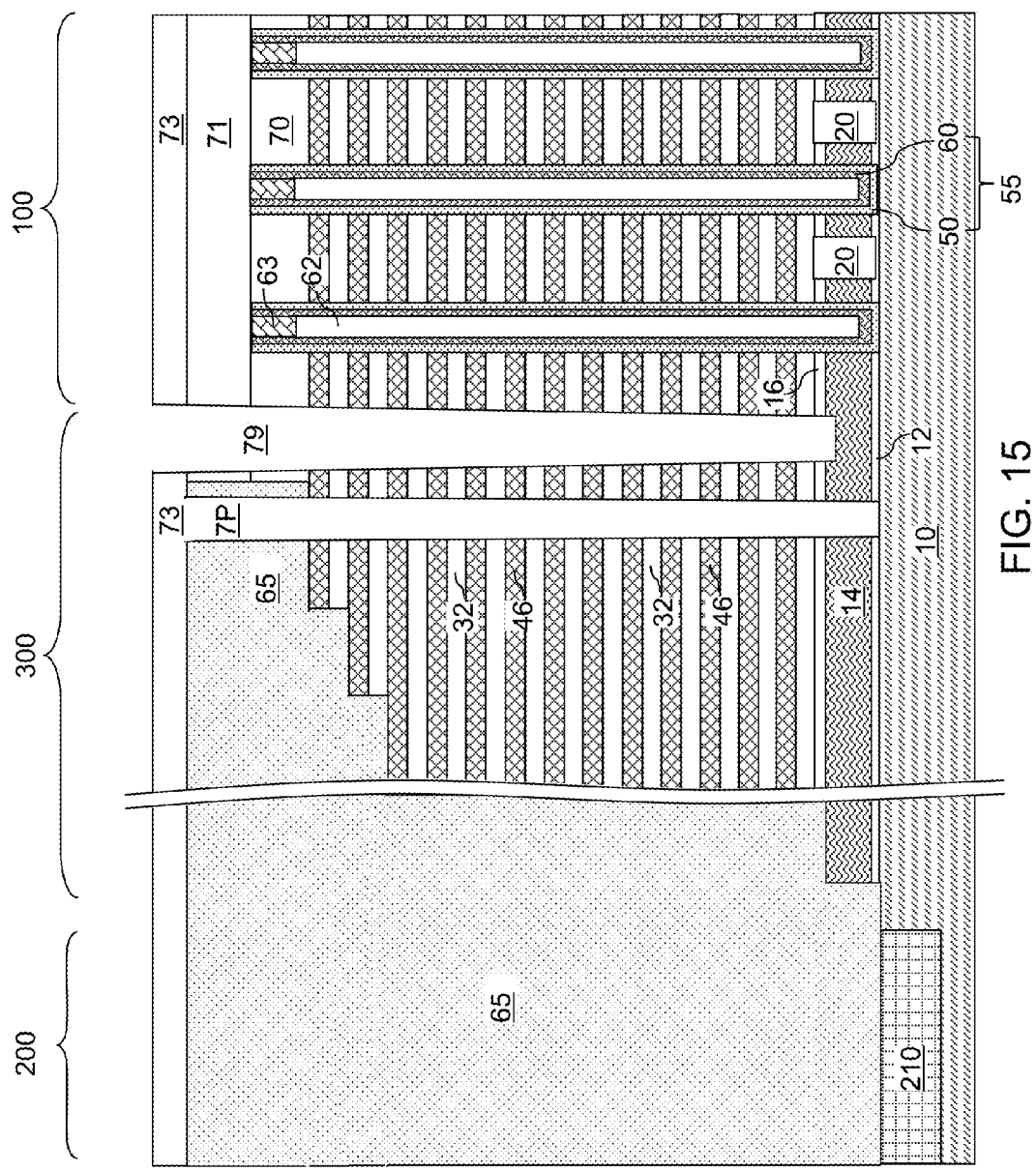
FIG. 15 is a vertical cross-sectional view of the first exemplary structure after replacement of the sacrificial material layers with electrically conductive layers according to the first embodiment of the present disclosure.

Referring to FIG. 15, at least one metallic material can be deposited in the backside recesses to form electrically conductive layers 46. Optionally, a backside blocking dielectric layer (not shown) can be formed on the physically exposed surfaces of the memory stack structures 55 and the insulating layers 32 prior to deposition of the at least one metallic material. In one embodiment, the at least one metallic material can include a conductive metallic compound layer (such as a conductive metal nitride layer including a conductive metal nitride such as TiN, TaN, or WN, or a conductive metal carbide layer including a conductive metal carbide such as TiC, TaC, or WC). The conductive metallic compound layer can include a metallic material that functions as a barrier material layer, i.e., a material layer that functions as a diffusion barrier for impurity atoms or gases, and/or as an adhesion promoter layer, i.e., a material layer that promotes adhesion of subsequent layers to the insulating layers 32 (in case a backside blocking dielectric layer is not employed) or to a backside blocking dielectric layer (in case a backside blocking dielectric layer is employed). The conductive metallic compound layer can be deposited by a conformal deposition process such as chemical vapor deposition (CVD) or atomic layer deposition (ALD). The thickness of the conductive metallic compound layer can be in a range from 1 nm to 6 nm, although lesser and greater thicknesses can also be employed.

In one embodiment, the at least one metallic material can further include a metal layer. The metal layer can include an elemental metal or an intermetallic alloy, which can be deposited in the remaining portions of the backside recesses 43, over the sidewalls of the backside trench 79, and over the top surface of the at least one contact level dielectric layer (71, 73). The metal layer can be deposited as a continuous metal layer directly on the surfaces of the conductive metallic compound layer. The metal layer can be deposited by a conformal deposition method such as chemical vapor deposition (CVD) or atomic layer deposition (ALD). Remaining portions of the backside recesses 43 can be filled with the metal layer. The thickness of the deposited metal, as measured on a sidewall of the backside trench 79, can be greater than one half of the maximum height of the remaining portions of the backside recesses 43 so that the entire volume of each backside recess 43 is filled with the combination of the optional backside blocking dielectric layer, the metallic compound layer, and the metal layer.

The metal layer can include a metal such as W, Co, Al, Cu, Ru, Au, Pt, or a combination thereof. The metal layer can be deposited by a chemical vapor deposition (CVD) process or an atomic layer deposition (ALD) process that employs a metal-containing precursor gas. In one embodiment, the metal-containing precursor gas can be free of fluorine, i.e., does not contain fluorine. Chemical vapor deposition or atomic layer deposition of metal employs a metal precursor that can be easily vaporized to leave high-purity metal on a surface without causing surface damage. In one embodiment, an organometallic compound with relatively high vapor pressures and good thermal stability can be employed as the metal precursor gas to deposit metal without requiring hydrogen.

Vertically-extending portions of the deposited metallic material(s) can cover the entirety of the sidewall of the backside trench 79. As deposited, a vertically-extending portion of the deposited metallic material(s) can be continuously adjoined to metal portions located within each vertically neighboring pair of backside recesses 43, and can be adjoined to a horizontal portion of the metal layer that overlies the at least one contact level dielectric layer (71, 73).

An etch process can be performed to remove the at least one metallic material from above the at least one contact level dielectric layer (71, 73) and from the sidewalls of the backside trenches 79. The etch process can include an isotropic etch step, an anisotropic etch step, or a combination thereof. In an illustrative example, a reactive ion etch employing at least one halide-containing gas such as $CHF_3$, $CClF_3$, $CF_4$, $SF_6$, $SiF_4$, $Cl_2$, $NF_3$ can be employed for the etch process. Optionally, oxidants such as $O_2$ or $O_3$ can be employed in combination with the at least one halide-containing gas. The electrically conductive layers 46 remain around each backside trench 79 as discrete layers that are electrically isolated from one another.

Figure 16:
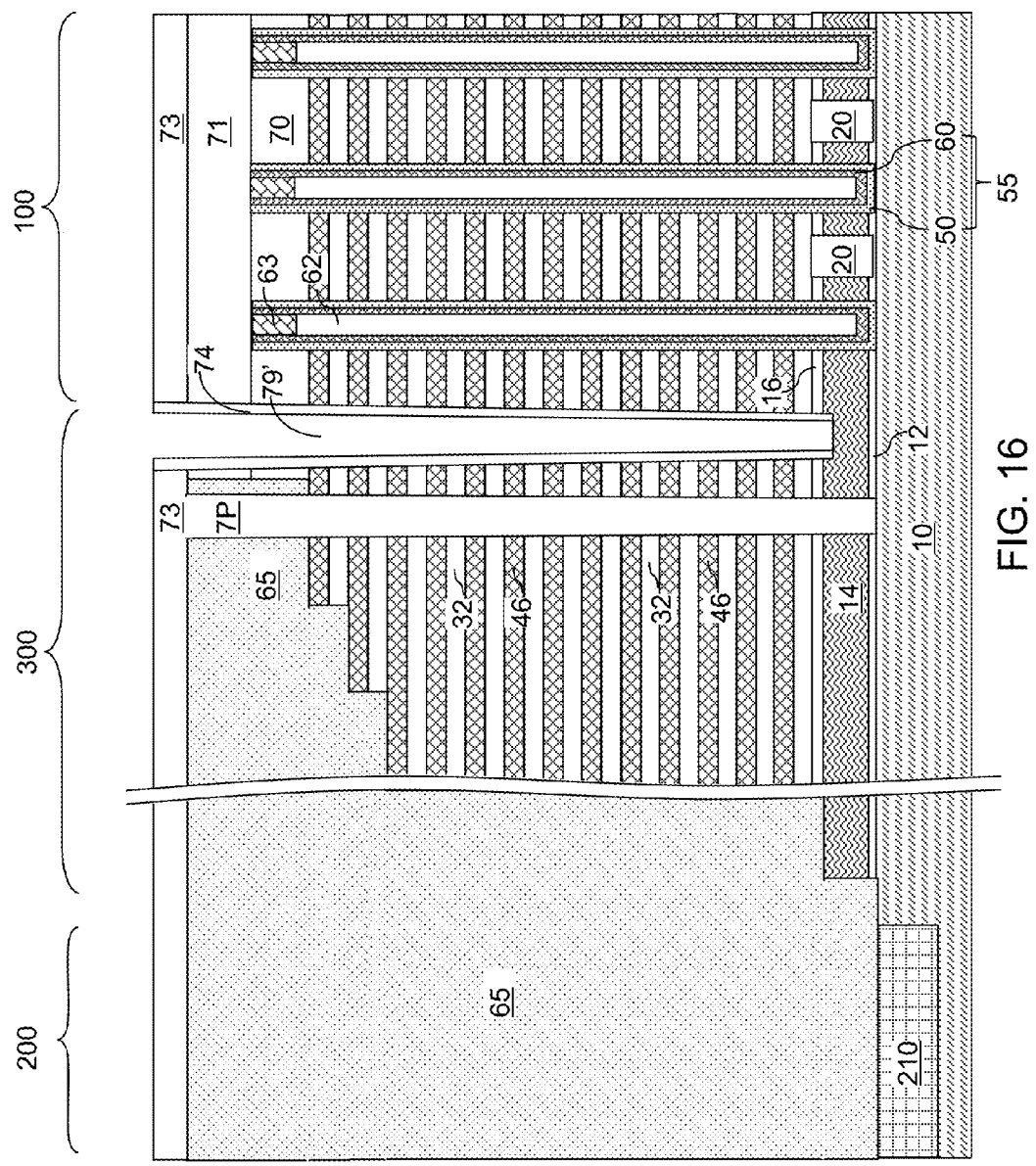
FIG. 16 is a vertical cross-sectional view of the first exemplary structure after formation of an insulating spacer according to the first embodiment of the present disclosure.

Referring to FIG. 16, an insulating spacer 74 can be formed on the sidewalls of each backside trench 79 by deposition of a continuous dielectric material layer and an anisotropic etch that removes horizontal portions of the continuous dielectric material layer. Each insulating spacer 74 includes a dielectric material, which can comprise, for example, silicon oxide, silicon nitride, a dielectric metal oxide, a dielectric metal oxynitride, or a combination thereof. The thickness of each insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

Figure 17:
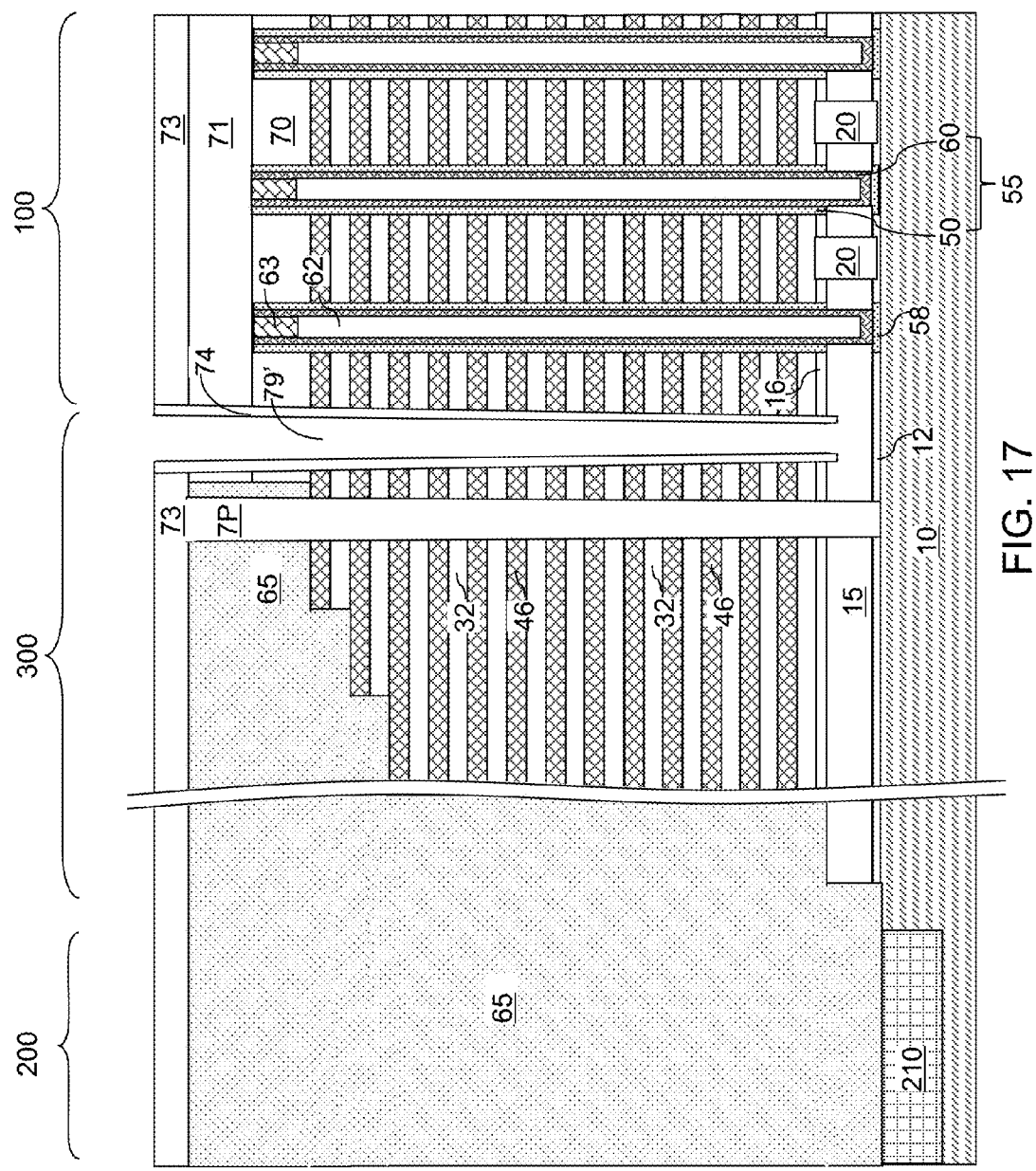
FIG. 17 is a vertical cross-sectional view of the first exemplary structure after formation of a source line cavity by removing the sacrificial matrix layer according to the first embodiment of the present disclosure.

Each insulating spacer 74 has an outer sidewall that contacts the sidewalls of the insulating layers 32 and the electrically conductive layers 46, and the sidewalls of the upper source insulating layer 16. Further, each insulating spacer 74 can contact a surface of the sacrificial matrix layer 14. Thus, each insulating spacer 74 can be formed at a periphery of a respective backside trench 79 and over a portion of the sacrificial matrix layer 14 and on sidewalls of the upper source insulator layer 16, Referring to FIG. 17, the sacrificial matrix layer 14 can be removed selective to the array of dielectric pillars 20, the lower source insulating layer 12, the upper source insulating layer 16, the through-stack dielectric pillar structures 7P, and the insulating spacers 74 to form a source line cavity 15. The sacrificial matrix layer 14 is preferably removed after formation of the electrically conductive layers 46. In one embodiment, the array of dielectric pillars 20, the lower source insulating layer 12, the upper source insulating layer 16, the through-stack dielectric pillar structures 7P, and the insulating spacers 74 can include various types of silicon oxide, and the sacrificial matrix layer 14 can include a semiconductor material (such as amorphous silicon, polysilicon or a silicon-germanium alloy), amorphous carbon, or an organic or inorganic polymer. For example, if the sacrificial matrix layer 14 includes polysilicon, a wet etch employing potassium hydroxide (KOH) may be employed to remove the sacrificial material layer 14 selective to the array of dielectric pillars 20, the lower source insulating layer 12, the upper source insulating layer 16, the through-stack dielectric pillar structures 7P, and the insulating spacers 74. Sidewalls of the memory stack structures 55 can be physically exposed to the source line cavity 15. Further, the sidewalls of the dielectric pillars 20 can be physically exposed to the source line cavity 15.

A physically exposed portion of each memory film 50 can be removed after removal of the sacrificial matrix layer 14. The physically exposed portions of the memory films 50 can be removed, for example, by an isotropic etch such as a wet etch. Thus, sidewalls of the semiconductor channels 60 become physically exposed at the level of the source line cavity 15. A remaining portion of each memory film 50 that underlies a physically exposed sidewall of a respective semiconductor channel 60 constitutes a dielectric cap plate 58, which underlies the semiconductor channel 60 and comprises a same set of dielectric materials as the remaining portion of the memory film 50 located above the source line cavity 15. Optionally, an annular source region 61 may be formed by introducing electrical dopants to a lower portion of each semiconductor channel 60 by plasma doping or gas phase doping.

In general, a polycrystalline silicon structure (embodied as a source region 61) can be provided at a lower end of each semiconductor channel 60 by deposition of a polysilicon material portion on the annular exposed portion of each semiconductor channel 60 and/or doping of an annular exposed portion of each semiconductor channel 60 located at the level of the source line cavity 15. Three types of polysilicon (including p+ type polysilicon, undoped polysilicon, and n+ type polysilicon) can be selected for the polycrystalline silicon structure, which can function as a polysilicon source region 61. Table 1 provides a summary of erase and read mechanisms for each type of polysilicon that is employed for a source region 61.

TABLE 1

Comparison of various types of source region

| Type of source polysilicon | Erase mechanism | Charge carrier for read operation |
| --- | --- | --- |
| N+ polysilicon | Gate-induced drain leakage (GIDL) erase only (both source and drain) | electrons |
| Undoped polysilicon | Gate-induced drain leakage (GIDL) erase only (both source and drain) | electrons |
| P+ polysilicon | Coupling erase (and partially GIDL erase) | holes |

The p+ polysilicon source region can employ coupling erase while other types of source regions can employ GIDL erase. The benefits of embodiments of the present disclosure include, but are not limited to, prevention of stack collapse employing a marginal device area increase (due to formation of the dielectric pillars 20). Removal of the sacrificial matrix layer 14 does not require use of a reactive ion etch, but an isotropic etch process may be employed to remove the sacrificial matrix layer 14.

Figure 18:
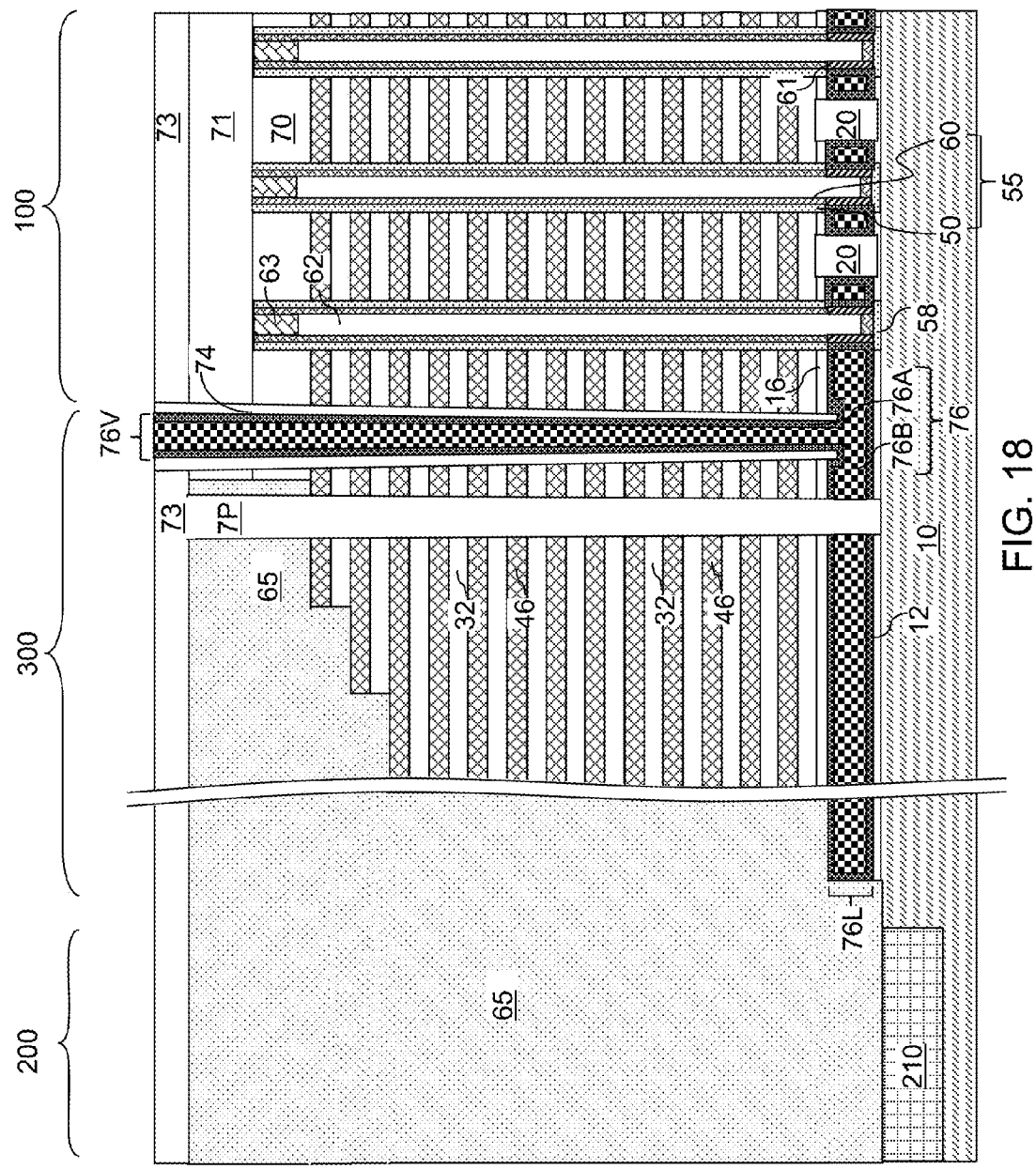
FIG. 18 is a vertical cross-sectional view of the first exemplary structure after formation of a continuous source structure according to the first embodiment of the present disclosure.

Referring to FIG. 18, at least one conductive material is deposited to form the source line cavity 15 by at least one conformal deposition method such as chemical vapor deposition (CVD), atomic layer deposition (ALD), electroplating, and/or electroless plating. In one embodiment, the at least one conductive material can include a metallic liner material such as a conductive metallic nitride or a conductive metallic carbide, and a metallic fill material such as W, Cu, Al, Co, Ru, and alloys thereof. For example, a metallic liner material layer 76A including the metallic liner material and a metallic fill material layer 76B including the metallic fill material can be deposited to fill the source line trench 15 and the backside trench 79 during a same set of deposition processes. Portions of the at least one conductive material above the horizontal plane including the top surface of the at least one contact level dielectric layer (71, 73) can be removed by a planarization process. In one embodiment, the planarization process can be a chemical mechanical planarization (CMP) process that employs one of the at least one contact level dielectric layer (71, 73) as a stopping layer. A continuous source structure 76 can be formed within each continuous volume of a source line trench 15 and at least one backside trench 79 connected to the source line trench 15. In one embodiment, a source line trench 15 can be connected to a plurality of backside trenches 79, and the continuous source structure 76 can fill the entirety of the continuous volume including the source line trench 15 and the plurality of backside trenches 79. The continuous source structures 76 can function as a source contact structure, or a combination of a source structure and a source contact structure.

The portion of each continuous source structure 76 that fills a source line cavity 15 is herein referred to as a source conductive layer 76L. Thus, the source matrix layer 14 is replaced with the source conductive layer 76L which extends in a horizontal direction parallel to the top surface of the substrate (i.e., the substrate semiconductor layer 10). The source conductive layer 76L can contact sidewalls of each dielectric pillar 20 in the array of dielectric pillars 20. Each portion of the continuous source structure 76 that fills a backside trench 79 constitutes a source conductive via structure 76V. Each source conductive via structure 76L extends vertically through the alternating stack (32, 46) perpendicular to the top surface of the substrate 10. The continuous source structure 76 is an integral structure without an interface between any of the source conductive via structures 76V and the source conductive layer 76L. As used herein, an "integral structure" refers to a single continuous structure that is not divided into multiple physically disjoined portions. As used herein, an "interface" refers to a microscopic interface between two elements that is characterized by differences in material composition, presence of a void, or presence of an interfacial material that can be detected by analytic means (such as transmission electron microscopy, scanning electron microscopy, and/or secondary ion mass spectroscopy).

Thus, the continuous source structure 76 can be formed by simultaneously filling the source line cavity 15 and the at least one backside trench 79 with at least one conductive material. Each source conductive via structure 76V is formed on an inner sidewall of a respective insulating spacer 74. The source line structure 76L can be formed directly on the source region 61 which comprises a deposited polysilicon layer on or a doped region in the exposed sidewall of each semiconductor channel 60.

Figure 19:
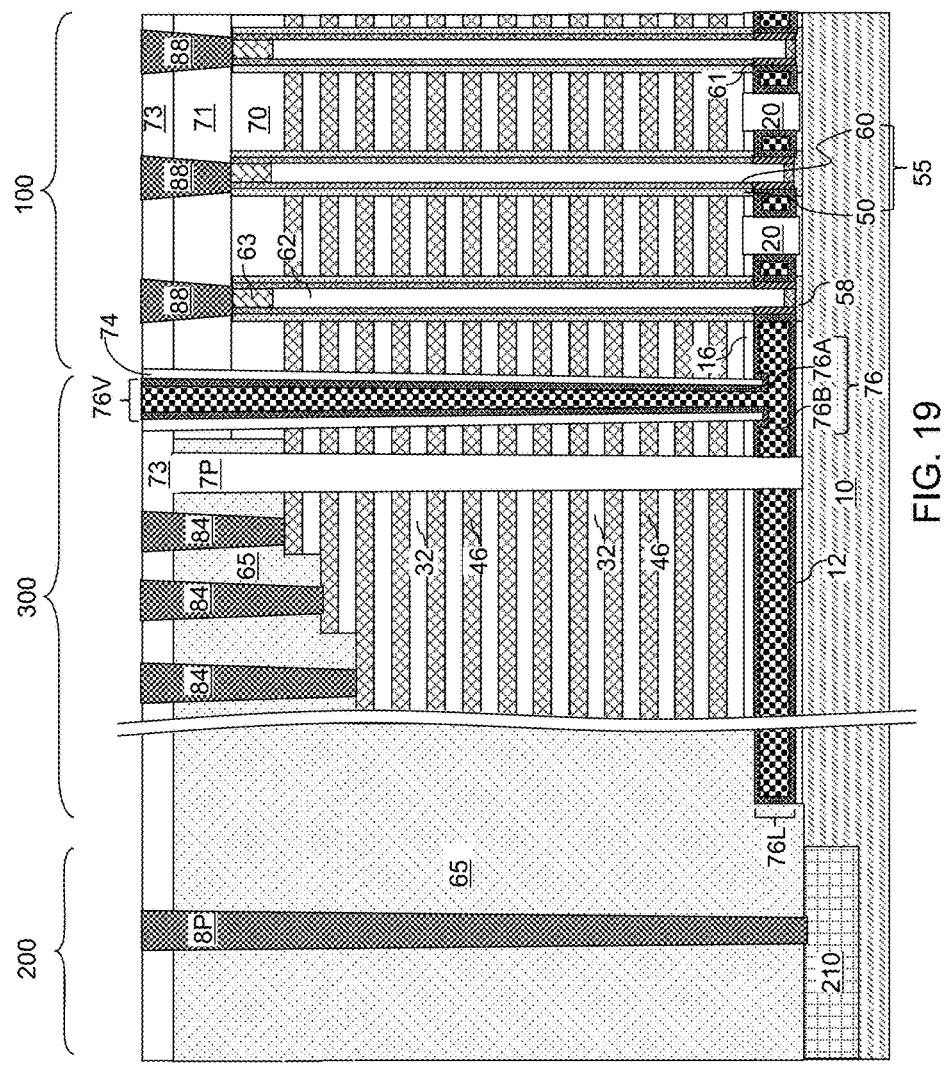
FIG. 19 is a vertical cross-sectional view of the first exemplary structure after formation of various contact via structures according to the first embodiment of the present disclosure.

Referring to FIG. 19, a photoresist layer (not shown) can be applied over the topmost layer of the first exemplary structure (which can be, for example, the second insulating cap layer 73), and can be lithographically patterned to form various openings in the memory array region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the memory array region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region 200.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. Additional metal interconnect structures (not shown) and interlayer dielectric material layers (not) shown can be formed over the first exemplary structure to provide electrical wiring among the various contact via structures.

The first exemplary structure according to embodiments of the present disclosure can include a three-dimensional memory device. The three-dimensional memory device comprises an alternating stack of electrically conductive layers 46 and insulating layers 32 located over a substrate 10, and an array of memory stack structures 55. Each memory stack structure 55 extends through the alternating stack (32, 46), and includes a memory film 50 and a semiconductor channel 60 laterally surrounded by the memory film 50. The three-dimensional memory device can further include an array of dielectric pillars 20 located between the alternating stack (32, 46) and the substrate 10. A continuous source structure 76 can be provided, which includes a source conductive layer 76L that extends horizontally and laterally surrounds each dielectric pillar 20 in the array of dielectric pillars 20. The continuous source structure 76 can further include a source conductive via structure 76V that extends vertically through the alternating stack (32, 46). The continuous source structure 76 can be an integral structure without an interface between the source conductive via structure 76V and the source conductive layer 76L. The source conductive layer 76L may comprise a buried source line or electrode, while the source conductive via structure 76V may comprise a source local interconnect.

The three-dimensional memory device can include a lower source insulator layer 12 located between the substrate 10 and the source conductive layer 76L, an upper source insulator layer 16 located between the source conductive layer 76L and the alternating stack (32, 46), and an insulating spacer 74 laterally surrounding the source conductive via structure 76V. In one embodiment, the continuous source structure 76 can comprise a metallic dielectric liner 76A contacting sidewalls of the array of dielectric pillars 20 and extending above a topmost surface of the alternating stack (32, 46), and a conductive fill material portion 76B surrounded by the metallic dielectric liner 76A.

A stepped surface region can be provided in the contact region 300. End portions of the electrically conductive layers 46 form stepped surfaces in the stepped surface region. The source conductive layer 76L can laterally extend farther than any of the electrically conductive layers 46. In one embodiment, the continuous source structure 76 can contact at least one of outer sidewall of each source region 61 and an annular bottom surface of the memory film 50.

In one embodiment, each dielectric pillar 20 in the array of dielectric pillars 20 can have a topmost surface located at, or underneath, a first horizontal plane including a bottommost surface of the alternating attack (32, 46), and can have a bottommost surface located at, or above, a second horizontal plane including a top surface of the substrate 10. In one embodiment, the array of dielectric pillars 20 can comprise silicon oxide. The dielectric pillars 20 which terminate below the alternating stack (32, 46) are different from the through-stack dielectric support pillars 7P which extend through the entire alternating stack (32, 46).

In one embodiment, the monolithic three-dimensional memory device comprises a vertical NAND device located over the substrate, and the electrically conductive layers 46 comprise, or are electrically connected to, a respective word line of the NAND device. In one embodiment, the substrate 10 comprises a silicon substrate, the vertical NAND device comprises an array of monolithic three-dimensional NAND strings located over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon.

The array of monolithic three-dimensional NAND strings can comprise a plurality of semiconductor channels 60. At least one end portion of each of the plurality of semiconductor channels 60 extends substantially perpendicular to a top surface of the substrate. The array of monolithic three-dimensional NAND strings can comprise a plurality of charge storage elements. Each charge storage element can be located adjacent to a respective one of the plurality of semiconductor channels 60. The array of monolithic three-dimensional NAND strings can comprise a plurality of control gate electrodes having a strip shape extending substantially parallel to the top surface of the substrate. The plurality of control gate electrodes comprises at least a first control gate electrode located in the first device level and a second control gate electrode located in the second device level.

Figure 20:
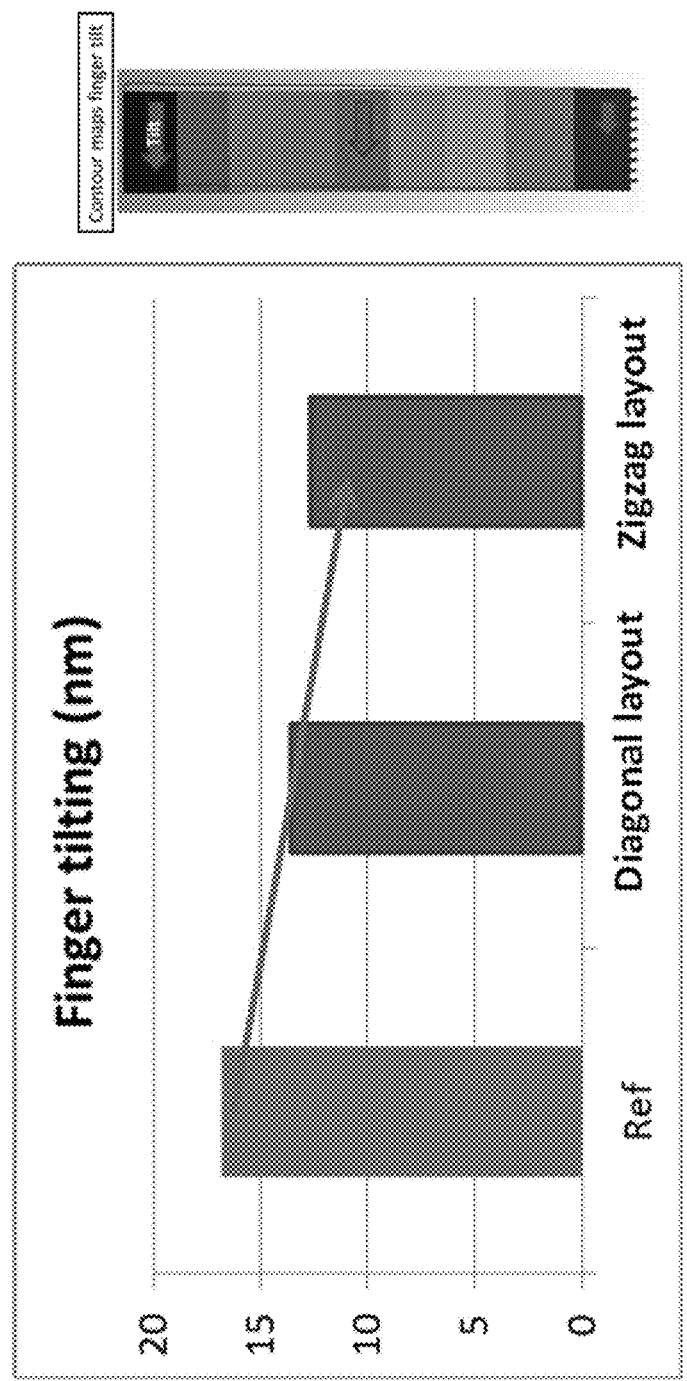
FIG. 20 is a graph illustrating magnitude of stress on memory stack structures for various configurations of dielectric pillars according to embodiments of the present disclosure.

Referring to FIG. 20, a graph illustrating magnitude of stress on memory stack structures 55 for various configurations of dielectric pillars according to embodiments of the present disclosure. The unit of the vertical axis (for the magnitude of stress) is arbitrary. The case labeled "Ref" refers to a configuration in which the array of dielectric pillars 20 is not present. The case labeled "Diagonal layout" refers to the third configuration for the array of dielectric pillars 20. The case labeled "Zigzag layout" refers to the first configuration for the array of dietetic pillars 20.

The array of dielectric pillars 20 reduces mechanical stress to provide stable structures during the manufacturing process. The simulation data of FIG. 20 was obtained with the assumption of 100 layers within the alternating stack (32, 46) employing a linear repeating boundary condition. Based on a computer simulation of finger tilting and stresses on the dielectric pillars 20 under imbalanced capillary force, the amplitude of finger tilting, or the risk of finger collapse, can be reduced by 25% with the zigzag layout.

The first exemplary structure of the present disclosure employs the continuous source structure 76 as a bottom connection for the semiconductor channels 60 in the memory openings 49. The array of dielectric pillars 20 provides structural protection against mechanical stress on the memory stack structures 55 during formation of the source conductive layer 76L.

The array of dielectric pillars 20 can be employed to prevent collapse of the source line cavity 15, and to enable formation of the continuous source structure 76 that includes the source conductive layer 76L. While the presence of the dielectric pillars 20 may adversely affect the source-side contact resistance, the degradation of the source-side contact resistance is manageable at the densities illustrated in FIGS. 13A-13C.

The dielectric pillars 20 are support pedestal structures consisting essentially of a dielectric material. The source conductive layer 76L underlies the alternating stack (32, 46) and overlies the substrate including the substrate semiconductor layer 10. The source conductive layer 76L is electrically shorted to a bottom end of each of the semiconductor channels 60. As support pedestal structures, the dielectric pillars 20 are in contact with the source conductive layer 76L, and are located under the alternating stack (32, 46).

According to another aspect of the present disclosure, an embodiment is disclosed in which the support pedestal structures can be provided as a semiconductor material or a dielectric material. For example, the support pedestal structures can be provided as doped semiconductor material portions. In one embodiment, the support pedestal structures can be formed as rail structures. As used herein, a rail structure refers to a structure laterally extending a long a horizontal direction and having a uniform height.

Figure 21:
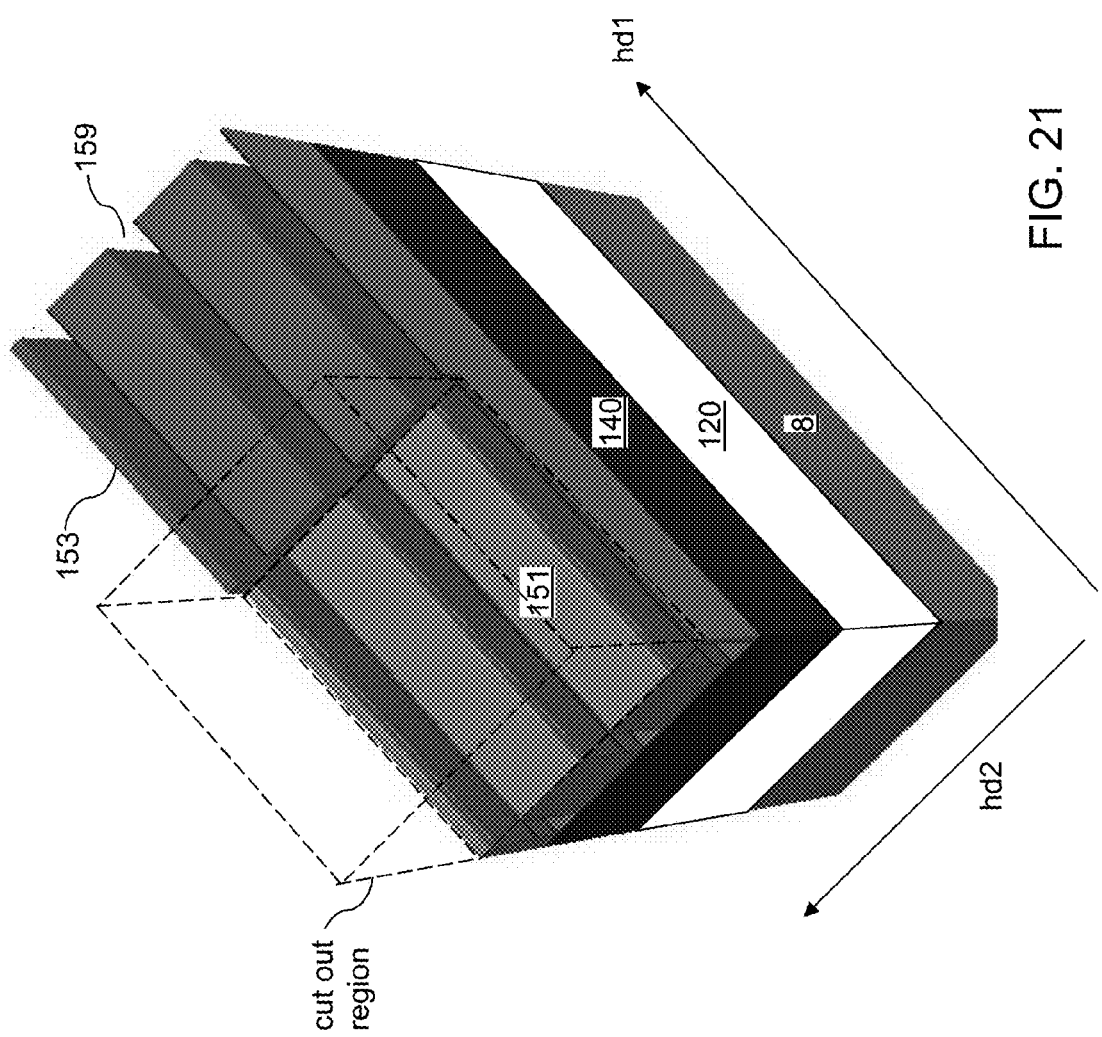
FIG. 21 is a perspective view of a second exemplary structure with a cut-out region for illustrative purposes after formation of a source conductive layer, sacrificial material portions, and an optional dielectric liner according to a second embodiment of the present disclosure.

Referring to FIG. 21, a second exemplary structure according to a second embodiment of the present disclosure is illustrated. The second exemplary structure includes a substrate 8, which can be a semiconductor substrate, a conductive substrate, or an insulator substrate. The substrate 8 can have a thickness that is sufficient to provide structural support for elements formed thereupon. In one embodiment, the thickness of the substrate 8 can be in a range from 50 microns to 1 mm, although lesser and greater thicknesses can also be employed. In one embodiment, the substrate 8 can be a semiconductor substrate such as a single crystalline substrate or a polycrystalline substrate. Semiconductor devices (such as the peripheral devices 210 described above) can be formed in a peripheral device region (not shown) of the substrate 8 prior to, or after, formation of memory devices to be described below. Such semiconductor devices can include peripheral devices that can be employed to support operation of memory devices to be subsequently formed over the substrate 8.

An insulator layer 120 can be formed over the substrate 8. The insulator layer 120 includes a dielectric material such as silicon oxide. The thickness of the insulator layer 120 can be in a range from 10 nm to 300 nm, although lesser and greater thicknesses can also be employed.

A source conductive layer 140 (e.g., source line or source electrode) can be formed over the insulator layer 120. The source conductive layer 140 includes a conductive material, which may include a metallic material, a heavily doped semiconductor material, a metal-semiconductor alloy (such as a metal silicide), or a combination thereof. In one embodiment, the source conductive layer 140 can include a tungsten silicide layer or a vertical stack, from bottom to top, of a conductive metallic nitride layer (such as a TiN layer) and a metal layer (such as a tungsten layer). The source conductive layer 140 can be formed by a conformal or a non-conformal deposition, and can be formed as a planar material layer having a uniform thickness throughout.

Sacrificial material portions 151 can be formed as rail structures that extend along a first horizontal direction hd1 (e.g., word line direction) and laterally spaced from one another along a second horizontal direction hd2 (e.g. bit line direction). The sacrificial material portions 151 can be formed by depositing a sacrificial material layer as a planar material layer, applying and patterning a photoresist layer thereupon, and transferring the pattern of the photoresist layer through the planar material layer by an anisotropic etch process (such as a reactive ion etch process). The source conductive layer 140 can function as a stopping layer for the anisotropic etch process. Each remaining portion of the sacrificial material layer constitutes a sacrificial material portion 151. The photoresist layer can be subsequently removed, for example, by ashing.

In one embodiment, the width of each sacrificial material portion 151 can be selected to be on the order of a center-to-center distance between a neighboring pair of rows of memory openings to be subsequently formed along the first horizontal direction hd1. In one embodiment, the spacing between each neighboring pair of sacrificial material portions 151 can be on the order of the center-to-center distance between a neighboring pair of rows of memory openings to be subsequently formed along the first horizontal direction hd1. In one embodiment, the sacrificial material portions 151 can form a one-dimensional periodic array along the second horizontal direction hd2, and the periodicity of the one-dimensional array (i.e., the sum of the width of a sacrificial material portion 151 and the spacing between a neighboring pair of sacrificial material portions 151) can be equal to twice the inter-row distance between memory openings to be subsequently formed.

The sacrificial material portions 151 can include a semiconductor material or a dielectric material. In one embodiment, the sacrificial material layer and the sacrificial material portions 151 formed therefrom includes a semiconductor material that is not intentionally doped. A semiconductor material that is not intentionally doped may be intrinsic, or may have a low concentration of electrical dopants due to incorporation of dopants at a trace level during deposition. As used herein, an "undoped semiconductor material" collectively refers to an intrinsic semiconductor material and a semiconductor material including electrical dopants at an atomic concentration less than $1.0 \times 10^{16}/cm^3$. The undoped semiconductor material can be formed by not intentionally incorporating electrical dopants during deposition of a semiconductor material.

In one embodiment, the undoped semiconductor material can be a material that can be removed selective to a heavily doped semiconductor material, i.e., a doped semiconductor material having electrical conductivity greater than $1.0 \times 10^5$ S/cm (e.g., having a dopant concentration of greater than $1.0 \times 10^{19}/cm^3$). In one embodiment, the undoped semiconductor material of the sacrificial material portions 151 can include amorphous silicon, polycrystalline or amorphous germanium, an amorphous silicon-germanium alloy, or a polycrystalline silicon-germanium alloy including germanium at an atomic concentration greater than 40%.

In another embodiment, the sacrificial material layer and the sacrificial material portions 151 can include a dielectric material. In this case, the dielectric material of the sacrificial material portions 151 can be selected among materials that can be removed selective to the materials of support pillar structures to be subsequently formed and selective to an alternating stack to be subsequently formed. For example, the sacrificial material portions 151 can include a dielectric material such as porous or non-porous organosilicate glass (OSG), amorphous carbon, or diamond-like carbon (DLC).

A dielectric liner 153 can be optionally formed as a conformal material layer over the top surfaces and sidewalls of the sacrificial material portions 151 and on the physically exposed surfaces of the source conductive layer 140. The dielectric liner 153 can include a diffusion barrier material such as silicon nitride. The thickness of the optional dielectric liner 153 can be in a range from 3 nm to 10 nm, although lesser and greater thicknesses can also be employed. Top portions of the dielectric liner 153 are not shown in the cut-out region of FIG. 21, which is a region from which all elements are removed in the drawing for the purpose of more clearly illustrating underlying elements underneath the bottom horizontal plane of the cut-out region. A linear trench 159 is present between each neighboring pair of sacrificial material portions 151.

Figure 22:
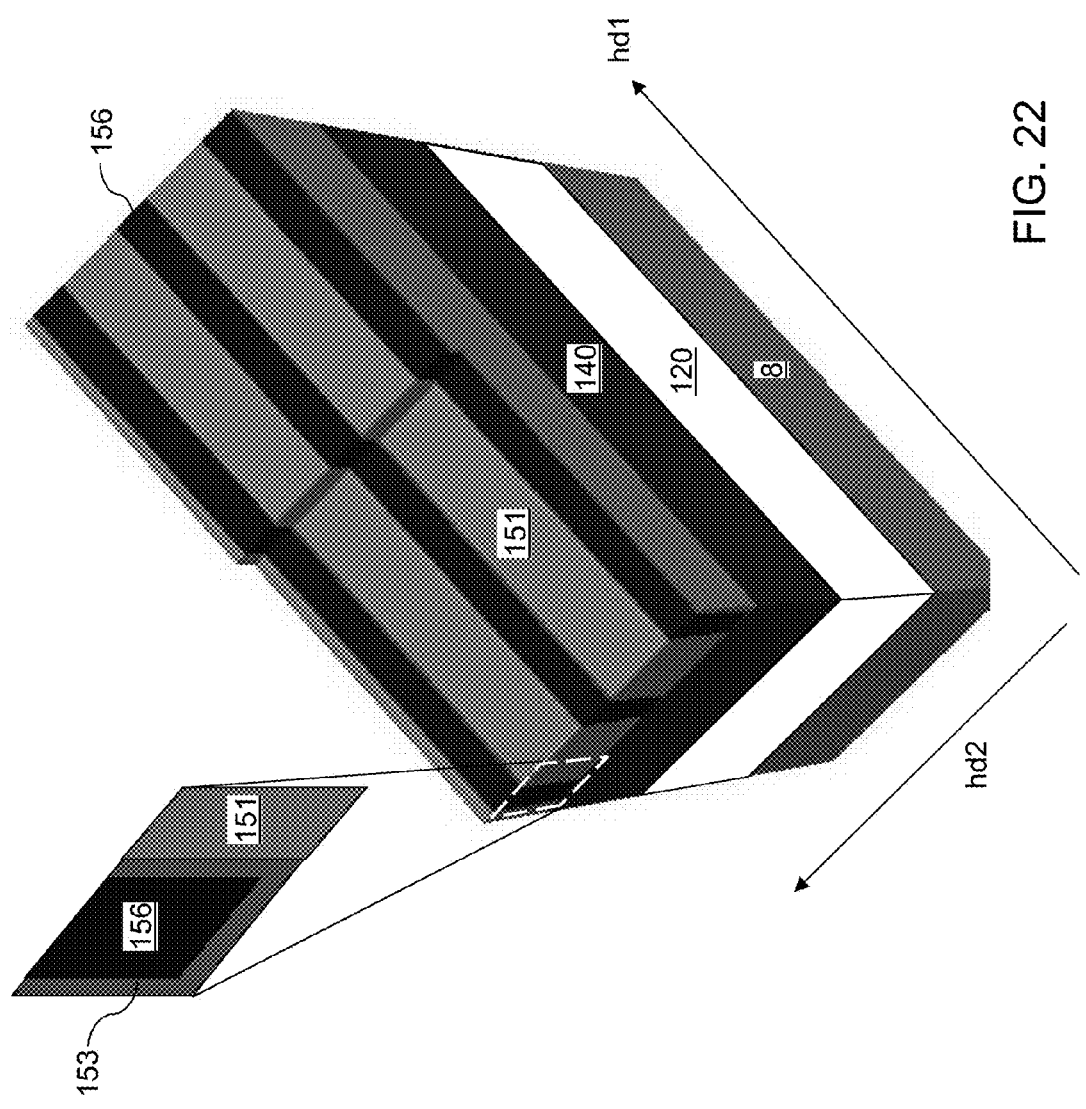
FIG. 22 is a perspective view of the second exemplary structure with a cut-out region after formation of support pedestal structures according to the second embodiment of the present disclosure.

Referring to FIG. 22, support pedestal structures 156 are formed in the line trenches 159. A semiconductor material or a dielectric material can be deposited into the line trenches 159. An exemplary semiconductor material that can be employed for the support pedestal structures 156 include boron-doped silicon (e.g., amorphous silicon or polysilicon) including boron at an atomic concentration greater than $1.0 \times 10^{19}/cm^3$, and preferably greater than $1.0 \times 10^{20}/cm^3$ (e.g., $5 \times 10^{19}/cm^3$ to $5 \times 10^{21}/cm^3$). In this case, the boron-doped silicon of the support pedestal structures 156 can be employed in combination with sacrificial material portions 151 including undoped amorphous silicon to enable removal of the sacrificial material portions 151 selective to the support pedestal structures 156 in an etchant such as trimethyl-2 hydroxyethyl ammonium hydroxide (TMY).

Exemplary insulator materials that can be employed for the support pedestal structures 156 include undoped silicate glass (i.e., silicon oxide), doped silicate glass, silicon nitride, and dielectric metal oxide. In this case, the support pedestal structures 156 can be rail structures including the dielectric material, and the sacrificial material portions 151 include materials (such as organosilicate glass, amorphous carbon, or diamond-like carbon) that can be removed selective to the support pedestal structures 156.

Excess portions of the deposited material can be removed from above a horizontal plane including the top surface of the sacrificial material portions 151 by a planarization process. The planarization process can include a recess etch process and/or chemical mechanical planarization. Each remaining portion of the deposited material in the line trenches 159 constitutes a support pedestal structure 156. Each support pedestal structure 156 can be a rail structure laterally extending along the first horizontal direction. In one embodiment, horizontal portions of the dielectric liner 153 can be removed from above the top surfaces of the sacrificial material portions 151 by the planarization process. In this case, the top surfaces of the sacrificial material portions 151 can be coplanar with (i.e., within the same plane as) the top surfaces of the support pedestal structures 156. If a dielectric liner 153 is formed at a processing step of FIG. 21, a U-shaped portion of the dielectric liner 153 may be present between each support pedestal structure 156 and the source conductive layer 140.

A layer (151, 153, 156) containing the support pedestal structures 156 and the sacrificial material portions 151 are formed on the source conductive layer 140. In one embodiment, the support pedestal structures 156 can include a first semiconductor material having a doping of a first conductivity type (which can be p-type or n-type), and the sacrificial material portions 152 can comprise an undoped semiconductor material (such as amorphous undoped silicon). In an illustrative example, the first semiconductor material can comprise p-doped silicon-containing material, and undoped semiconductor material can comprise undoped silicon-containing material.

Figure 23:
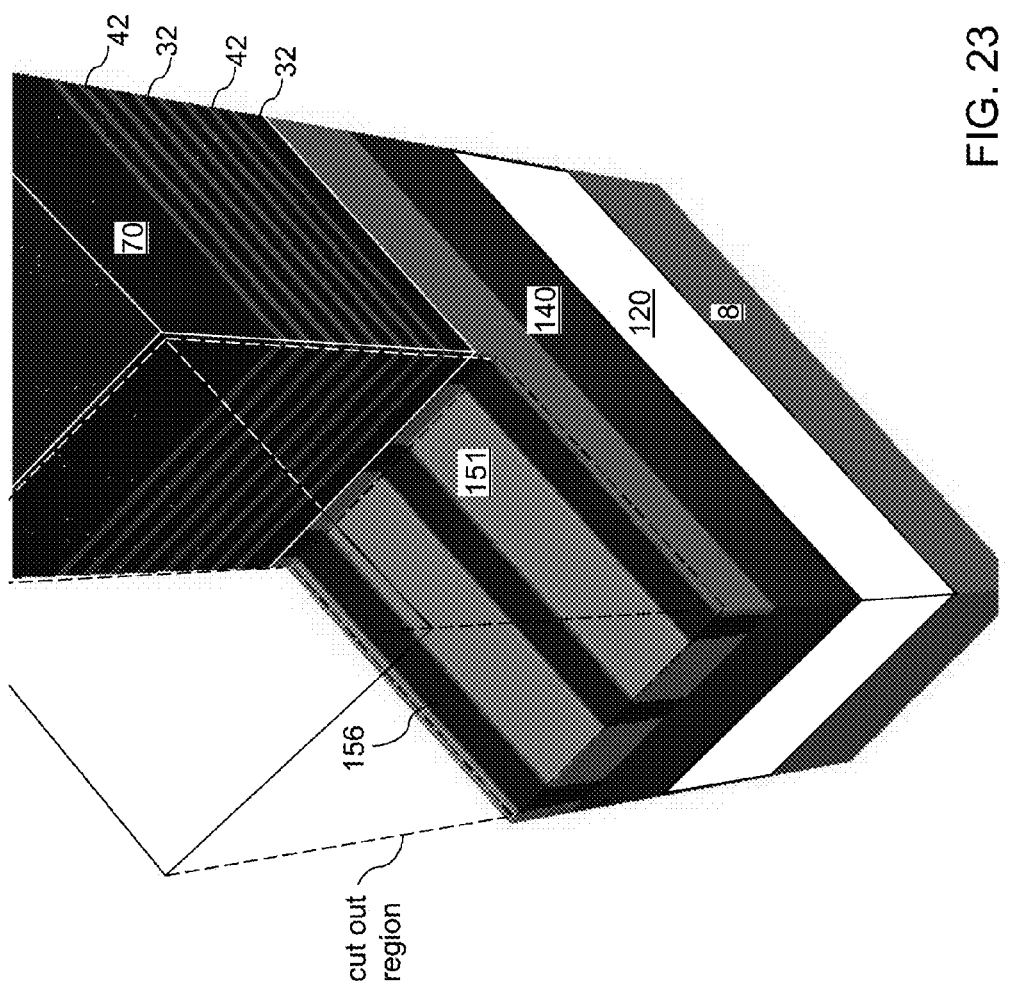
FIG. 23 is a perspective view of the second exemplary structure with a cut-out region after formation of an alternating stack of insulating layers and spacer material layers according to the second embodiment of the present disclosure.

Referring to FIG. 23, an alternating stack of first material layers and second material layers is formed over the top surfaces of the support pedestal structures 156 and the sacrificial material portion 151. As used herein, a "material layer" refers to a layer including a material throughout the entirety thereof. As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a spacer material layer that provides vertical spacing between each vertically neighboring pair of insulating layers 32. In one embodiment, the spacer material layers can be formed as electrically conductive layers.

In another embodiment, the spacer material layers can be formed as sacrificial material layers 42. In this case, the stack can include an alternating plurality of insulating layers 32 and sacrificial material layers 42, and constitutes a prototype stack of alternating layers comprising insulating layers 32 and sacrificial material layers 42, as in the first embodiment. As used herein, a "prototype" structure or an "in-process" structure refers to a transient structure that is subsequently modified in the shape or composition of at least one component therein.

In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate 8.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the second material layers are formed as sacrificial material layers, it is understood that the second material layers can be formed as electrically conductive layers. In this case, the processing steps employed to replace the sacrificial material layers with electrically conductive layers can be omitted.

The upper end of the alternating stack (32, 42) can terminate with an instance of an insulating layer 32. Alternatively, the upper end of the alternating stack (32, 42) can terminate with an instance of a sacrificial material layer 42, and an insulating cap layer 70 having a greater thickness can be formed over the alternating stack (32, 42). The insulating cap layer 70 may have the same composition as, and may a greater thickness than, the insulating layers 32. The insulating cap layer 70 can be deposited, for example, by chemical vapor deposition. In one embodiment, the insulating cap layer 70 can be a silicon oxide layer. The alternating stack (32, 42) and the insulating cap layer 70 are not shown in the cut-out region to illustrate elements underlying the horizontal bottom surface of the cut-out region.

Stepped cavities (not shown) and retro-stepped dielectric material portions (not shown) can be formed on the alternating stack (32, 42) employing the same methods as in the first embodiment. Dielectric support pillars can be formed as in the first embodiment.

Figure 24:
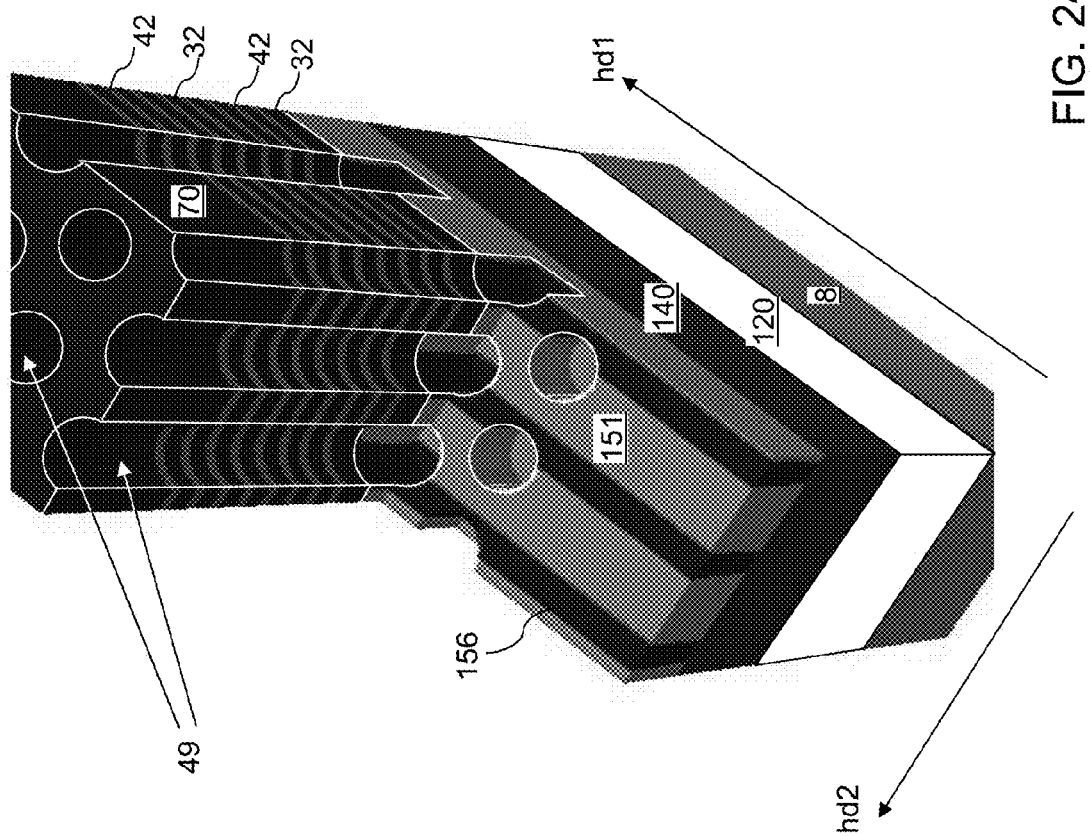
FIG. 24 is a perspective view of the second exemplary structure with a cut-out region after formation of memory openings according to the second embodiment of the present disclosure.

Referring to FIG. 24, a lithographic material layer (not shown) including at least a photoresist layer can be formed over the insulating cap layer 70, and can be lithographically patterned to form openings therein. The pattern in the lithographic material layer can be transferred through the insulating cap layer 70 and through entirety of the alternating stack (32, 42) and into the support pedestal structures 156 and the sacrificial material portion 151 by an anisotropic etch process. The alternating stack (32, 42) and the upper portion of the layer including the support pedestal structures 156 and the sacrificial material portion 151 are removed during the anisotropic etch process in areas that underlie the openings in the patterned lithographic material layer. In one embodiment, the bottom surfaces of the memory openings 49 can be vertically spaced from the top surface of the source conductive layer 140. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

In one embodiment, each of the memory openings 49 can extends through a portion of a respective support pedestal structure 156 and a portion a respective sacrificial material portion 151. In one embodiment, the memory openings 49 can be arranged in rows that extend along the first horizontal direction hd1. The rows of the memory openings 49 can be laterally spaced along the second horizontal direction hd2. The location of each row of memory openings 49 can be selected such that each memory opening 49 within the row straddles a neighboring pair of a support pedestal structure 156 and a sacrificial material portion 151.

The materials of the support pedestal structures 156 and the sacrificial material portions 151 are partially removed during formation of the memory openings 49. In one embodiment, the memory openings 49 can have a generally cylindrical shape having a horizontal cross-sectional shape of a circle, an ellipse, a superellipse, or a closed shape providing concave surfaces toward the geometrical center of the horizontal cross-sectional shape. In this case, concave sidewalls can be formed on the support pedestal structures 156 and additional concave sidewalls can be formed on the sacrificial material portions 151 during formation of the memory openings 49. Each concave sidewall on the support pedestal structures 156 and the sacrificial material portions 151 may be substantially vertical. As used herein, a "dimpled sidewall" refers to a continuous set of sidewalls including planar sidewalls located within a same vertical plane and adjoined by concave sidewalls. Each of the support pedestal structures 156 can comprise a pair of dimpled sidewalls, each including respective planar vertical sidewalls adjoined by respective concave vertical sidewalls. Likewise, each of the sacrificial material portions 151 can comprise a pair of dimpled sidewalls, each including respective planar vertical sidewalls adjoined by respective concave vertical sidewalls.

Each of the memory openings 49 can include a sidewall (or a plurality of sidewalls) that extends substantially perpendicular to the topmost surface of the substrate semiconductor layer 8. The region in which the array of memory openings 49 is formed is herein referred to as a memory array region. Each of the memory openings 49 can have a lateral dimension (such as the diameter or the major axis) in a range from 30 nm to 120 nm, although lesser and greater lateral dimensions can also be employed.

Figure 25:
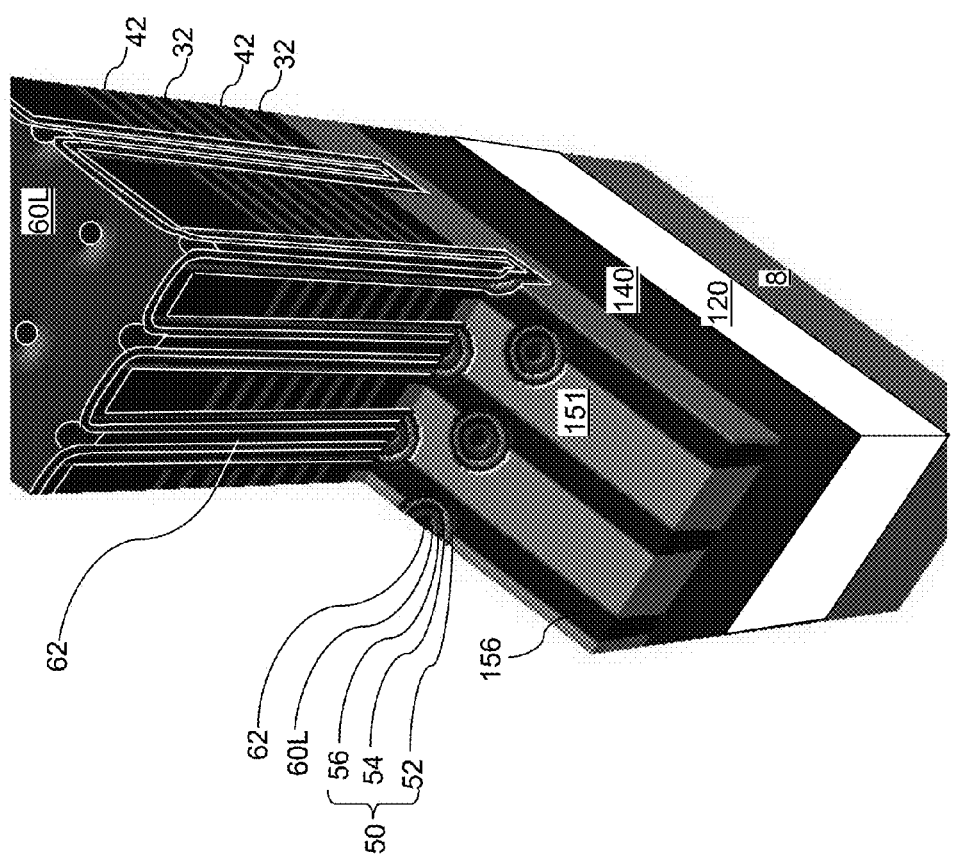
FIG. 25 is a perspective view of the second exemplary structure with a cut-out region after formation of memory stack structures according to the second embodiment of the present disclosure.

Referring to FIG. 25, a memory film 50 can be formed within each memory opening 49 by sequential deposition of a set of component layers. The set of component layers can include, from outside to inside in each memory opening 49 and in the order of sequential deposition, an optional blocking dielectric layer 52, a charge storage element layer 54, and a tunneling dielectric layer 56.

Specifically, the blocking dielectric layer 52 includes at least one dielectric material, which can be silicon oxide, a dielectric metal oxide, or a combination thereof. In one embodiment, the blocking dielectric layer 52 can include a dielectric metal oxide having a dielectric constant greater than 7.9. Additionally or alternatively, the blocking dielectric layer 52 can include silicon oxide, silicon oxynitride, silicon nitride, or a combination thereof. In one embodiment, the blocking dielectric layer 52 can include a stack of aluminum oxide and silicon oxide. The thickness of the blocking dielectric layer 52 can be in a range from 1 nm to 30 nm, although lesser and greater thicknesses can also be employed.

The charge storage element layer 54 can include a single layer of a charge trapping material including a dielectric charge trapping material, which can be, for example, silicon nitride. Alternatively, the charge storage element layer 54 can include a conductive material such as doped polysilicon or a metallic material that is patterned into multiple electrically isolated portions (e.g., floating gates), for example, by being formed within lateral recesses into sacrificial material layers 42.

Alternatively, the charge storage element layer 54 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). In one embodiment, the charge storage element layer 54 includes a silicon nitride layer. Alternatively or additionally, the charge storage element layer 54 may comprise an insulating charge trapping material, such as one or more silicon nitride segments. Alternatively, the charge storage element layer 54 may comprise conductive nanoparticles such as metal nanoparticles, which can be, for example, ruthenium nanoparticles. The charge storage element layer 54 can be formed, for example, by chemical vapor deposition (CVD), atomic layer deposition (ALD), physical vapor deposition (PVD), or any suitable deposition technique for storing electrical charges therein. The thickness of the charge storage element layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The memory film 50 can be formed as a continuous layer stack directly on a sidewall and a recessed horizontal surface of each support pedestal structure 156 and directly on a sidewall and a recessed horizontal surface of each sacrificial material portion 151.

A semiconductor channel layer 60L can be deposited on the memory film 50. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed.

The semiconductor channel layer 60L may be removed from above the alternating stack at this point or at a later point in the process such that a remaining vertical portion of the semiconductor channel layer 60L forms a semiconductor channel 60. Likewise, the layers of the memory film 50 may be removed from the top surface of the memory stack at this point or at a later point in the process. A drain region 63 may be formed at the top of the semiconductor channel 60 at this point or at a later point in the process. A portion of the memory film 50 and a portion of the semiconductor channel layer 60L within a same memory opening 49 constitutes a memory stack structure (50, 60). Each memory stack structure (50, 60) includes a vertical portion of the memory film 50 and a vertical portion of the semiconductor channel layer 60L. A cavity can be present within the volume of each memory opening 49 that is not filled with the deposited material layers (52, 54, 56, 60L).

A dielectric core 62 can be formed within each memory opening 49 by depositing a dielectric material in the cavities within the memory openings 49, removing horizontal portions of the deposited dielectric material from above the alternating stack (32, 42), and vertically recessing the deposited dielectric material. Each remaining portion of the dielectric material constitutes a dielectric core 62.

Figure 26:
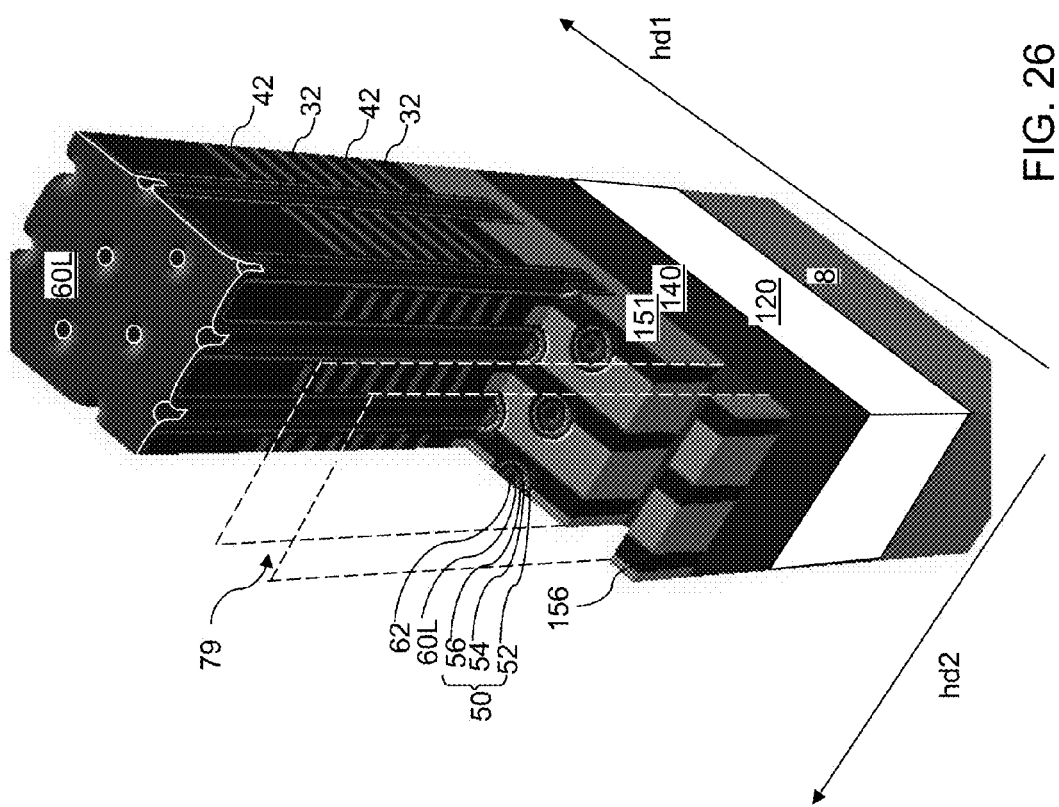
FIG. 26 is a perspective view of the second exemplary structure with a cut-out region after formation of a backside contact trench according to the second embodiment of the present disclosure.

Referring to FIG. 26, a photoresist layer (not shown) can be applied over the insulating cap layer 70 (e.g., on the horizontal portion of the semiconductor channel layer 60L if it is still present over the top of the alternating stack), and is lithographically patterned to form at least one elongated openings extending along a second horizontal direction hd2. The pattern in the photoresist layer can be transferred through horizontal portion of the deposited material layers (52, 54, 56, 60L) (if still present) overlying the alternating stack (32, 42), the insulating cap layer 70, the alternating stack (32, 42), and the layer including the support pedestal structures 156 and sacrificial material portions 151 to form at least one backside contact trench 79. The general pattern of the at least one backside contact trench 79 can be the same as illustrated in FIG. 12B except for the replacement of the dielectric pillars 20 with a combination of the support pedestal structures 156 and sacrificial material portions 151 in the second exemplary structure.

The at least one backside contact trench 79 extend through the alternating stack (32, 42) and into the support pedestal structures 156 and sacrificial material portions 151. The at least one backside contact trench 79 can divide a subset of, or each of, the pre-existing support pedestal structures 156 and sacrificial material portions 151 into multiple portions. Sidewalls of the support pedestal structures 156 and sacrificial material portions 151, as divided by the at least one backside contact trench 79, are physically exposed upon formation of the at least one backside contact trench 79.

Figure 27:
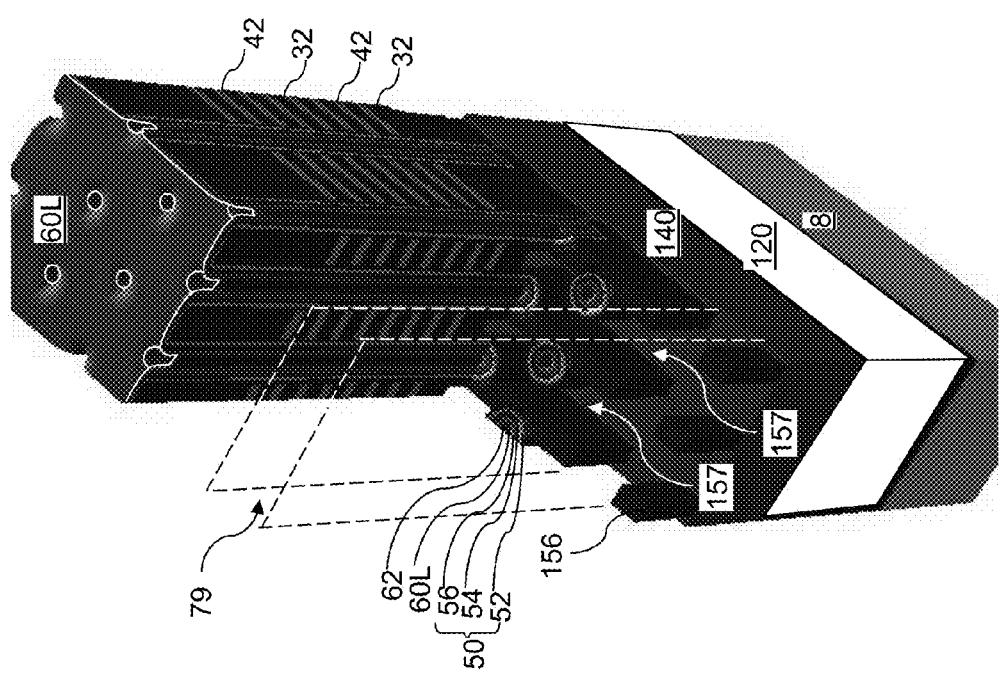
FIG. 27 is a perspective view of the second exemplary structure with a cut-out region after removal of the sacrificial material portions and formation of laterally-extending cavities according to the second embodiment of the present disclosure.

Referring to FIG. 27, laterally-extending cavities 157 are formed by removing the sacrificial material portions 151 without removing the support pedestal structures 156, the alternating stack (32, 42), the source conductive layer 140, and the outermost layer (such as the blocking dielectric layer 52) of the memory film 50. In one embodiment, an etchant can be employed, which etches the material of the sacrificial material portions 151 selective to the materials of the alternating stack (32, 42), and the source conductive layer 140, and the outermost layer of the memory film 50 and selective to at least one of the support pedestal structures 156 and the dielectric liners 153.

In one embodiment, the sacrificial material portions 151 can include an undoped semiconductor material and the support pedestal structures 156 can include heavily doped semiconductor material having greater than $1 \times 10^{19}/cm^3$ dopant concentration. In this case, the sacrificial material portions 151 can be removed without removing the support pedestal structures 156 employing a wet etch process that removes the undoped semiconductor material selective to the doped semiconductor material. In one embodiment, the doped semiconductor material comprises p-doped silicon-containing material such as boron-doped amorphous silicon including boron at an atomic concentration greater than $1.0 \times 10^{19}/cm^3$ (such as greater than $1.0 \times 10^{20}/cm^3$), the undoped semiconductor material comprises undoped silicon-containing material (such as undoped amorphous silicon), and the wet etch process employs a solution including trimethyl-2 hydroxyethyl ammonium hydroxide (TMY) as an etchant. Trimethyl-2 hydroxyethyl ammonium hydroxide (TMY) etches undoped silicon with high selectivity with respect to boron-doped silicon.

In case dielectric liners 153 are present in the second exemplary structure, sidewalls of the dielectric liner 153 may be optionally removed by an isotropic etch (such as a wet etch). If the dielectric liner 153 includes silicon nitride, sidewalls of the dielectric liner 153 can be removed by a wet etch employing phosphoric acid. The duration of the etch process can be selected such that a horizontal portion of the dielectric liner 153 remains between each support pedestal structure 156 and the source conductive layer 140. Alternatively, the dielectric liners 153 may remain substantially intact. In this case, a U-shaped dielectric liner 153 having a horizontal portion and a pair of vertical portions extending upward from edges of the horizontal portion can be present on each support pedestal structure 156. Alternatively, the dielectric liner 153 may not be formed at the processing steps of FIG. 21. In this case, the support pedestal structures 156 can contact a top surface of the source conductive layer 140.

Figure 28:
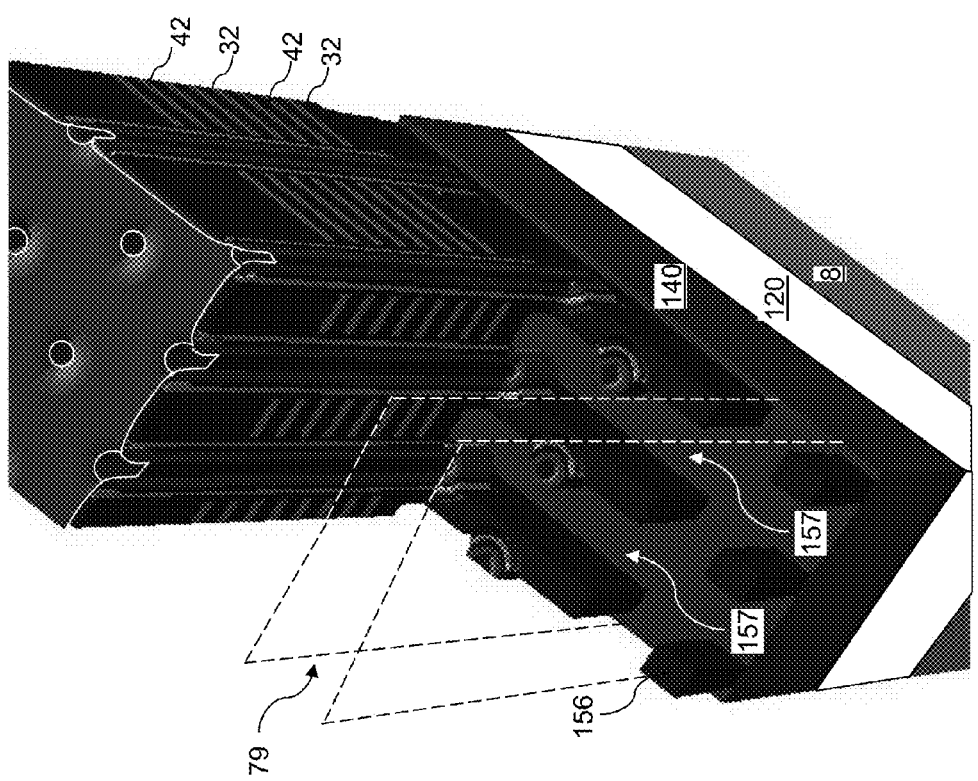
FIG. 28 is a perspective view of the second exemplary structure with a cut-out region after removal of physically exposed portions of memory films according to the second embodiment of the present disclosure.
Figure 29:
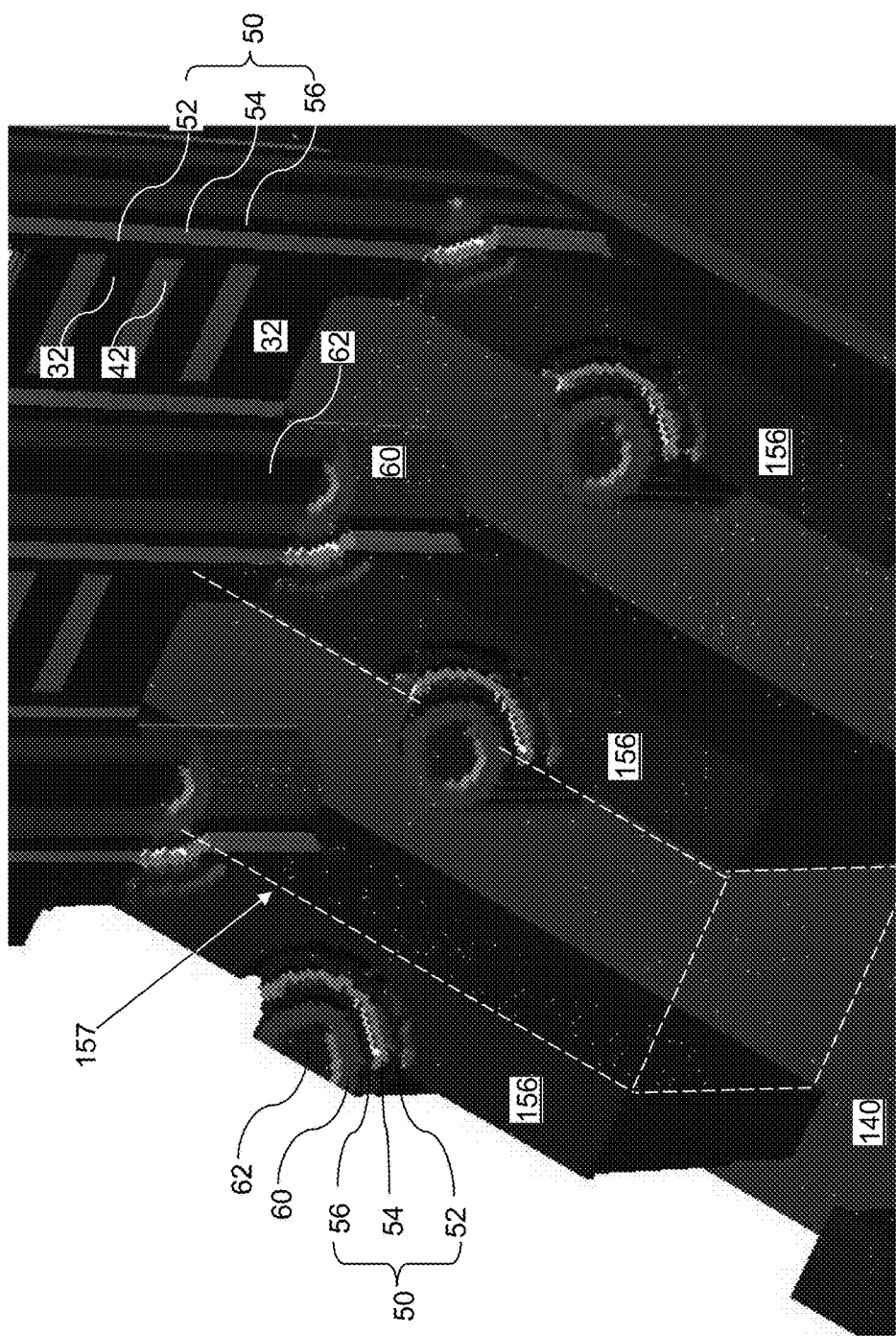
FIG. 29 is a magnified view of a region of the second exemplary structure of FIG. 28.

Referring to FIGS. 28 and 29, portions of the memory film 50 physically exposed to the laterally-extending cavities 157 are removed selective to the semiconductor channel layer 60L (or channel 60 if the layer 60L is removed from the top of the alternating stack), while not removing portions of the memory film 50 contacting the support pedestal structures 156. An isotropic etch can be employed to remove the physically exposed portions of the memory film 50, and to physically expose a lower portion of each sidewall of a semiconductor channel (which is a vertical portion of the semiconductor channel layer 60L within a memory opening). The duration of the isotropic etch can be controlled to prevent removal of the memory film 50 from the regions between the semiconductor channels and the support pedestal structures 156. Sidewalls of the semiconductor channel layer 60L are physically exposed upon removal of portions of the memory film 50 that are physically exposed to the laterally-extending cavities 157.

Figure 30:
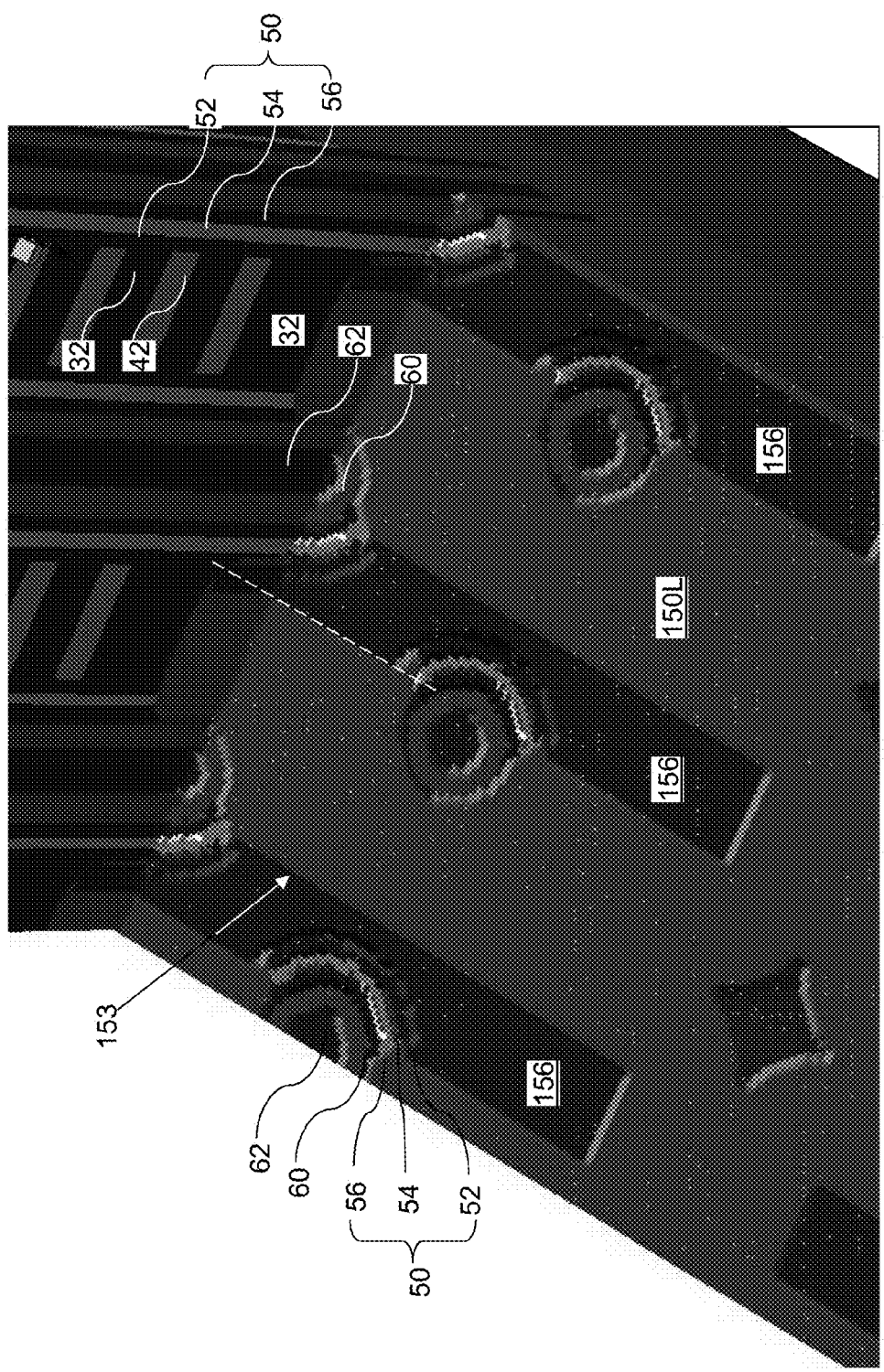
FIG. 30 is a perspective view of the second exemplary structure with a cut-out region after formation of a doped semiconductor material layer according to the second embodiment of the present discourse.
Figure 31:
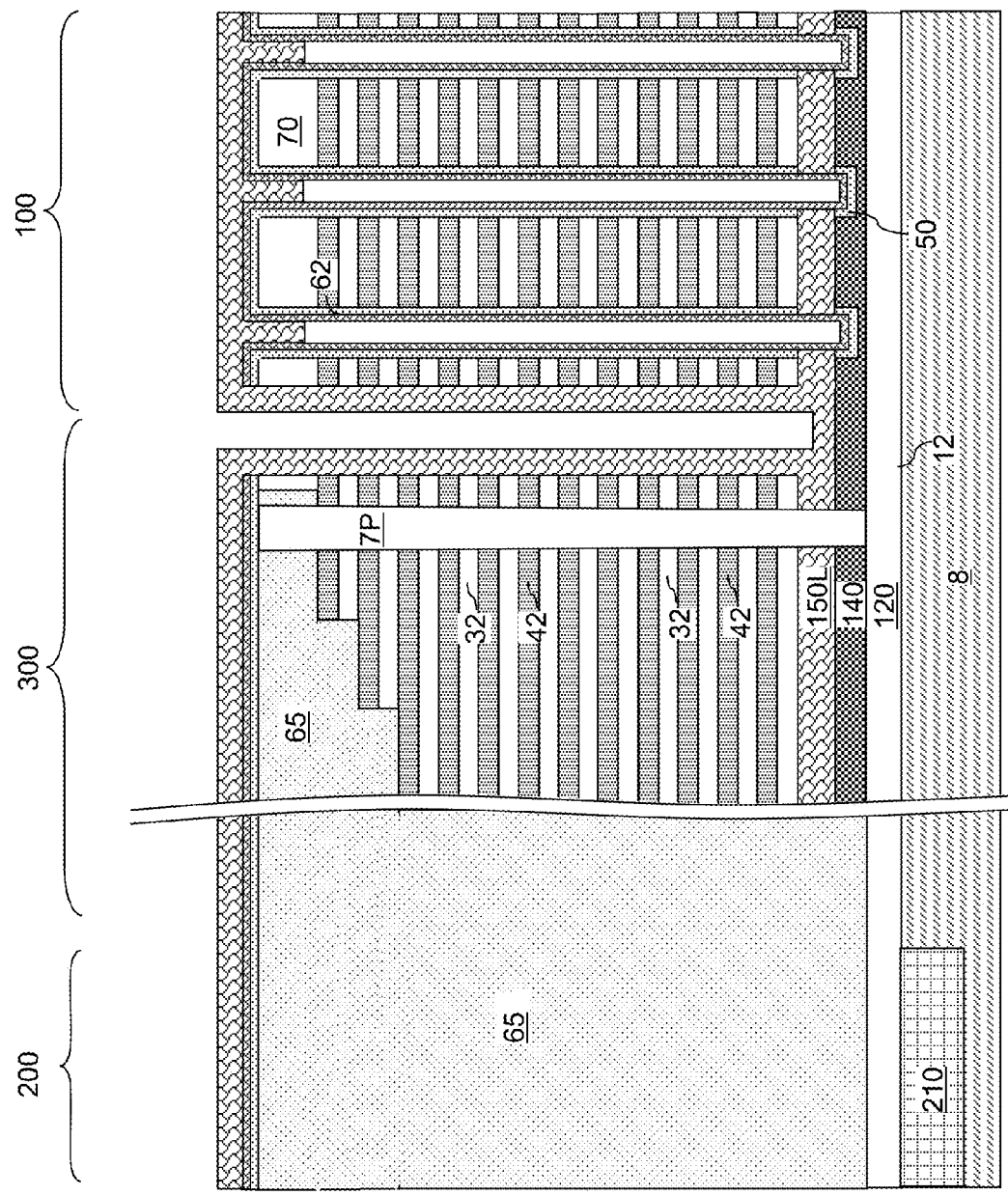
FIG. 31 is a vertical cross-sectional view of the second exemplary structure shown in FIG. 30.

Referring to FIGS. 30 and 31, a doped semiconductor material layer 150L can be deposited in the at least one backside contact trench 79 and the laterally-extending cavities 157 by a conformal deposition process. The doped semiconductor material layer 150L can be a conductive material, i.e., can include a heavily doped semiconductor material (such as p-doped silicon or n-doped silicon) having electrical conductivity greater than $1.0 \times 10^5$ S/cm and dopant atomic concentration greater than $1.0 \times 10^{19}/cm^3$. The doped semiconductor material layer 150L can be formed as a single continuous structure. In one embodiment, the support pedestal structures 156 can include a first semiconductor material having a doping of the first conductivity type, and the doped semiconductor material layer 150L can include a second semiconductor material having a doping of a second conductivity type that is the opposite of the first conductivity type. The first conductivity type can be p-type, and the second conductivity type can be n-type, or vice versa.

Each portion of the doped semiconductor material layer 150L filling a laterally-extending cavity 157 constitutes a conductive rail structure. Each of the conductive rail structures comprises dimpled sidewalls including respective planar vertical sidewalls adjoined by respective concave vertical sidewalls. The concave vertical sidewalls within the dimpled sidewalls of conductive rail structures contact sidewalls of the semiconductor channels, which are vertical portions of the semiconductor channel layer 60L in the memory openings.

A vertical portion of the doped semiconductor material layer 150L is present at a periphery of each backside contact trench 79. A horizontal portion of the doped semiconductor material layer 150L is present over the insulating cap layer 70. A vertically-extending cavity that extends through the alternating stack (32, 42) is present within each backside contact trench 79.

Each vertically recessed volume overlying the dielectric cores 62 can be filled with portions of the doped semiconductor material layer 150L that protrude downward from the horizontal portion of the doped semiconductor material layer 150L that overlie the topmost surface of the semiconductor channel layer 60L. The material filling the laterally-extending cavities 157 and the material filling the vertically recessed volumes overlying the dielectric cores 62 can be formed simultaneously.

Figure 32:
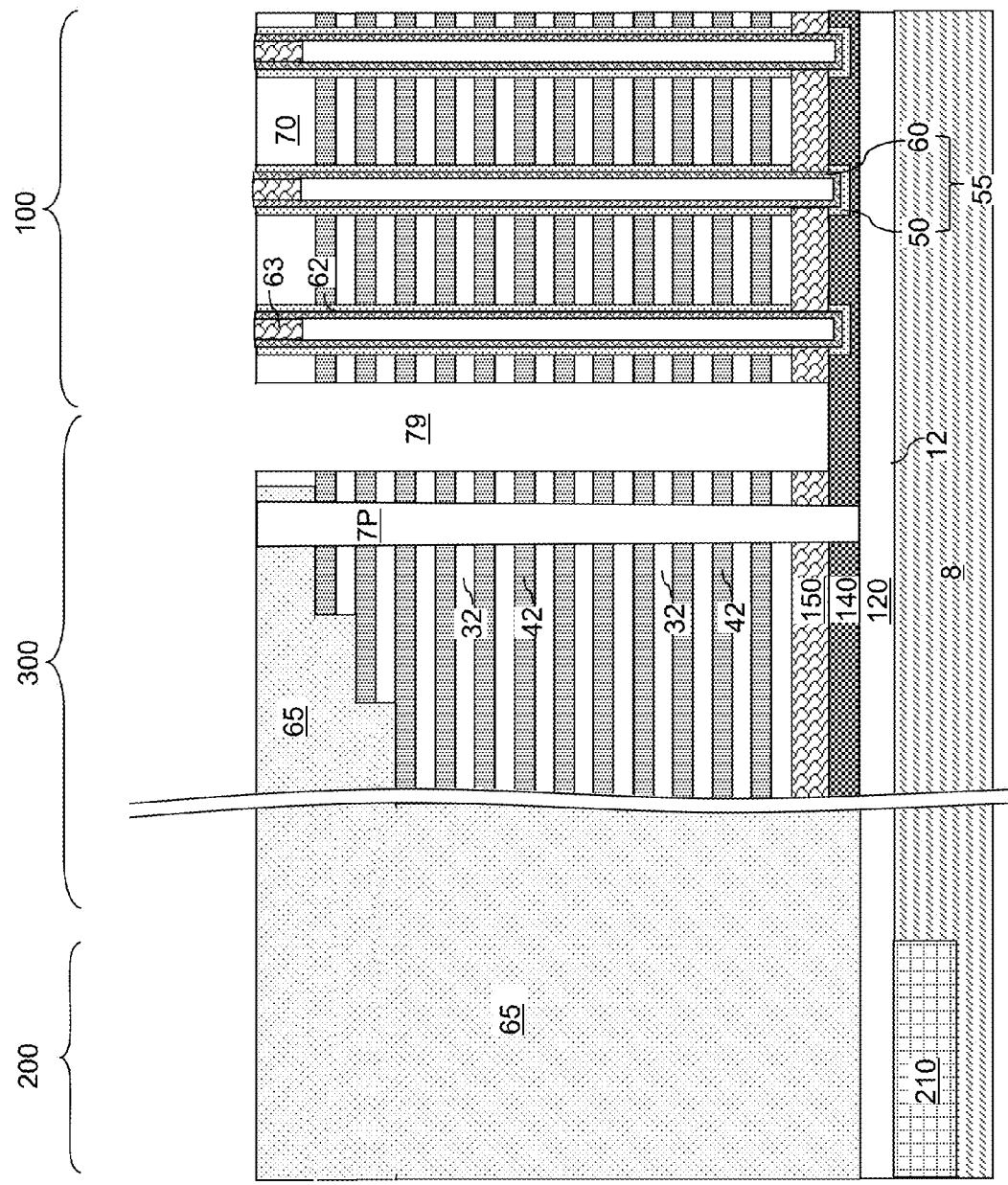
FIG. 32 is a vertical cross-sectional view of the second exemplary structure after removal of portions of the doped semiconductor material layer from inside the backside contact trench and from above the alternating stack and formation of drain regions according to the second embodiment of the present disclosure.

Referring to FIG. 32, portions of the doped semiconductor material layer 150L are etched back from the sidewalls of each backside contact trench 79 and from above the insulating cap layer 70, for example, by an isotropic etch or an anisotropic etch. Horizontal portions of the semiconductor channel layer 60L and horizontal portions of the memory film 50 overlying the insulating cap layer 70 or the retro-stepped dielectric material portion(s) 65 can be removed by at least one etch process, which can include at least one anisotropic etch process and/or at least one isotropic etch process. In an illustrative example, the removal of the portions of the material of the doped semiconductor material layer 150L from inside the at least one backside contact trench and the materials of the doped semiconductor material layer 150L and the semiconductor channel layer 60L from above the top surface of the insulating cap layer 70 can be performed by a wet etch employing potassium hydroxide (KOH).

Each volume of the laterally-extending cavities 157 is filled with a respective conductive rail structure 150, which is a remaining portion of the doped semiconductor material layer 150L. Each remaining vertical portion of the semiconductor channel layer 60L constitutes a semiconductor channel 60.

Removal of the horizontal portions of the memory film 50 from above the top surface of the insulating cap layer 70 can be performed by a series of wet etch processes that sequentially removes component layers within the memory film 50. The memory film 50 is divided into multiple memory films 50, each located entirely within a respective memory opening. Each memory film 50 in a respective memory opening can continuously extend from the top surface of the insulating cap layer 70 into the source conductive layer 140, and includes an opening at the level of the conductive rail structures 150 and the support pedestal structures 156. A conductive rail structure 150 contacts a sidewall of a semiconductor channel 60 within a memory film 50 through an opening within the memory film 50 at the level of the conductive rail structure. The opening within the memory film 50 is located only on one side of the memory film 50, and the other side of the memory film continuously extends from the top surface of the insulating cap layer 70 to the horizontal bottom surface of the memory film 50 that contacts a recessed horizontal surface of the source conductive layer 140.

Each adjoining pair of a semiconductor channel 60 and a memory film 50 constitutes a memory stack structure 55. Each memory stack structure 55 is located within a memory opening 49, and vertically extends through the alternating stack (32, 42). Each semiconductor channel 60 is a channel of a vertical field effect transistor. Each conductive rail structure 150 can be a common source region for a plurality of vertical field effect transistors (e.g., NAND strings) that include the semiconductor channels 60 that are directly adjoined to the respective conductive rail structure 150. Each sacrificial material portion 151 can be replaced with a conductive rail structure 150.

Each remaining portion of the doped semiconductor material layer 150L above each dielectric core 62 contacts a top end of a respective semiconductor channel 60, and constitutes a drain region 63. Each of the conductive rail structures 150 and the drain regions 63 can have a doping of the same conductivity type, and can include a same electrical dopant at a same atomic concentration, which can be greater than $1.0 \times 10^{19}/cm^3$, such as greater than $1.0 \times 10^{20}/cm^3$. Thus, the conductive rail structures 150 and the drain regions 63 can be formed simultaneously employing a same set of processing steps. The semiconductor channels 60 may be undoped, or may have a doping of the opposite conductivity type of the conductivity type of the conductive rail structures 150 and the drain regions 63. Alternatively, the drain regions 63 and the channel 60 are formed earlier in the process as described above.

Figure 33:
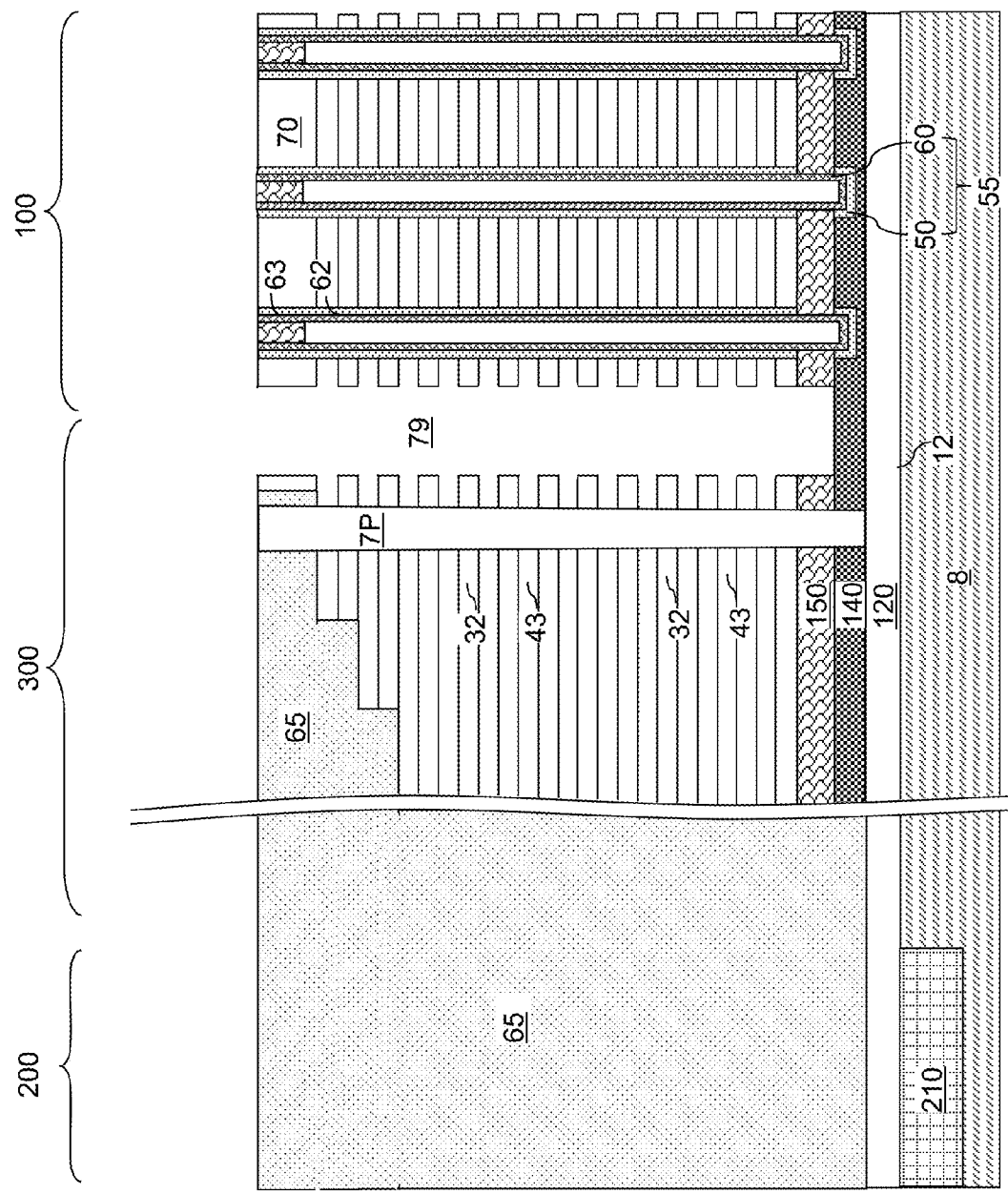
FIG. 33 is a vertical cross-sectional view of the second exemplary structure after formation of backside recesses by removal of the spacer material layers according to the second embodiment of the present disclosure.

Referring to FIG. 33, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the doped semiconductor material of the conductive rail structures 150, the material of the source conductive layer 140, and the material of the outermost layer of the memory films 50 (such as the blocking dielectric layer 52). In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. Alternatively, the support pillars 7P may comprise dummy memory stack structures which include a channel and memory film, where the channel is not electrically connected to a bit line.

The etch process that removes the second material of the sacrificial material layers 42 selective to the first material of the insulating layers 32 and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings 49 in which the memory stack structures 55 are formed are herein referred to as front side recesses or front side cavities in contrast with the backside recesses 43. In one embodiment, the memory array region 100 comprises an array of monolithic three-dimensional NAND strings having a plurality of device levels disposed above the substrate including the substrate semiconductor layer 8. In this case, each backside recess 43 can define a space for receiving a respective word line of the array of monolithic three-dimensional NAND strings.

Each of the plurality of backside recesses 43 can extend substantially parallel to the top surface of the substrate. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Figure 34:
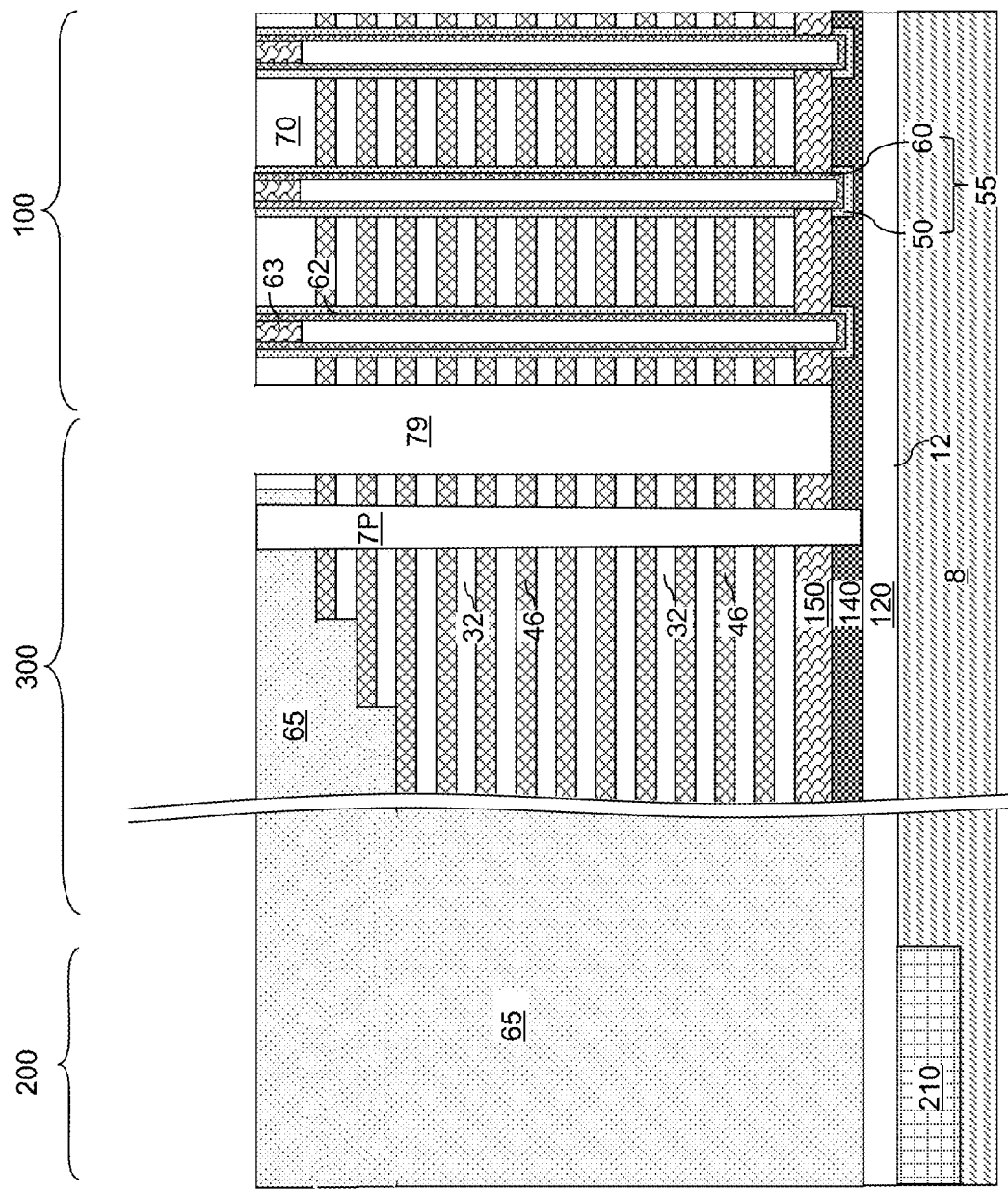
FIG. 34 is a vertical cross-sectional view of the second exemplary structure after formation of electrically conductive layers in the backside recesses according to the second embodiment of the present disclosure.

Referring to FIG. 34, at least one metallic material can be deposited in the backside recesses 43, over the sidewalls of the at least one the backside contact trench 79, and over the top surface of the insulating cap layer 70. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a contiguous metallic material layer (not shown) can be formed on the sidewalls of each backside contact trench 79 and over the insulating cap layer 70. Thus, each sacrificial material layer 42 can be replaced with an electrically conductive layer 46. A backside cavity is present in the portion of each backside contact trench 79 that is not filled with the optional backside blocking dielectric layer and the contiguous metallic material layer.

The deposited metallic materials of the contiguous electrically conductive material layer is etched back from the sidewalls of each backside contact trench 79 and from above the insulating cap layer 70, for example, by an isotropic etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 35A:
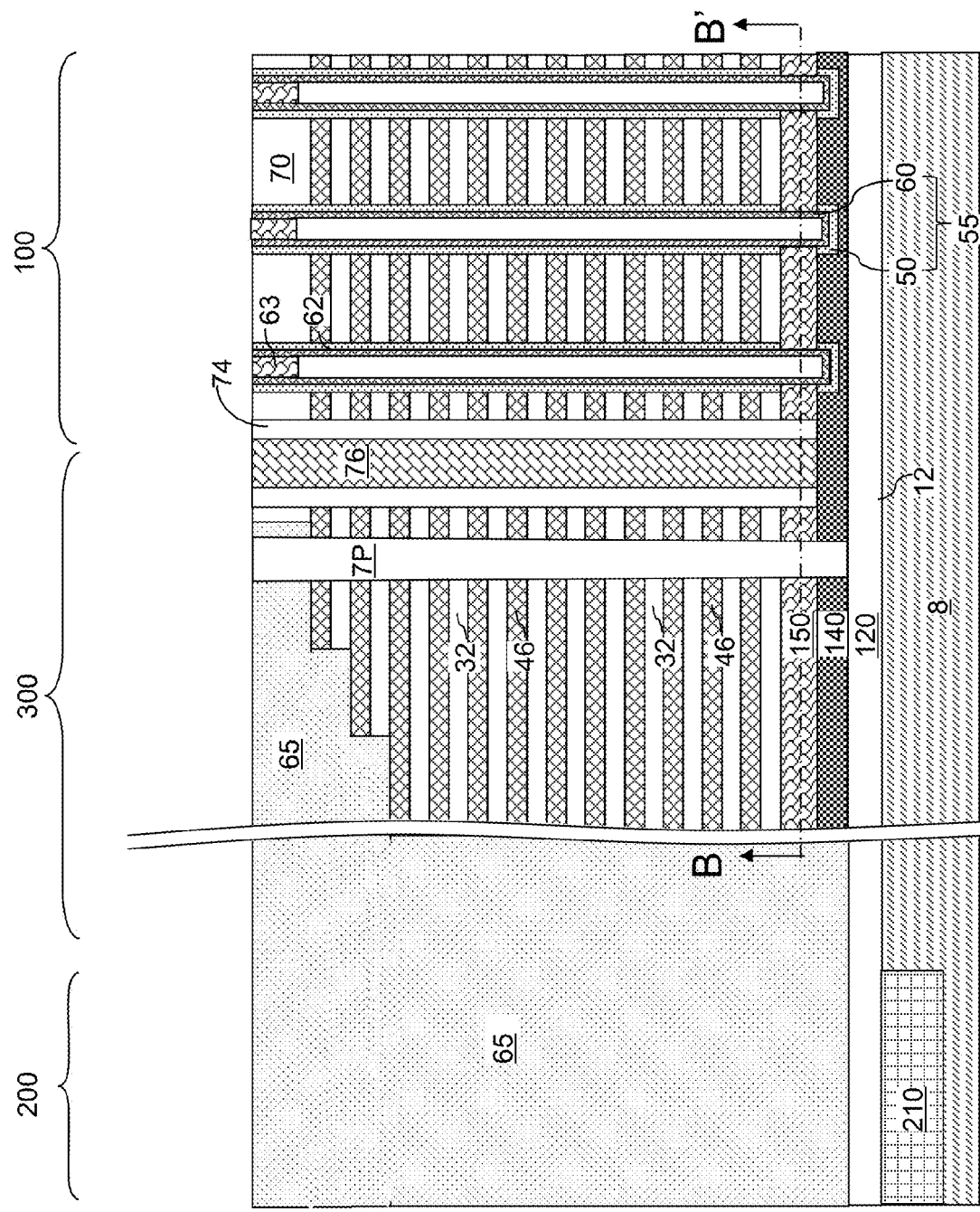
FIG. 35A is a vertical cross-sectional view of the second exemplary structure after formation of an insulating spacer and a backside contact via structure according to the second embodiment of the present disclosure.
Figure 35B:
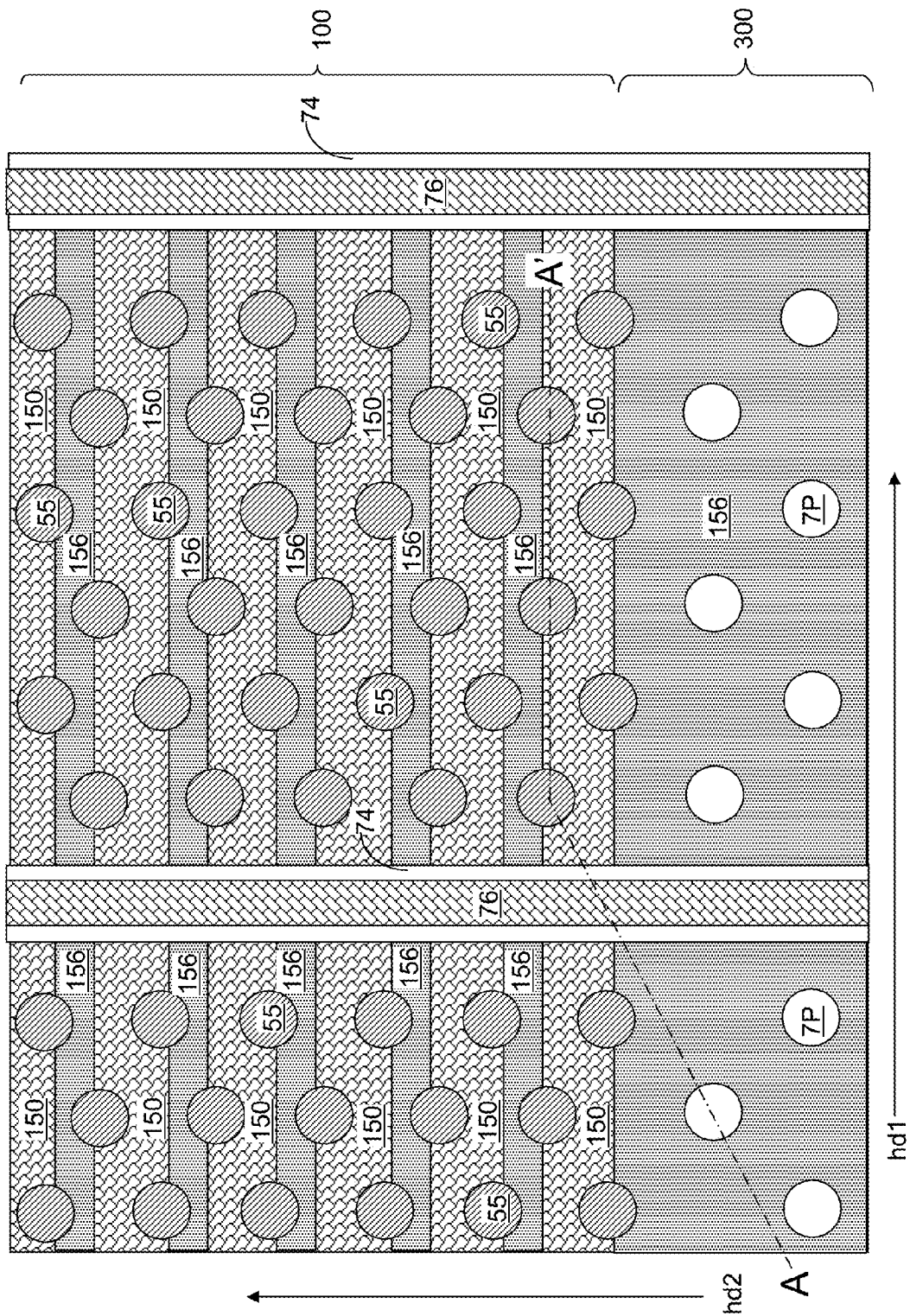
FIG. 35B is a horizontal cross-sectional view of the second exemplary structure along the plane B-B' in FIG. 35A. The plane A-A' corresponds the plane of the vertical cross-sectional view of FIG. 35A.

Referring to FIGS. 35A and 35B, an insulating material layer can be formed in the at least one backside contact trench 79 and over the insulating cap layer 70 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed. An anisotropic etch is performed to remove horizontal portions of the insulating material layer from above the insulating cap layer 70 and at the bottom of each backside contact trench 79. Each remaining portion of the insulating material layer constitutes an insulating spacer 74. Each insulating spacer 74 is formed on a sidewall of a respective backside contact trench 79 and on sidewalls of the conductive rail structures 150 after formation of the electrically conductive layers 46. In one embodiment, a sidewall of each conductive rail structure 150 can contact a bottom portion of an outer sidewall of an insulating spacer 74.

A backside contact via structure 76 can be formed within the cavity inside each insulating spacer 74. Each backside contact via structure 76 can fill a respective cavity within a respective insulating spacer 74. The contact via structures 76 can be formed by depositing at least one conductive material in the remaining unfilled volume of each backside contact trench 79. For example, the at least one conductive material can include a conductive liner (not separately shown) and a conductive fill material portion (not separately shown). The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the insulating cap layer 70 overlying the alternating stack (32, 46) as a stopping layer. If a chemical mechanical planarization (CMP) process is employed, the insulating cap layer 70 can be employed as a CMP stopping layer. Each remaining continuous portion of the at least one conductive material in the backside contact trenches 79 constitutes a backside contact via structure 76. Each backside contact via structure 76 can be formed directly on the top surface of a source contact layer 140, which can be electrically shorted to the conductive rail structures 150. Each backside contact via structure 76 is formed within a portion of the backside contact trench 79 that is not filled with an insulating spacer 74.

Figure 36:
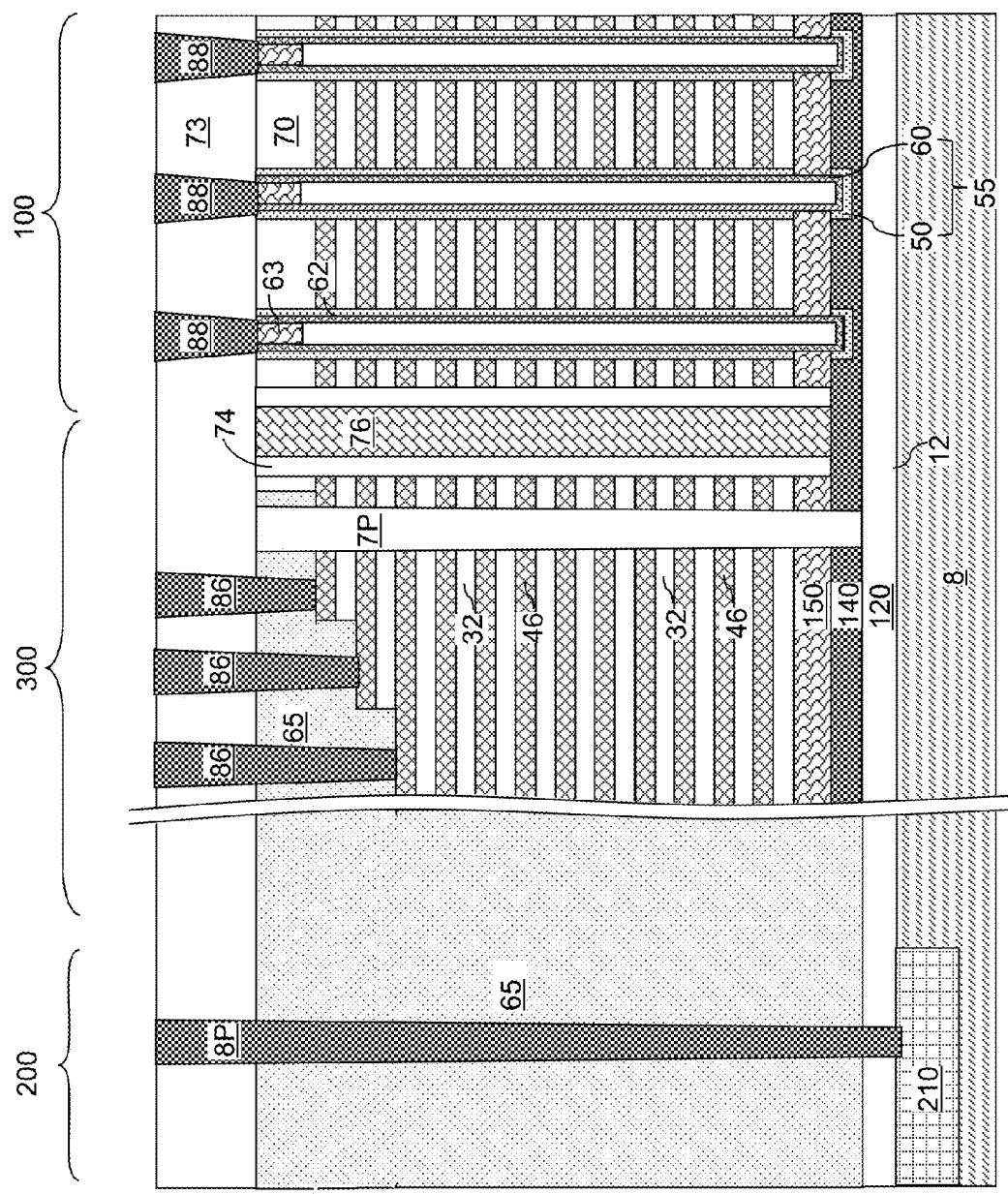
FIG. 36 is a vertical cross-sectional view of the second exemplary structure after formation of additional contact via structures according to the second embodiment of the present disclosure.

Referring to FIG. 36, additional contact via structures (88, 86, 8P) can be formed through the second insulating cap layer 73, and optionally through the retro-stepped dielectric material portion 65. For example, drain contact via structures 88 can be formed through the second insulating cap layer 73 on each drain region 63. Word line contact via structures 86 can be formed on the electrically conductive layers 46 through the second insulating cap layer 73, and through the retro-stepped dielectric material portion 65. Peripheral device contact via structures 8P can be formed through the retro-stepped dielectric material portion 65 directly on respective nodes of the peripheral devices.

According to an aspect of the present disclosure, a three-dimensional memory device is provided, which comprises an alternating stack (32, 46) of electrically conductive layers 46 and insulating layers 32 located over a substrate 8, an array of memory stack structures 55, each memory stack structure 55 extending through the alternating stack (32,46) and including a memory film 50 and a semiconductor channel 60 laterally surrounded by the memory film 50, and support structures, such as the support pedestal structures 156 located between the alternating stack (42, 46) and the substrate 8. The device may also include a source conductive layer 140 underlying the alternating stack (42, 46) and overlying the substrate 8, and in contact with the support structures 156.

In one embodiment, the three-dimensional memory device comprises conductive rail structures 150 laterally extending along a first horizontal direction hd1, contacting a top surface of the source conductive layer 140, and contacting sidewalls of the semiconductor channels 60. In one embodiment, each of the conductive rail structures 150 comprises dimpled sidewalls including respective planar vertical sidewalls adjoined by respective concave vertical sidewalls. In one embodiment, each semiconductor channel 60 contacts a sidewall of a respective conductive rail structure 150, and each memory film 50 contacts a sidewall of a respective support pedestal structure 156.

In one embodiment, top surfaces of the support pedestal structures 156 can be within the same horizontal plane as top surfaces of the conductive rail structures 150. In one embodiment, the support pedestal structures 156 can comprise a first semiconductor material having a doping of a first conductivity type, and the conductive rail structures 150 comprise a second semiconductor material having a doping of a second conductivity type that is the opposite of the first conductivity type.

In one embodiment, the three-dimensional memory device comprises a backside contact via structure 76 contacting a top surface of the source conductive layer 140. An insulating spacer 74 can laterally surround the backside contact via structure 76 and can contact the top surface of the source conductive layer 140. The conductive rail structures 150 can laterally extend along a first horizontal direction hd1, can contact a top surface of the source conductive layer 140, and can contact sidewalls of the semiconductor channels 60. The conductive rail structures 150 can be laterally spaced from the backside contact via structure 76 by the insulating spacer 74.

In one embodiment, each of the support pedestal structures 156 comprises dimpled sidewalls including respective planar vertical sidewalls adjoined by respective concave vertical sidewalls. In one embodiment, each of the concave vertical sidewalls of the support pedestal structures 156 contacts an outer sidewall of a respective memory film 50.

In one embodiment, the three-dimensional memory device comprises a vertical NAND device located over the substrate 8. The electrically conductive layers 46 can comprise, or can be electrically connected to, a respective word line of the NAND device. The substrate 8 can comprise a silicon substrate. The vertical NAND device can comprise an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon.

The array of monolithic three-dimensional NAND strings can comprise a plurality of semiconductor channels 60. At least one end portion of each of the plurality of semiconductor channels 60 extends substantially perpendicular to a top surface of the substrate 8. The array of monolithic three-dimensional NAND strings can comprise a plurality of charge storage elements (as embodied as portions of the charge storage element layer 54 located at each level of the electrically conductive layers 46). Each charge storage element is located adjacent to a respective one of the plurality of semiconductor channels 60. The array of monolithic three-dimensional NAND strings can comprise a plurality of control gate electrodes having a strip shape extending substantially parallel to the top surface of the substrate, the plurality of control gate electrodes comprise at least a first control gate electrode located in a first device level and a second control gate electrode located in a second device level.

Each of the conductive rail structures 150 can function as a common source region for a plurality of field effect transistors including semiconductor channels 60 contacting the conductive rail structure 150. The support structures 156 provide structural support during replacement of the sacrificial material portions 151 with the conductive rail structures 150. Optionally, a subset of the electrically conductive layers 46 (such as a bottommost electrically conductive layer 46) can be employed as a source select gate electrode during operation of the vertical three-dimensional memory device. The contact area between each semiconductor channel 60 and a source region (as embodied as a conductive rail structure 150) can be increased without increasing the size of the memory openings by increasing the height of the sacrificial material portions 150, thereby increasing the height of the conductive rail structures 150.

Each contact area between a conductive rail structure 150 and a semiconductor channel 60 can include a curved vertical surface. The angular spread (i.e., the extent of the azimuthal angle) of the curved vertical surface from a vertical axis passing through a geometrical center of the memory stack structure 55 including the semiconductor channel 60 can be in a range from 45 degrees to 315 degrees, such as from 90 degrees to 270 degrees. By providing an increased contact area between a source region and a semiconductor channel without increasing the size of the memory openings, the structures of the present disclosure can provide a greater on-current for the vertical field effect transistors of the three-dimensional memory device. Alternatively, the structures of the present disclosure can be employed to reduce the lateral dimensions of the memory openings and the memory stack structures while maintaining the on-current for vertical field transistors at an operational level.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A three-dimensional memory device comprising:
    an alternating stack of electrically conductive layers and insulating layers located over a substrate;
    an array of memory stack structures, each memory stack structure extending through the alternating stack and including a memory film and a semiconductor channel laterally surrounded by the memory film;
    support structures located between the alternating stack and the substrate;
    a source conductive layer underlying the alternating stack and overlying the substrate and contacting the support structures; and
    conductive rail structures laterally extending along a first horizontal direction, contacting a top surface of the source conductive layer, and contacting sidewalls of the semiconductor channels, wherein the three-dimensional memory device comprises at least one feature selected from:
    a first feature that each of the conductive rail structures comprises dimpled sidewalls including respective planar vertical sidewalls adjoined by respective concave vertical sidewalls;
    a second feature that each semiconductor channel contacts a sidewall of a respective conductive rail structure, and each memory film contacts a sidewall of a respective support structure; and
    a third feature that the support structures comprise a support pedestal structures comprising a first semiconductor material having a doping of a first conductivity type and insulating barrier material below the first semiconductor material, and the conductive rail structures comprise a second semiconductor material having a doping of a second conductivity type that is the opposite of the first conductivity type.

2. The three-dimensional memory device of claim 1, wherein the three-dimensional memory device comprises the first feature.

3. The three-dimensional memory device of claim 1, wherein the three-dimensional memory device comprises the second feature.

4. The three-dimensional memory device of claim 1, wherein top surfaces of the support structures are within a same horizontal plane as top surfaces of the conductive rail structures.

5. The three-dimensional memory device of claim 1, wherein the three-dimensional memory device comprises the third feature.

6. The three-dimensional memory device of claim 1, further comprising a backside contact via structure contacting a top surface of the source conductive layer.

7. The three-dimensional memory device of claim 6, further comprising an insulating spacer laterally surrounding the backside contact via structure and contacting the top surface of the source conductive layer.

8. The three-dimensional memory device of claim 7, wherein the conductive rail structures are laterally spaced from the backside contact via structure by the insulating spacer.

9. The three-dimensional memory device of claim 1, wherein each of the support structures comprises dimpled sidewalls including respective planar vertical sidewalls adjoined by respective concave vertical sidewalls.

10. The three-dimensional memory device of claim 9, wherein each of the concave vertical sidewalls of the support structures contacts an outer sidewall of a respective memory film.

11. The three-dimensional memory device of claim 1, wherein:
    the three-dimensional memory device comprises a vertical NAND device located over the substrate;
    the electrically conductive layers comprise, or are electrically connected to, a respective word line of the NAND device;
    the substrate comprises a silicon substrate;
    the vertical NAND device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon; and
    the array of monolithic three-dimensional NAND strings comprises:
        a plurality of semiconductor channels, wherein at least one end portion of each of the plurality of semiconductor channels extends substantially perpendicular to a top surface of the substrate;
        a plurality of charge storage elements, each charge storage element located adjacent to a respective one of the plurality of semiconductor channels; and
        a plurality of control gate electrodes having a strip shape extending substantially parallel to the top surface of the substrate, the plurality of control gate electrodes comprise at least a first control gate electrode located in a first device level and a second control gate electrode located in a second device level.

12. A three-dimensional memory device comprising:
    an alternating stack of electrically conductive layers and insulating layers located over a substrate;
    an array of memory stack structures, each memory stack structure extending through the alternating stack and including a memory film and a semiconductor channel laterally surrounded by the memory film;
    support structures located between the alternating stack and the substrate;
    a source conductive layer underlying the alternating stack and overlying the substrate and contacting the support structures;

conductive rail structures laterally extending along a first horizontal direction, contacting a top surface of the source conductive layer, and contacting sidewalls of the semiconductor channels;

a backside contact via structure contacting a top surface of the source conductive layer; and an insulating spacer laterally surrounding the backside contact via structure and contacting the top surface of the source conductive layer, wherein the conductive rail structures are laterally spaced from the backside contact via structure by the insulating spacer.

13. The three-dimensional memory device of claim 12, wherein each of the conductive rail structures comprises dimpled sidewalls including respective planar vertical sidewalls adjoined by respective concave vertical sidewalls.

14. The three-dimensional memory device of claim 12, wherein:

each semiconductor channel contacts a sidewall of a respective conductive rail structure; and each memory film contacts a sidewall of a respective support structure.

15. The three-dimensional memory device of claim 12, wherein top surfaces of the support structures are within a same horizontal plane as top surfaces of the conductive rail structures.

16. The three-dimensional memory device of claim 12, wherein:

the support structures comprise a support pedestal structures comprising a first semiconductor material having a doping of a first conductivity type and insulating barrier material below the first semiconductor material; and the conductive rail structures comprise a second semiconductor material having a doping of a second conductivity type that is the opposite of the first conductivity type.

17. The three-dimensional memory device of claim 12, wherein each of the support structures comprises dimpled sidewalls including respective planar vertical sidewalls adjoined by respective concave vertical sidewalls.

18. The three-dimensional memory device of claim 17, wherein each of the concave vertical sidewalls of the support structures contacts an outer sidewall of a respective memory film.

19. The three-dimensional memory device of claim 12, wherein:

the three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in a first device level and a second control gate electrode located in a second device level.

20. A three-dimensional memory device comprising:

an alternating stack of electrically conductive layers and insulating layers located over a substrate;

an array of memory stack structures, each memory stack structure extending through the alternating stack and including a memory film and a semiconductor channel laterally surrounded by the memory film; and support structures located between the alternating stack and the substrate, wherein each of the support structures comprises dimpled sidewalls including respective planar vertical sidewalls adjoined by respective concave vertical sidewalls.

21. The three-dimensional memory device of claim 20, further comprising:

a source conductive layer underlying the alternating stack and overlying the substrate and contacting the support structures; and conductive rail structures laterally extending along a first horizontal direction, contacting a top surface of the source conductive layer, and contacting sidewalls of the semiconductor channels.

22. The three-dimensional memory device of claim 20, wherein each of the conductive rail structures comprises dimpled sidewalls including respective planar vertical sidewalls adjoined by respective concave vertical sidewalls.

23. The three-dimensional memory device of claim 20, wherein each of the concave vertical sidewalls of the support structures contacts an outer sidewall of a respective memory film.

24. The three-dimensional memory device of claim 20, wherein:

the three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in a first device level and a second control gate electrode located in a second device level.

\* \* \* \* \*